(12) United States Patent
Takahashi

(10) Patent No.: US 8,471,313 B2
(45) Date of Patent: Jun. 25, 2013

(54) SOLID-STATE IMAGING DEVICE, METHOD FOR MANUFACTURING SOLID-STATE IMAGING DEVICE, AND ELECTRONIC APPARATUS

(75) Inventor: Hiroshi Takahashi, Kanagawa (JP)

(73) Assignee: Sony Corporation (JP)

( * ) Notice: Subject to any disclaimer, the term of this patent is extended or adjusted under 35 U.S.C. 154(b) by 564 days.

(21) Appl. No.: 12/613,148

(22) Filed: Nov. 5, 2009

(65) Prior Publication Data

US 2010/0117126 A1    May 13, 2010

(30) Foreign Application Priority Data

Nov. 7, 2008  (JP) ................. 2008-287010
Nov. 7, 2008  (JP) ................. 2008-287011
Nov. 7, 2008  (JP) ................. 2008-287012

(51) Int. Cl.
*H01L 31/112* (2006.01)

(52) U.S. Cl.
USPC ........... 257/292; 257/293; 257/461; 257/462; 257/E33.076; 438/74

(58) Field of Classification Search
USPC .......... 257/292, 293, 431, 302, 329, E31.073, 257/E29.118, E29.183, E29.189, E29.198, 257/E29.201, E29.274, 227, 462, E33.076, 257/E27.133, E31.079, 461; 438/74
See application file for complete search history.

(56) References Cited

U.S. PATENT DOCUMENTS

| | | | |
|---|---|---|---|
| 2005/0145957 A1* | 7/2005 | Ahn et al. | 257/410 |
| 2005/0167704 A1* | 8/2005 | Ezaki et al. | 257/233 |
| 2007/0187734 A1* | 8/2007 | Adkisson et al. | 257/293 |
| 2009/0303371 A1* | 12/2009 | Watanabe et al. | 348/311 |
| 2010/0108864 A1* | 5/2010 | Ohta et al. | 250/214.1 |

FOREIGN PATENT DOCUMENTS

| | | |
|---|---|---|
| JP | 11-122532 | 4/1999 |
| JP | 2002-513145 | 5/2002 |
| JP | 2005-223084 | 8/2005 |
| JP | 2007-036202 | 2/2007 |

* cited by examiner

*Primary Examiner* — Daniel Whalen
*Assistant Examiner* — Suberr Chi
(74) *Attorney, Agent, or Firm* — Sheridan Ross P.C.

(57) ABSTRACT

A solid-state imaging device includes a substrate, a plurality of photodiodes arranged in the substrate in a depth direction of the substrate, a vertical readout gate electrode for reading signal charges in the photodiodes, the vertical readout gate electrode being embedded in the substrate such that the readout gate electrode extends in the depth direction of the substrate, a dark-current suppressing area which covers a bottom portion and a side surface of the readout gate electrode, the dark-current suppressing area including a first-conductivity-type semiconductor area having a uniform thickness on the side surface of the readout gate electrode, and a reading channel area disposed between the first-conductivity-type semiconductor area and the photodiodes, the reading channel area including a second-conductivity-type semiconductor area.

8 Claims, 33 Drawing Sheets

SOLID-STATE IMAGING DEVICE, METHOD FOR MANUFACTURING SOLID-STATE IMAGING DEVICE, AND ELECTRONIC APPARATUS

BACKGROUND OF THE INVENTION

1. Field of the Invention

The present invention relates to a solid-state imaging device, a method for manufacturing the solid-state imaging device, and an electronic apparatus including the solid-state imaging device.

2. Description of the Related Art

A CMOS solid-state imaging device is an example of a solid-state imaging device. In the CMOS solid-state imaging device, two pixels are formed of photodiodes and transistors, which are so-called MOS transistors, and a plurality of pixels are arranged in a predetermined pattern. The photodiodes are photoelectric conversion elements which generate and accumulate signal charges corresponding to the amounts of received light. The MOS transistors transfer the signal charges obtained by the photodiodes.

FIG. 1 is a schematic sectional view illustrating the main part of a CMOS solid-state imaging device 216 according to a related art disclosed in Japanese Unexamined Patent Application Publication No. 11-122532. The solid-state imaging device 216 is applied to an image sensor. FIG. 1 shows the sectional structure of a pixel section of the solid-state imaging device 216.

The solid-state imaging device 216 shown in FIG. 1 includes a p-type substrate 201 made of silicon and pixel separating areas 208 provided in a front surface of the p-type substrate 201. A pixel 200 including a photodiode PD and a plurality of MOS transistors is provided in each of sections separated from each other by the pixel separating areas 208. The MOS transistors include a charge-readout transistor Tr1, a reset transistor Tr2, an amplifier transistor Tr3, and a vertical selection transistor (not shown). The pixel area including the four MOS transistors and the photodiode PD serves as a unit pixel. A plurality of unit pixels are arranged in a two-dimensional matrix.

The photodiode PD includes an n+ type impurity area 203 and an n-type impurity area 202 arranged in order from the surface of the p-type substrate 201 in the depth direction, and also includes a high-impurity-concentration p-type impurity area 204 provided in a surface of the n+ type impurity area 203.

In addition, the charge-readout transistor Tr1 includes a planar-type gate electrode 209 and a source-drain area 205. The planar-type gate electrode 209 is formed above the substrate 201 with a gate insulating film 217 interposed therebetween at a position adjacent to the area where the photodiode PD is formed. The source-drain area 205 is formed of an n+ type impurity area provided in the surface of the substrate 201. The source-drain area 205 serves as a floating diffusion area.

The amplifier transistor Tr3 includes a source-drain area 206, a planar-type gate electrode 211, and a source-drain area 207. The planar-type gate electrode 211 is formed above the substrate 201 with the gate insulating film 217 interposed therebetween at a position adjacent to the area where the source-drain area 206 is formed. The source-drain area 207 is formed of an n+ type impurity area provided in the surface of the substrate 201.

The reset transistor Tr2 includes the source-drain area 205, a planar-type gate electrode 210, and the source-drain area 206. The planar-type gate electrode 210 is formed above the substrate 201 with the gate insulating film 217 interposed therebetween at a position adjacent to the area where the source-drain area 205 is formed. The source-drain area 206 is formed of an n+ type impurity area provided in the surface of the substrate 201.

The source-drain area 206 is connected by a contact portion 212 to a power source line 213 formed above the substrate 201 with an interlayer insulation film 215 interposed therebetween.

Desired wirings 214 are provided in the interlayer insulation film 215.

Thus, each unit pixel 200 includes the photodiode PD and the MOS transistors on the surface of the substrate 201 in the solid-state imaging device 216 according to the related art.

Recently, the pixel size has been reduced to integrate larger number of pixels in the solid-state imaging device. In the solid-state imaging device 216 according to the related art shown in FIG. 1, the photodiode PD and the MOS transistors are arranged along the same plane in the substrate 201 for each unit pixel 200. Therefore, the area of the surface of the substrate 201 corresponding to each unit pixel 200 is desired to be large enough to place the above-mentioned elements. Accordingly, the area of a single pixel is relatively large. In this structure, if the pixel size is reduced, the area of the photodiode PD will also be reduced. As a result, the saturation charge amount (Qs) and sensitivity will also be reduced.

To avoid such a problem, methods of reducing the pixel size by causing a plurality of pixels which are adjacent to each other to use common MOS transistors have been proposed.

For example, methods have been proposed in which a plurality of pixels which are adjacent to each other are caused to use common pixel transistors so that the pixel size can be reduced without reducing the area of the photodiode PD. For example, in a general CMOS solid-state imaging device, a single set of pixel transistors are used in common by four pixels.

In addition, as a completely different approach to prevent the reductions in the saturation charge amount (Qs) and sensitivity due to the reduction in the pixel size, Japanese Unexamined Patent Application Publication No. 2002-513145 proposes a solid-state imaging device including an embedded gate electrode. FIG. 4 shows a CMOS solid-state imaging device 231 including a vertical charge-readout transistor provided with an embedded gate electrode.

The CMOS solid-state imaging device 231 is a back-illuminated solid-state imaging device in which light is incident on a back surface of the substrate. FIG. 4 shows the main part of a pixel section. The CMOS solid-state imaging device 231 includes pixel transistors, which form pixels, on a front surface of a semiconductor substrate 232. In this example, the pixel transistors include a charge-readout transistor Tr1, a reset transistor Tr2, and an amplifier transistor Tr3. A photodiode PD is formed below these pixel transistors in each pixel. The photodiode PD includes an n-type semiconductor area 233 and a high-impurity-concentration p-type semiconductor area (p+ area) 241 formed in the substrate 232 on the front side of the n-type semiconductor area 233. The n-type semiconductor area 233 includes a high-impurity-concentration area (n+ area) 233A which serves as a charge storage area and a low-impurity-concentration area (n area) 233B.

The charge-readout transistor Tr1 is a vertical transistor including a columnar readout gate electrode 236 formed such that the readout gate electrode 236 is disposed in a trench 234 with a gate insulating film 235 interposed between the readout gate electrode 236 and an inner surface of the trench 234. The trench 234 extends in the depth direction from the front surface of the substrate 232 to the n-type high-impurityconcentration area (n+ area) 233A in the photodiode PD. An n-type source-drain area 237, which serves as a floating diffusion (FD) area, is formed in the surface of the substrate 232 such that the n-type source-drain area 237 is in contact with the gate insulating film 235. The vertical gate electrode 236 of the vertical charge-readout transistor Tr1 is formed at a position corresponding to the center of a unit pixel 251, that is, at the center of the photodiode PD. The high-impurity-concentration p-type semiconductor area (p+ area) 241 surrounds a portion of the gate insulating film 235 that is formed in the high-impurity-concentration area (n+ area) 233A of the photodiode PD.

The reset transistor Tr2 includes a pair of n-type source-drain areas 237 and 238 provided in the front surface of the substrate 232 and a planar reset gate electrode 243 formed above the front surface of the substrate 232 with a gate insulating film interposed therebetween. The amplifier transistor Tr3 includes a pair of n-type source-drain areas 238 and 239 provided in the front surface of the substrate 232 and a planar-type gate electrode 240 formed above the front surface of the substrate 232 with the gate insulating film interposed therebetween. Multiple wiring layers in which a plurality of layers of wiring 246 are formed are provided above the substrate 232, on which the pixel transistors Tr1, Tr2, and Tr3 are formed, with interlayer insulation films 245 interposed therebetween. Although not shown in FIG. 4, a color filter is provided on the back surface of the substrate 232, and on-chip microlenses are provided on the color filter at positions corresponding to the pixels. In FIG. 4, reference numeral 250 denotes pixel separating areas.

Although not shown in FIG. 4, signal processing circuits including CMOS transistors are formed in a peripheral circuit section. The CMOS transistors include planar-type gate electrodes.

In addition, as another completely different approach to prevent the reductions in the saturation charge amount (Qs) and sensitivity due to the reduction in the pixel size, Japanese Unexamined Patent Application Publication No. 2005-223084 proposes a solid-state imaging device including an embedded gate electrode.

A CMOS solid-state imaging device is an example of a solid-state imaging device. In the CMOS solid-state imaging device, two pixels are formed of photodiodes and transistors, which are so-called MOS transistors, and a plurality of pixels are arranged in a predetermined pattern. The photodiodes are photoelectric conversion elements which generate and accumulate signal charges corresponding to the amounts of received light. The MOS transistors transfer the signal charges obtained by the photodiodes.

In addition, as a completely different approach to prevent the reductions in the saturation charge amount (Qs) and sensitivity due to the reduction in the pixel size, Japanese Unexamined Patent Application Publication No. 2007-36202 proposes a method of separating light into components in a single pixel by arranging a plurality of photodiodes in a depth direction of a substrate.

Referring to FIG. 2, for example, Japanese Unexamined Patent Application Publication No. 2002-513145 describes a color separation method in which a three-layer structure including an n-type semiconductor layer 102, a p-type semiconductor layer 104, and an n-type semiconductor layer 106 is formed in a p-type Si substrate 100. Blue light, green light, and red light are subjected to photoelectric conversion in the respective layers in order of depth from the surface. In this method, blue, green, and red signals are transmitted to the outside through terminals connected to the respective layers on the surface of the Si substrate 100. This structure utilizes the relationship between the wavelength and the light absorption characteristics in the depth direction. Thus, the color separation can be achieved by a single pixel, and generation of false colors can be suppressed. Therefore, low-pass filters can be omitted. In addition, since no color filter is used, red, green, and blue light components having different wavelengths are incident on a unit pixel. Therefore, loss in the amount of light can be reduced. However, the photodiode which performs photoelectric conversion of the red light component having a long wavelength and accumulates the generated signal charge is formed at a depth of about 2 μm from the surface of the silicon substrate 100. Therefore, the distance between the photodiode and the corresponding output terminal on the substrate surface is large, and it is difficult to completely transfer the signal charge accumulated by the photodiode.

To solve such a problem, Japanese Unexamined Patent Application Publication No. 2007-36202 describes a structure in which potential barriers are disposed between the photodiodes arranged in the depth direction. In the case where the potential barriers are disposed between the photodiodes, a signal charge accumulated in a photodiode disposed at a deep position in the substrate can be easily transferred to a corresponding floating diffusion area. However, when the charge is accumulated in an area distant from the surface of the substrate in the depth direction, it is difficult to apply a sufficient potential variation to the accumulated charge using an electric field applied by a gate electrode formed at the surface of the substrate. Therefore, there is a risk that an afterimage will be generated.

FIG. 3 shows an equivalent circuit of the above-described unit pixel 200. The photodiode PD is connected to a source of the charge-readout transistor Tr1, and a drain of the charge-readout transistor Tr1 is connected to a source of the reset transistor Tr2. A drain of the reset transistor Tr2 is connected to a drain of the amplifier transistor Tr3. A source of the amplifier transistor Tr3 is connected to a drain of a vertical selection transistor Tr4. In addition, the floating diffusion (FD), which corresponds to a connection point between the charge-readout transistor Tr1 and the reset transistor Tr2, is connected to a gate of the amplifier transistor Tr3. A source of the vertical selection transistor Tr4 is connected to a vertical signal line 221.

A vertical reading pulse φTG is applied to a gate of the charge-readout transistor Tr1. A reset pulse φR is applied to a gate of the reset transistor Tr2. A vertical selection pulse φSEL is applied to a gate of the vertical selection transistor Tr4.

SUMMARY OF THE INVENTION

As described above, various approaches to prevent the reductions in the saturation charge amount and sensitivity due to the reduction in the pixel size in the solid-state imaging device have been proposed. However, recently, the pixel size has been further reduced, and it has become difficult to obtain a sufficient saturation charge amount.

In the case where the embedded gate electrode is used as in the structure described in Japanese Unexamined Patent Application Publication No. 2005-223084, selective etching of the silicon semiconductor substrate is performed to form the embedded gate electrode. Therefore, it is desirable to suppress dark currents generated due to defects caused by damages in the selective etching.

Accordingly, it is desirable to provide a solid-state imaging device in which the saturation charge amount (Qs) is increased and the dark currents are suppressed and a method for manufacturing the solid-state imaging device.

It is also desirable to provide an electronic apparatus including the solid-state imaging device.

In addition, it is desirable to provide a solid-state imaging device in which a signal-charge transfer efficiency is improved and the effective number of pixels is increased and an electronic apparatus including the solid-state imaging device.

As described above, recently, the pixel size has been further reduced and it has become difficult to obtain a sufficient saturation charge amount. In the solid-state imaging device including the vertical charge-readout transistor, if the vertical gate electrode is formed by forming a general undoped polysilicon layer and then implanting an impurity by ion implantation, it is difficult to form a satisfactory gate electrode. More specifically, the impurity is mainly implanted into an area near the surface of the undoped polysilicon layer, and it is difficult to evenly implant the impurity into the layer in the depth direction. Therefore, when a gate voltage is applied to the vertical readout gate electrode, depletion occurs in a deep area of the undoped polysilicon layer and it becomes difficult to control the potential of the channel area in the depth direction. If the ion implantation is performed with high implantation energy so that the impurity can reach a deep position, the impurity will be implanted into areas other than the gate electrode.

In the case where the vertical gate electrode is made of metal, gate electrodes of the MOS transistors included in the peripheral circuit section are also made of metal. However, the gate electrodes made of metal are not suitable for use as, in particular, gate electrodes of p-channel MOS transistors. In each of the pixel transistors and the CMOS transistors included in the peripheral circuit section, threshold voltage control is performed. In general, an n-type impurity doped polysilicon gate electrode is used in an n-channel transistor, and a p-type impurity doped polysilicon gate electrode is used in a p-channel transistor.

Accordingly, it is desirable to provide a solid-state imaging device which includes a charge-readout transistor having a vertical gate electrode so that the pixel size can be reduced and in which the potential control of the channel area in each transistor can be easily performed, and a method for manufacturing the solid-state imaging device.

It is also desirable to provide an electronic apparatus, such as a camera, including the solid-state imaging device.

A solid-state imaging device according to an embodiment of the present invention includes a substrate, a plurality of photodiodes, a readout gate electrode, a dark-current suppressing area, and a reading channel area.

The photodiodes are arranged in the substrate in a depth direction of the substrate. The readout gate electrode is a vertical readout gate electrode for reading signal charges in the photodiodes arranged in the depth direction of the substrate, and is embedded in the substrate such that the readout gate electrode extends in the depth direction of the substrate.

The dark-current suppressing area includes a first-conductivity-type semiconductor area which covers a bottom portion and a side surface of the readout gate electrode and which has a uniform thickness on the side surface of the readout gate electrode.

The reading channel area is disposed between a portion of the dark-current suppressing area on the side surface of the readout gate electrode and the photodiodes, and includes a second-conductivity-type semiconductor area.

In the solid-state imaging device according to the embodiment of the present invention, the signal charges are accumulated by the photodiodes arranged in the depth direction of the substrate. Thus, the saturation charge amount is increased. Since the signal charges are read by the vertical readout gate electrode, incomplete transfer of the signal charges can be prevented. In addition, since the portion of the dark-current suppressing area on the side surface of the readout gate electrode has a uniform thickness, variation in the reading characteristics can be reduced.

A method for forming a solid-state imaging device according to an embodiment of the present invention includes the steps of forming a plurality of photodiodes in a substrate such that the photodiodes are arranged in a depth direction of the substrate; forming a mask layer and a photoresist layer on the substrate; forming a pattern in the photoresist layer by photolithography and etching the mask layer using the patterned photoresist layer as a mask, thereby forming an opening in the mask layer, the opening extending to a surface of the substrate; implanting a first-conductivity-type impurity into the substrate through the opening by ion implantation; implanting a second-conductivity-type impurity into the substrate through the opening by ion implantation in an area closer to the surface of the substrate than an area in which the first-conductivity-type impurity is implanted; removing the photoresist layer; forming a first side wall spacer on a surface of the mask layer including an inner surface of the opening, thereby reducing a diameter of the opening; implanting a first-conductivity-type impurity into the substrate through the opening having the reduced diameter by ion implantation; forming a second side wall spacer on an inner surface of the opening having the reduced diameter, thereby further reducing the diameter of the opening; etching the substrate using the opening having the reduced diameter as a mask, thereby forming a trench at a position adjacent to the photodiodes; forming a gate insulating film which covers a bottom portion and a side surface of the trench; and forming a readout gate electrode by filling the trench in which the gate insulating film is formed with an electrode material.

In the method for forming the solid-state imaging device according to the embodiment of the present invention, the areas in which the desired impurities are implanted by ion implantation and the trench are formed while the diameter of the opening is reduced stepwise. Therefore, the areas in which the impurities are implanted and the trench are self-aligned. Therefore, the ion implantation process for implanting the impurities into the predetermined areas and the process of forming the trench can be performed without performing a mask alignment process. As a result, the readout gate electrode and the semiconductor areas around the gate electrode can be formed with high accuracy.

An electronic apparatus according to an embodiment of the present invention includes an optical lens, a solid-state imaging device, and a signal processing circuit. The solid-state imaging device includes a substrate, a plurality of photodiodes, a readout gate electrode, a dark-current suppressing area, and a reading channel area.

The photodiodes are arranged in the substrate in a depth direction of the substrate. The readout gate electrode is a vertical readout gate electrode for reading signal charges in the photodiodes arranged in the depth direction of the substrate, and is embedded in the substrate such that the readout gate electrode extends in the depth direction of the substrate.

The dark-current suppressing area includes a first-conductivity-type semiconductor area which covers a bottom portion and a side surface of the readout gate electrode and which has a uniform thickness on the side surface of the readout gate electrode.

The reading channel area is disposed between a portion of the dark-current suppressing area on the side surface of the readout gate electrode and the photodiodes, and includes a second-conductivity-type semiconductor area.

In the electronic apparatus according to the embodiment of the present invention, light is incident on the optical lens and is converted into signal charges by the solid-state imaging device. The thus-obtained signal charges are output through the signal processing circuit as video signals. In the solid-state imaging device, signal charges are accumulated by the photodiodes arranged in the depth direction of the substrate. Thus, the saturation charge amount is increased. Since the signal charges are read by the vertical readout gate electrode, incomplete transfer of the signal charges can be prevented. In addition, since the portion of the dark-current suppressing area formed on the side surface of the readout gate electrode has a uniform thickness, variation in the reading characteristics can be reduced.

A solid-state imaging device according to another embodiment of the present invention includes a substrate and a pixel including a plurality of photodiodes arranged in the substrate in a depth direction of the substrate, a planar-type gate electrode, and a vertical gate electrode. The planar-type gate electrode is a gate electrode for reading a signal charge in one of the photodiodes that is near a surface of the substrate, and is provided on the surface of the substrate. The vertical gate electrode is a gate electrode for reading a signal charge in one of the photodiodes that is disposed at a deep position with respect to the surface of the substrate, and is embedded in the substrate such that the vertical gate electrode extends in the depth direction of the substrate. The solid-state imaging device also includes a photodiode-separating area which separates a plurality of photodiodes from each other and which is disposed between the photodiodes.

In the solid-state imaging device according to the embodiment of the present invention, the photodiodes are arranged in the depth direction of the substrate, and the signal charge accumulated in one of the photodiodes that is near the surface of the substrate is read by the planar-type gate electrode. In addition, the signal charge accumulated in one of the photodiodes that is disposed at a deep position with respect to the surface of the substrate is read by the vertical gate electrode.

An electronic apparatus according to another embodiment of the present invention includes an optical lens, a solid-state imaging device, and a signal processing circuit. The solid-state imaging device includes a substrate and a pixel including a plurality of photodiodes arranged in the substrate in a depth direction of the substrate, a planar-type gate electrode, and a vertical gate electrode. The planar-type gate electrode is a gate electrode for reading a signal charge in one of the photodiodes that is near a surface of the substrate, and is provided on the surface of the substrate. The vertical gate electrode is a gate electrode for reading a signal charge in one of the photodiodes that is disposed at a deep position with respect to the surface of the substrate, and is embedded in the substrate such that the vertical gate electrode extends in the depth direction of the substrate. The solid-state imaging device also includes a photodiode-separating area which separates a plurality of photodiodes from each other and which is disposed between the photodiodes.

In the electronic apparatus according to the embodiment of the present invention, light is incident on the optical lens and is converted into signal charges by the solid-state imaging device. The thus-obtained signal charges are output through the signal processing circuit as video signals. In the solid-state imaging device included in the electronic apparatus, the photodiodes are arranged in the depth direction of the substrate, and the signal charge accumulated in one of the photodiodes that is near the surface of the substrate is read by the planar-type gate electrode. In addition, the signal charge accumulated in one of the photodiodes that is disposed at a deep position with respect to the surface of the substrate is read by the vertical gate electrode.

A solid-state imaging device according to another embodiment of the present invention includes a substrate; a photodiode embedded in the substrate; a vertical gate electrode of a charge-readout transistor for reading a signal charge in the photodiode, the vertical gate electrode being embedded in the substrate such that the vertical gate electrode extends in a depth direction of the substrate; and a planar-type gate electrode of another transistor, the planar-type gate electrode being made of an electrode material different from an electrode material of the vertical gate electrode.

In the solid-state imaging device according to the embodiment of the present invention, the vertical gate electrode of the charge-readout transistor and the planar-type gate electrode of another transistor are made of different electrode materials. Therefore, the vertical gate electrode of the charge-readout transistor can be formed such that the characteristic thereof is uniform in the depth direction. In addition, a gate electrode having desired characteristics can be formed as the planar-type gate electrode without being limited by the electrode material of the vertical gate electrode.

A method for manufacturing a solid-state imaging device according to another embodiment of the present invention includes the steps of: forming an element separating area by forming a trench in a first polishing stop layer provided on a surface of a substrate; forming a second polishing stop layer on the first polishing stop layer; forming a trench in the first and second polishing stop layers and filling the trench with a planar-type gate electrode material for a transistor other than a transistor including a vertical gate such that a gate insulating film is interposed between the planar-type gate electrode material and an inner surface of the trench; forming a vertical trench in the substrate through a trench formed in the first and second polishing stop layers at a position other than the positions where the other trenches are formed in the first and second polishing stop layers and filling the vertical trench with a vertical gate electrode material for the charge-readout transistor such that a gate insulating film is interposed between the vertical gate electrode material and an inner surface of the vertical trench, the vertical gate electrode material and the planar-type gate electrode material having different characteristics; planarizing the planar-type gate electrode material and the vertical gate electrode material together along the second polishing stop layer; forming a vertical gate electrode and a planar-type gate electrode by removing the first and second polishing stop layers; and forming a photodiode such that the photodiode is embedded in the substrate by ion implantation.

In the method for manufacturing the solid-state imaging device according to the embodiment of the present invention, each of the vertical gate electrode of the charge-readout transistor and the planar-type gate electrode of another transistor can be formed of a gate electrode having desired characteristics without being limited by the electrode material of the other one of the vertical gate electrode and the planar-type gate electrode.

An electronic apparatus according to another embodiment of the present invention includes an optical lens; a solid-state imaging device; and a signal processing circuit which processes an output signal obtained by the solid-state imaging device. The solid-state imaging device includes a substrate; a photodiode embedded in the substrate; a vertical gate electrode of a charge-readout transistor for reading a signal charge in the photodiode, the vertical gate electrode being embedded in the substrate such that the vertical gate electrode extends in a depth direction of the substrate; and a planar-type gate electrode of another transistor, the planar-type gate electrode being made of an electrode material different from an electrode material of the vertical gate electrode.

In the electronic apparatus according to the embodiment of the present invention, since the above-described solid-state imaging device is included, each of the gate electrode of the charge-readout transistor and the gate electrode of another transistor can be formed of a gate electrode having desired characteristics without being limited by the electrode material of the other gate electrode.

According to at least one embodiment of the present invention, a solid-state imaging device is provided in which the saturation charge amount (Qs) in each unit pixel can be increased and in which the generation of dark currents is suppressed so that white defects can be prevented.

According to the method for manufacturing the solid-state imaging device of at least one embodiment of the present invention, the solid-state imaging device can be manufactured in which the dark-current suppressing area and the reading channel area are formed with high accuracy and in which the generation of dark currents is suppressed so that white defects can be prevented.

In the electronic apparatus according to at least one embodiment of the present invention, since the above-described solid-state imaging device is included, the sensitivity can be increased and the image quality can be improved.

In addition, in the solid-state imaging device according to at least one embodiment of the present invention, the gate electrodes by which the signal charges accumulated in the photodiodes disposed in the substrate are read are determined in accordance with the depths of the photodiodes. Therefore, incomplete transfer of the signal charges can be prevented. In other words, the transmission efficiency can be increased. In addition, since the photodiodes are disposed in the substrate such that the photodiodes are separated from each other, a plurality of colors can be detected in a single pixel. Thus, the effective number of pixels can be increased.

In addition, in the solid-state imaging device according to at least one embodiment of the present invention, the gate electrode of the charge-readout transistor has a vertical structure so that the pixel size can be reduced, and the potential control of the channel area in each transistor can be facilitated.

DESCRIPTION OF THE PREFERRED EMBODIMENTS

Figure 1:
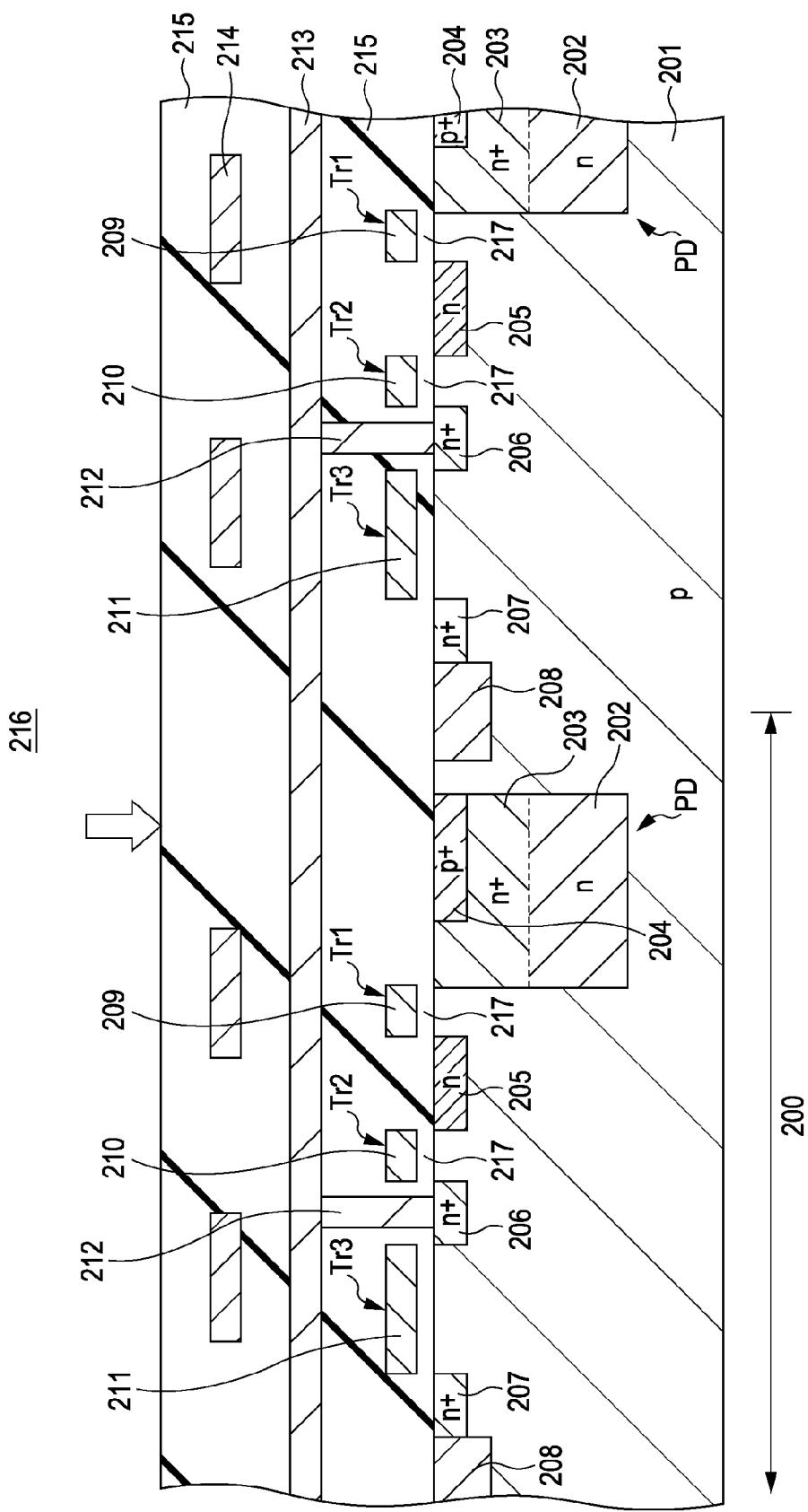
FIG. 1 is a schematic sectional view of an example of a solid-state imaging device according to a related art.
Figure 2:
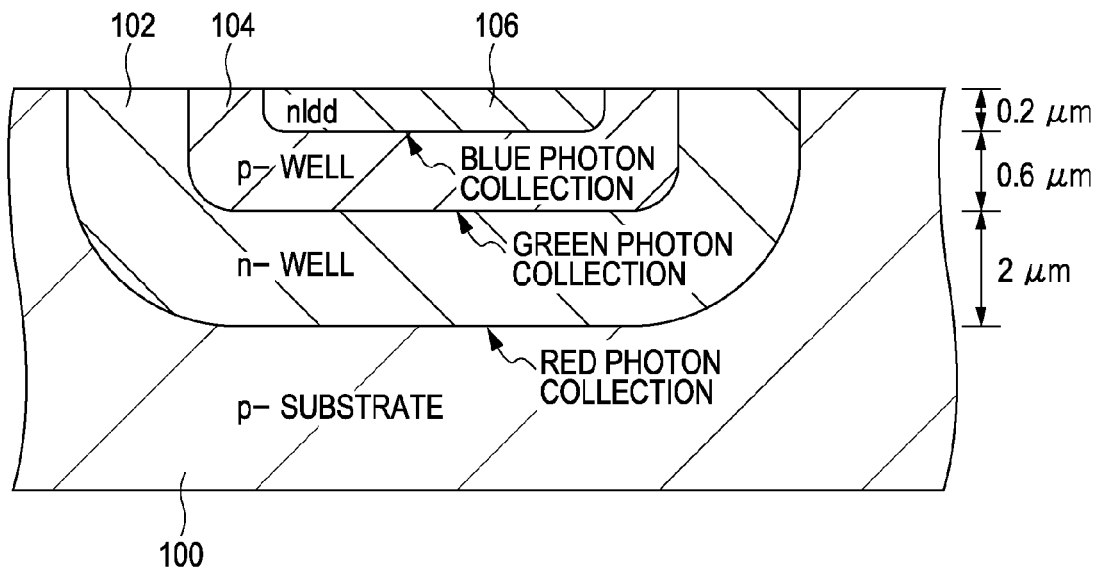
FIG. 2 is a schematic sectional view of another example of a solid-state imaging device according to a related art.
Figure 3:
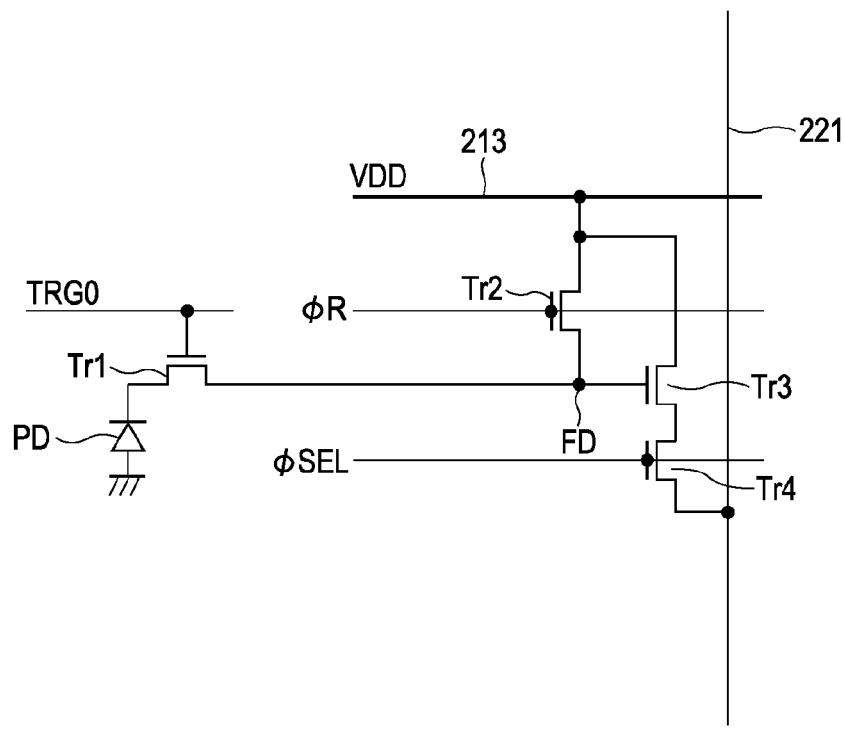
FIG. 3 is an equivalent circuit diagram of a unit pixel.
Figure 4:
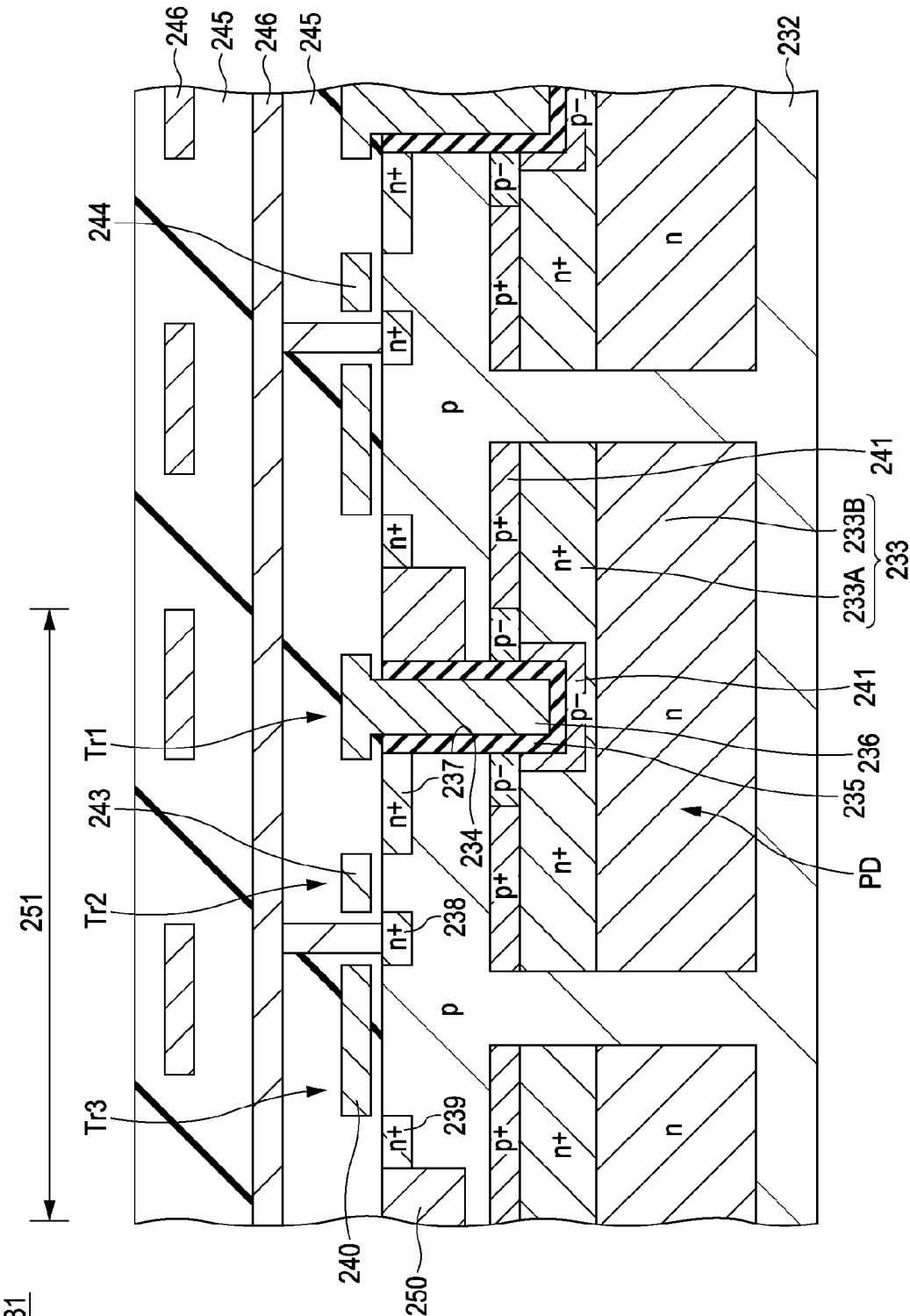
FIG. 4 is a schematic sectional view of the main part of another example of a solid-state imaging device according to a related art.

Embodiments of the present invention will be described with reference to FIGS. 5 to 35.

First Embodiment

Overall Structure of Solid-State Imaging Device

First, the overall structure of a CMOS solid-state imaging device, which is a CMOS image sensor, according to a first embodiment of the present invention, will be described with reference to FIG. 5.

In the following description, reference numerals 1 and 101 denote a solid-state imaging device, 2 denotes pixels, 2a denotes first pixels, 2b denotes second pixels, 3 denotes an image pickup area (pixel section), 4 denotes a vertical drive circuit, 5 denotes column signal processing circuits, 6 denotes a horizontal drive circuit, 7 denotes an output circuit, 8 denotes a control circuit, 9 denotes vertical signal lines, 10 denotes a horizontal signal line, 11 and 20 denote a substrate, 21 denotes p+ type semiconductor areas, 22 denotes n+ type semiconductor areas, 23 denotes p+ type semiconductor areas, 24 denotes n+ type semiconductor areas, 25 denotes n-type semiconductor areas, 26 denotes vertical readout gate electrodes, 27 denotes a gate insulating film, 28 denotes reading channel areas, 29 and 30 denote dark-current suppressing areas, 31 denote reset electrodes, 32 and 34 denote source-drain areas, 33 denotes amplifier gate electrodes, and 35 denotes pixel separating areas.

Reference numerals 31, 33, 87, and 88 denote planar-type gate electrodes.

Figure 5:
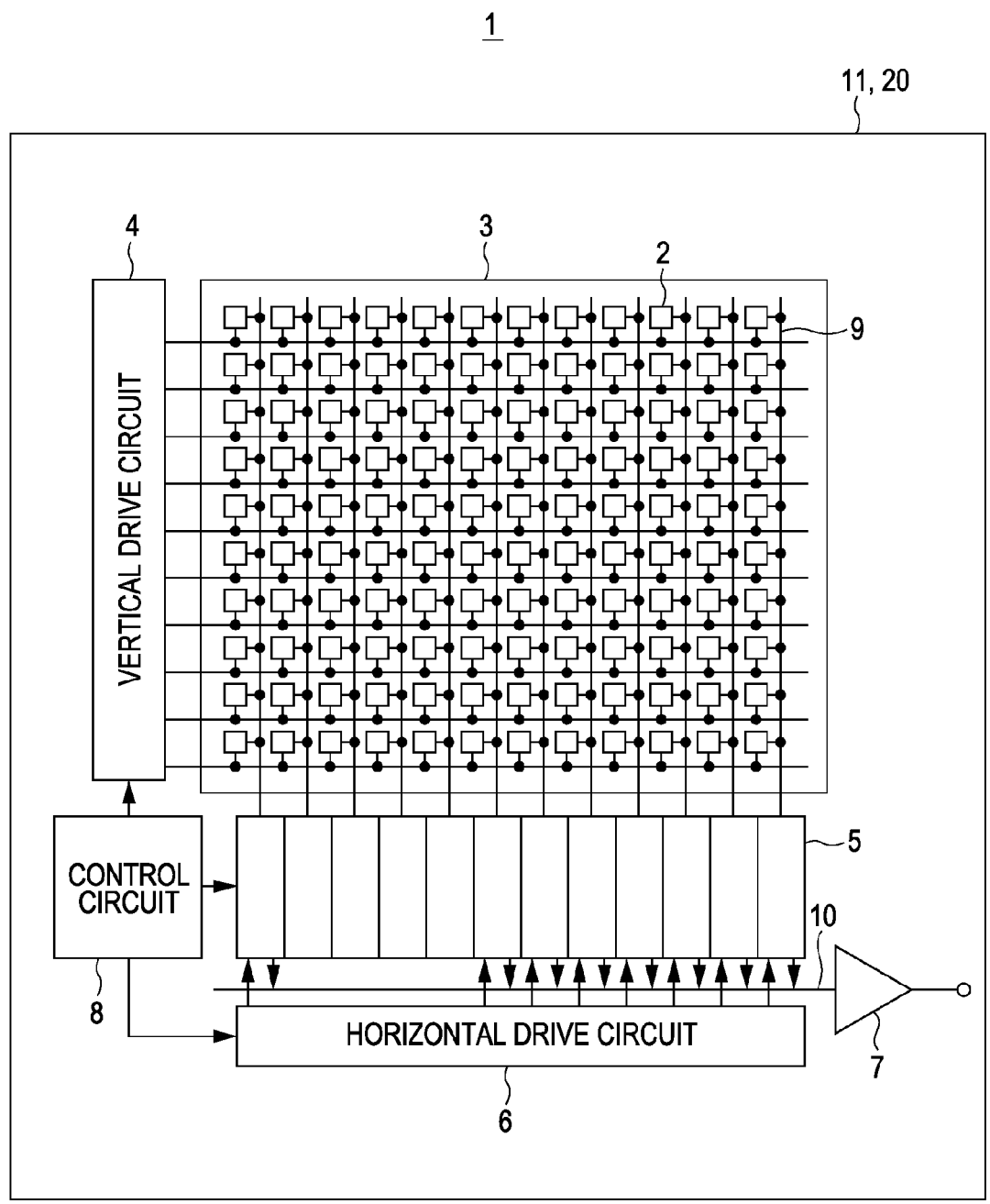
FIG. 5 is a schematic diagram illustrating the overall structure of solid-state imaging devices according to first to eighth embodiments.

The solid-state imaging device 1 shown in FIG. 5 includes an image pickup area 3 in which a plurality of pixels 2 are arranged on a Si substrate 11 and peripheral circuits of the image pickup area 3. The peripheral circuits include a vertical drive circuit 4, column signal processing circuits 5, a horizontal drive circuit 6, a output circuit 7, and a control circuit 8.

Each pixel 2 includes photodiodes, which are photoelectric conversion elements, and MOS transistors. The pixels 2 are arranged on the substrate 11 in a two-dimensional regular array pattern.

The image pickup area 3 includes the pixels 2 which are arranged in the two-dimensional regular array pattern. The image pickup area 3 includes an effective pixel area in which signal charges generated by photoelectric conversion can be accumulated and a black reference pixel area which is disposed around the effective pixel area and from which optical black which serves as a black level reference is output.

The solid-state imaging device 1 according to the present embodiment includes a pixel section (image pickup area) 3 in which the pixels 2, which each include a photoelectric conversion element, are arranged on a semiconductor substrate 20, such as a silicon substrate, in a two-dimensional regular pattern. The solid-state imaging device 1 also includes a peripheral circuit section. Each pixel 2 includes the photoelectric conversion elements, such as photodiodes, and a plurality of pixel transistors (so-called MOS transistors). The pixel transistors may include three transistors, which are, for example, a charge-readout transistor, a reset transistor, and an amplifier transistor. The pixel transistors may additionally include a selection transistor. In such a case, four transistors are provided in total. A single set of pixel transistors may be used in common by a plurality of pixels. In such a case, the same number of charge-readout transistors as the number of pixels are provided, whereas one reset transistor, one amplifier transistor, and one vertical selection transistor are provided for a plurality of pixels 2.

The peripheral circuit section includes the vertical drive circuit 4, the column signal processing circuits 5, the horizontal drive circuit 6, the output circuit 7, and the control circuit 8.

The control circuit 8 generates a clock signal, a control signal, etc., on the basis of a vertical synchronization signal, a horizontal synchronization signal, and a master clock. The thus-generated clock signal, control signal, etc., serve as references for the operations of the vertical drive circuit 4, the column signal processing circuits 5, and the horizontal drive circuit 6. The clock signal, the control signal, etc., generated by the control circuit 8 are input to the vertical drive circuit 4, the column signal processing circuits 5, and the horizontal drive circuit 6.

The vertical drive circuit 4 includes, for example, a shift resistor, and successively performs selective scanning of rows of pixels 2 in the image pickup area 3 in the vertical direction. Thus, pixel signals based on signal charges, which are generated by photodiodes included in the pixels 2 in accordance with the amounts of received light, are supplied to the respective column signal processing circuits 5 through respective vertical signal lines 9.

The column signal processing circuits 5 are provided for the respective columns of pixels 2. When signals from the pixels 2 in a certain row are supplied, the column signal processing circuits 5 perform signal processes, such as a noise-reducing process and a signal-amplifying process, for signals obtained from the respective columns on the basis of signals obtained from the black reference pixel area (not shown) disposed around the effective pixel area. Horizontal selection switches (not shown) are provided between a horizontal signal line 10 and output terminals of the column signal processing circuits 5.

The horizontal drive circuit 6 includes, for example, a shift resistor and successively outputs horizontal scanning pulses to successively select the column signal processing circuits 5. Thus, the pixel signals obtained by the column signal processing circuits 5 are successively output to the horizontal signal line 10.

The output circuit 7 performs signal processes for the signals successively supplied from the column signal processing circuits 5 through the horizontal signal line 10, and then outputs the processed signals.

The solid-state imaging devices according to the first embodiment have the structure of the solid-state imaging device 1 shown in FIG. 5. The sectional structure of the pixels 2 included in the effective image pickup area of the solid-state imaging device 1 will be described.

In the case where the above-described solid-state imaging device is of a back-illuminated type in which light is incident on a back surface of the substrate, multiple wiring layers are provided above a front surface of the semiconductor substrate, on which the pixel section 3 and the peripheral circuit section are formed, with interlayer insulation films interposed therebetween. The back surface of the semiconductor substrate serves as a light incidence surface (light-receiving surface). An on-chip color filter is formed below the back surface in the pixel section 3 with a planarizing layer interposed therebetween, and on-chip microlenses are formed on the on-chip color filter.

In the case where the above-described solid-state imaging device is of a front-illuminated type in which light is incident on a front surface of the substrate, multiple wiring layers are provided above the front surface of the substrate, on which the pixel section 3 and the peripheral circuit section are formed, with interlayer insulation films interposed therebetween. An on-chip color filter is formed above the multiple wiring layers in the pixel section 3 with a planarizing layer interposed therebetween, and on-chip microlenses are formed on the on-chip color filter.

Structure of Solid-State Imaging Device

Figure 6:
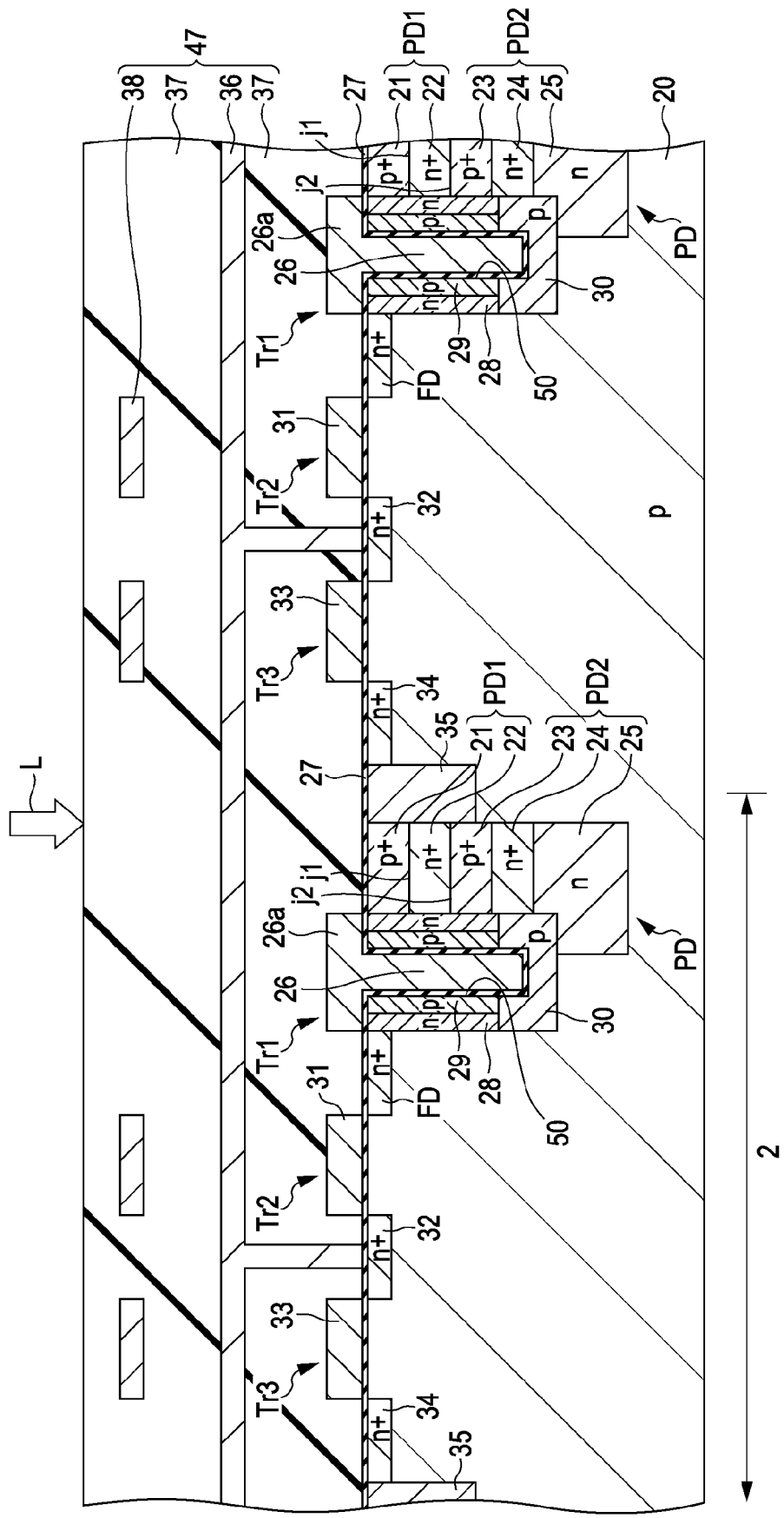
FIG. 6 is a schematic sectional view of the main part of the solid-state imaging device according to the first embodiment of the present invention.

FIG. 6 shows the solid-state imaging device according to the first embodiment.

FIG. 6 is a schematic sectional view of the image pickup area 3 of the solid-state imaging device 1 according to the present embodiment.

In FIG. 6, Tr1 denotes charge-readout transistors, Tr2 denotes reset transistors, Tr3 denotes amplifier transistors, and PD (PD1, PD2) denote photodiodes. The solid-state imaging device 1 according to the present embodiment includes the substrate 20, the photodiodes PD formed in the substrate 20, pixel transistors for reading signal charges obtained by the photodiodes PD, and a wiring layer 47 for driving the pixel transistors.

In the following description, p-type semiconductor areas are used as first-conductivity-type semiconductor areas, and n-type semiconductor areas are used as second-conductivity-type semiconductor areas. The n-type semiconductor areas are referred to as n-type semiconductor areas when the n-type impurity concentration therein is relatively low, and as n+ type semiconductor areas when the n-type impurity concentration therein is relatively high. Similarly, the p-type semiconductor areas are referred to as p-type semiconductor areas when the p-type impurity concentration therein is relatively low, and as p+ type semiconductor areas when the p-type impurity concentration therein is relatively high. In the present embodiment, the solid-state imaging device 1 is of a front-illuminated type in which light L is incident on a front surface of the substrate 20.

The substrate 20 is a silicon substrate made of p-type semiconductor.

The photodiodes PD are provided for respective pixels 2 shown in FIG. 5, and are arranged in the substrate 20 along the vertical and horizontal directions in a matrix pattern. The photodiodes PD function as light-receiving portions for receiving light in the pixels 2. In each pixel 2, a plurality of photodiodes having pn junctions j1 and j2, which are junctions of p-type and n-type semiconductor areas, are arranged in the depth direction. In the present embodiment, a first photodiode PD1 and a second photodiode PD2 are provided. More specifically, a p+ type semiconductor area 21, an n+ type semiconductor area 22, a p+ type semiconductor area 23, an n+ type semiconductor area 24, and an n-type semiconductor area 25 are provided in order from the surface of the substrate 20. The first photodiode PD1 is formed of the pn junction j1 between the p+ type semiconductor area 21 and the n+ type semiconductor area 22, and the second photodiode PD2 is formed of the pn junction j2 between the p+ type semiconductor area 23 and the n+ type semiconductor area 24, which are successively arranged below the first photodiode PD1.

In the photodiodes PD having the above-described structure, the light L is incident on the photodiodes PD, which serve as the light-receiving portions, and is subjected to photoelectric conversion performed by the photodiodes PD. Signal charges are obtained as a result of the photoelectric conversion, and are accumulated in potential wells formed by the pn junction j1.

The pixel transistors include the charge-readout transistor Tr1, the reset transistor Tr2, and the amplifier transistor Tr3 for each pixels 2.

The charge-readout transistor Tr1 includes a readout gate electrode 26 disposed adjacent to the photodiodes PD provided for each pixel 2 and a floating diffusion area FD.

The readout gate electrode 26 is a columnar vertical gate electrode formed by filling a trench 50 which extends in the depth direction from the surface of the substrate 20 with an electrode material such that the gate insulating film 27 is interposed between the readout gate electrode 26 and an inner surface of the trench 50. A planar electrode portion (extraction electrode portion) 26a for providing connection with the wiring is formed at the top of the vertical readout gate electrode 26. The readout gate electrode 26 vertically extends in the substrate 20 such that a bottom portion of the readout gate electrode 26 is at a position deeper than the pn junction j2 which forms the second photodiode PD2.

The side surface and the bottom portion of the readout gate electrode 26 are respectively covered by dark-current suppressing areas 29 and 30 made of p-type semiconductor areas together with the gate insulating film 27. The dark-current suppressing area 29, which is provided on the side surface of the readout gate electrode 26, has a constant thickness over the entire circumference of the readout gate electrode 26. A reading channel area 28 made of an n-type semiconductor area is formed around the dark-current suppressing area 29 provided on the side surface of the readout gate electrode 26. In the present embodiment, the reading channel area 28 covers the entire area of the dark-current suppressing area 29 provided on the side surface of the readout gate electrode 26. The reading channel area 28 is in contact with the pn junctions j1 and j2, which form the first and second photodiodes PD1 and PD2, respectively, at one side thereof. The reading channel area 28 is also in contact with the floating diffusion area FD, which is formed in the surface of the substrate 20, at the other side thereof.

The floating diffusion area FD is made of a high-impurity-concentration n+ type impurity area in the surface of the substrate 20, and is positioned such that the floating diffusion area FD is in contact with the reading channel area 28 at a side of the vertical readout gate electrode 26 opposite to the side at which the reading channel area 28 is in contact with the photodiodes PD. The signal charges accumulated in the photodiodes PD are read out to the floating diffusion area FD.

In the charge-readout transistor Tr1, when a positive voltage is applied to the readout gate electrode 26, a potential of the reading channel area 28 changes such that the photodiodes PD are electrically connected to the floating diffusion area FD.

In the solid-state imaging device 101 according to the present embodiment, pixel separating areas 35 are formed in the semiconductor substrate 20, which is a first conductivity type, for example, p-type silicon semiconductor substrate. The unit pixels 2 which each include the photodiodes PD and the pixel transistors are formed in the areas separated from each other by the pixel separating areas 35.

In each unit pixel 2, the photodiodes PD (PD1 and PD2), which function as the photoelectric conversion elements, are formed in layers in the semiconductor substrate 20, and the charge-readout transistor Tr1 is formed as a vertical transistor. The photodiodes PD (PD1 and PD2) are formed by alternately arranging the layers of the n-type semiconductor areas, which are the second-conductivity-type semiconductor areas, and the p-type semiconductor areas, which are the first-conductivity-type semiconductor areas, in the depth direction of the semiconductor substrate 20.

Referring to FIG. 6, each pixel separating area 35 may be formed of, for example, a p-type semiconductor area. Alternatively, as in the manufacturing method described below, each pixel separating area 35 may also be formed of an insulating film which is provided on the substrate 20 and which is thicker than the gate insulating film and a p-type semiconductor area formed directly below the insulating film. Although not shown in the figures, element separating areas provided in each pixel also have structures similar to the structure of the pixel separating areas 35.

In the vertical charge-readout transistor Tr1 of each unit pixel 2, the vertical trench 50 is formed in the semiconductor substrate 20 such that the trench 50 vertically extends in the depth direction, and the columnar readout gate electrode 26 is disposed in the vertical trench 50 with the gate insulating film 27 interposed between the readout gate electrode 26 and the inner surface of the vertical trench 50. The readout gate electrode 26 includes the extraction electrode portion 26a at the top, and the extraction electrode portion 26a protrudes along the surface of the substrate 20. The floating diffusion area FD made of the n-type semiconductor area is formed in the surface of the substrate 20 at a position near the protruding region of the planar electrode portion 26a. The charge-readout transistor Tr1 is provided at the ends of the photodiodes PD (PD1 and PD2).

The vertical charge-readout transistor Tr1 includes the photodiodes PD, the floating diffusion area FD, and the vertical readout gate electrode 26 formed in the substrate 20 at a position between the photodiodes PD and the floating diffusion area FD such that the gate insulating film 27 is interposed between the readout gate electrode 26 and the above-mentioned areas PD and FD.

The first photodiode PD1 includes the p+ type semiconductor area 21 and the n+ type semiconductor area 22 positioned below the p+ type semiconductor area 21 such that a pn junction is formed at a position near the surface of the substrate 20. The second photodiode PD2 includes the p+ type semiconductor area 23, the n+ type semiconductor area 24 positioned below the p+ type semiconductor area 23, and the n-type semiconductor area 25 positioned below the n+ type semiconductor area 24 such that a pn junction is formed at a position below the first photodiode PD1.

The readout gate electrode 26 extends in the vertical direction such that the bottom end of the readout gate electrode 26 reaches a position deeper than the pn junction which forms the second photodiode PD2.

The side surface and the bottom portion of the readout gate electrode 26 are respectively covered by dark-current suppressing areas 29 and 30 made of p-type semiconductor areas together with the gate insulating film 27. The dark-current suppressing area 29, which is provided on the side surface of the readout gate electrode 26, has a constant thickness over the entire circumference of the readout gate electrode 26. The channel area 28 made of the n-type semiconductor area is formed around the dark-current suppressing area 29 provided on the side surface of the readout gate electrode 26. In the present embodiment, the channel area 28 covers the entire area of the dark-current suppressing area 29 provided on the side surface of the readout gate electrode 26. The channel area 28 is in contact with the pn junctions, which form the first and second photodiodes PD1 and PD2, respectively, at one side thereof. The channel area 28 is also in contact with the floating diffusion area FD, which is formed in the surface of the substrate 20, at the other side thereof.

The floating diffusion area FD is made of a high-impurity-concentration n+ type impurity area in the surface of the substrate 20, and is positioned such that the floating diffusion area FD is in contact with the channel area 28 at a side of the vertical readout gate electrode 26 opposite to the side at which the channel area 28 is in contact with the photodiodes PD.

The reset transistor Tr2 includes the floating diffusion area FD, an n-type source-drain area 32, and a planar reset gate electrode 31 formed above the substrate with the gate insulating film 27 interposed therebetween at a position between the above-mentioned areas FD and 32.

The amplifier transistor Tr3 includes the n-type source-drain area 32, another n-type source-drain area 34, and a planar amplifier gate electrode 33 formed above the substrate with the gate insulating film 27 interposed therebetween at a position between the above-mentioned areas 32 and 34.

Although not shown in the figures, a vertical selection transistor may also be formed as necessary.

In addition, although not shown in the figures, CMOS transistors, for example, which form logic circuits are included in the peripheral circuit section disposed around the pixel section. An n-channel MOS transistor includes a pair of n-type source-drain areas disposed in a p-type semiconductor area and a planar-type gate electrode formed above the substrate with a gate insulating film interposed therebetween at a position between the source-drain areas. A p-channel MOS transistor includes a pair of p-type source-drain areas disposed in an n-type semiconductor area and a planar-type gate electrode formed above the substrate with a gate insulating film interposed therebetween at a position between the source-drain areas.

As described above, each pixel 2 includes the photodiodes PD and desired pixel transistors, such as the charge-readout transistor Tr1, the reset transistor Tr2, and the amplifier transistor Tr3. The pixels 2 formed on the substrate 20 are separated from each other by the pixel separating areas 35. The wiring layer 47, in which multiple wiring lines 38 including a power source line 36 are formed with interlayer insulation films 37 interposed therebetween, is formed above the substrate 20 in an area where the photodiodes PD and the pixel transistors are formed in the pixel section and in an area where the peripheral circuit section is provided.

In the above-described solid-state imaging device 101, the light L is incident on the front surface of the substrate 20, and is received by the photodiodes PD. Therefore, although not shown in the figures, an on-chip color filter is provided on the wiring layer 47 disposed above the substrate 20, and on-chip lenses are formed on the on-chip color filter at positions corresponding to the pixels 2.

According to the present embodiment, the vertical readout gate electrode 26 included in the charge-readout transistor Tr1 is made of an electrode material that is different from the material of other gate electrodes. In other words, the vertical readout gate electrode 26 is made of an electrode material that is different from the material of the planar reset gate electrode 31 and the planar amplifier gate electrode 33 included in the pixel transistors Tr2 and Tr3, respectively, and is also different from the material of planar-type gate electrodes included in the CMOS transistors disposed in the peripheral circuit section.

The vertical readout gate electrode 26 and the planar-type gate electrodes may be formed of electrode materials having different work functions.

To suppress depletion in the embedded electrode material, the vertical readout gate electrode 26 is made of impurity-implanted (impurity-doped) silicon formed by chemical vapor deposition (CVD) using so-called impurity-mixed gas, which is obtained by mixing dopant gas with source gas. For example, amorphous silicon or polysilicon doped in situ with phosphorus (P), which is an n-type impurity, may be used as the electrode material of the vertical readout gate electrode 26.

In contrast, the planar-type gate electrodes are formed by forming a layer of undoped amorphous silicon or polysilicon and then doping the layer with an impurity of the desired conductivity type. For example, a gate electrode of an n-channel transistor is formed by doping the undoped silicon with an n-type impurity, and a gate electrode of a p-channel transistor is formed by doping the undoped silicon with a p-type impurity. Thus, the planar-type gate electrodes are formed.

To achieve high-speed operations, the planar-type gate electrodes other than the vertical readout gate electrode 26 preferably have a threshold voltage that can be controlled within ±0.3 V. Therefore, the planar-type gate electrodes may be made of a gate electrode material having a work function that is different from that of the material of the vertical readout gate electrode 26. For example, the planar-type gate electrodes may be made of, for example, boron-doped silicon or a metal material such as TiN, HfSi, or W. In other words, the planar-type gate electrodes may be made of electrode materials, such as the above-mentioned electrode materials, which allow threshold electrode control for each of the n-channel/p-channel MOS transistors and which can cancel the difference in work function between the gate electrodes and a high-dielectric-constant gate insulating film made of, for example, AlO, HfO, or TaO.

The vertical readout gate electrode 26 may be formed of impurity-doped silicon which is doped with a first conductivity type impurity or a second-conductivity-type impurity. For example, the readout gate electrode 26 may be formed of amorphous silicon or polysilicon doped with phosphorus (P) or boron (B).

The vertical readout gate electrode 26 may be formed of amorphous silicon doped in situ with boron or a metal having a work function corresponding to that of a p-type material. In such a case, a self-alignment function of reducing the electron density at the surface of the vertical readout gate electrode 26 can be obtained, so that the generation of dark currents can be suppressed. In this structure, the readout gate electrode 26 can be disposed next to the channel area made of the n-type semiconductor with the gate insulating film 27 interposed therebetween. Therefore, the dark-current suppressing areas 29 and 30 can be omitted.

The extraction electrode portion 26a of the vertical readout gate electrode 26, the other planar-type gate electrodes 31, 33, 87, and 88, and the gate electrode wirings (not shown) are formed such that the top surfaces thereof are on the same plane. The gate electrode wirings may also be formed continuously from the planar-type gate electrodes 31, 33, 87, and 88.

Operation of Solid-State Imaging Device

The operation of the solid-state imaging device 101 will now be described.

The light L is incident on the front surface of the solid-state imaging device 101 shown in FIG. 6, that is, on the on-chip lenses (not shown). The light L is collected by the on-chip lenses and is incident on the photodiodes PD through the color filter (not shown).

The light incident on the photodiodes PD is subjected to photoelectric conversion by the first photodiode PD1 and the second photodiode PD2 in each pixel 2, and thereby the signal charges are generated. The generated signal charges are accumulated in the n+ type semiconductor area 22 included in the first photodiode PD1 or the n+ type semiconductor area 24 included in the second photodiode PD2.

The bottom portion and the side surface of the readout gate electrode 26 are disposed adjacent to the dark-current suppressing areas 29 and 30 with the gate insulating film 27 interposed therebetween. In the process of accumulating the signal charges, a negative voltage is applied to the readout gate electrode 26. Therefore, trench pinning occurs at the boundary surface of the channel area 28, and the dark current noise which enters the dark-current suppressing areas 29 and 30 from the readout gate electrode 26 can be enclosed in the dark-current suppressing areas 29 and 30 in the process of accumulating the signal charges. Thus, the dark current which reaches the first photodiode PD1 and the second photodiode PD2 can be reduced.

In the process of accumulating the signal charges, if the signal charge accumulated in the first photodiode PD1 exceeds the saturation charge amount (Qs) and overflows, the excess signal charge is transferred to the second photodiode PD2 through the channel area 28. Similarly, if the signal charge accumulated in the second photodiode PD2 overflows, the excess signal charge is transferred to the first photodiode PD1. Thus, if the signal charge exceeds the saturation charge amount in one of the photodiodes, the excess signal charge overflows and is transferred to the other photodiode. As a result, the total saturation charge amount (Qs) of the photodiodes PD can be increased. Thus, the channel area 28 functions as an overflow barrier area in a region between the first photodiode PD1 and the second photodiode PD2.

A positive voltage is applied to the readout gate electrode 26 after the accumulation of the signal charges. When the potential of the channel area 28 is lowered, the signal charges accumulated in the first photodiode PD1 and the second photodiode PD2 are simultaneously read out to the floating diffusion area FD through the channel area 28.

The driving method performed after this process is similar to that of a common solid-state imaging device. More specifically, the signal charges are transferred to the floating diffusion area FD, and a voltage is applied to the amplifier gate electrode 33 in the amplifier transistor Tr3 in accordance with a voltage change caused in the floating diffusion area FD. Thus, signal outputs corresponding to the signal charges are amplified and are output.

Then, when a positive voltage is applied to the reset gate electrode 31, the reset transistor Tr2 is switched on and the voltage in the floating diffusion area FD is reset to the same voltage as the power source voltage applied to the source-drain area 32.

Figure 7:
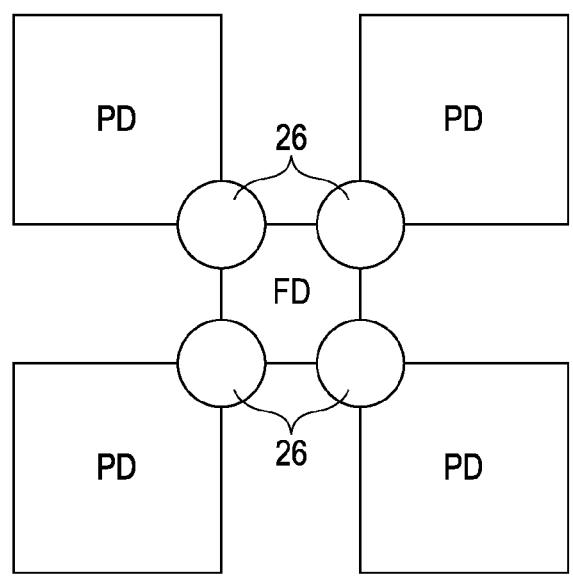
FIG. 7 is a planar layout view of the solid-state imaging device according to the first embodiment of the present invention.

FIG. 7 shows a planar layout structure of the pixels 2 included in the solid-state imaging device 1 according to the present embodiment. As shown in FIG. 7, in the solid-state imaging device 1 according to the present embodiment, a single charge-readout transistor Tr1 is provided for the photodiodes PD included in each pixel, whereas a single floating diffusion area FD is used in common by four pixels 2 which are disposed adjacent to each other.

The reset transistor Tr2 includes the floating diffusion area FD, the source-drain area 32, and the reset gate electrode 31.

The floating diffusion area FD is structured as described above.

The source-drain area 32 is formed of the n+ semiconductor area in the surface of the substrate 20 at a position separated from the floating diffusion area FD. The source-drain area 32 is connected to the power source line 36 which supplies the power source voltage.

The reset gate electrode 31 is formed above the substrate 20 with the gate insulating film 27 interposed therebetween at a position between the floating diffusion area FD and the source-drain area 32. One end of the reset gate electrode 31 is positioned adjacent to the floating diffusion area FD, and the other end is positioned adjacent to the source-drain area 32.

In the reset transistor Tr2, when a positive voltage is applied to the reset gate electrode 31, a channel area is formed in the substrate 20 at a position below the reset gate electrode 31. The thus-formed channel area serves to electrically connect the floating diffusion area FD and the source-drain area 32 to each other.

The amplifier transistor Tr3 includes the source-drain areas 32 and 34 and the amplifier gate electrode 33.

The source-drain area 32 is structured as described above.

The source-drain area 34 is formed of the n+ semiconductor area in the surface of the substrate 20 at a position separated from the source-drain area 32.

The amplifier gate electrode 33 is formed above the substrate 20 with the gate insulating film 27 interposed therebetween at a position between the source-drain area 32 and the source-drain area 34. One end of the amplifier gate electrode 33 is positioned adjacent to the source-drain area 32, and the other end is positioned adjacent to the source-drain area 34.

In the amplifier transistor Tr3, a voltage is applied to the amplifier gate electrode 33 in accordance with a voltage change caused in the floating diffusion area FD when the signal charges are read out to the floating diffusion area FD. When a voltage is applied to the amplifier gate electrode 33, a channel area is formed in the substrate 20 at a position below the amplifier gate electrode 33. The thus-formed channel area serves to electrically connect the source-drain areas 32 and 34 to each other.

Although not shown in the figures, a vertical selection transistor may also be formed as necessary.

As described above, each pixel 2 includes the photodiodes PD and desired pixel transistors, such as the charge-readout transistor Tr1, the reset transistor Tr2, and the amplifier transistor Tr3. The pixels 2 formed on the substrate 20 are separated from each other by the pixel separating areas 35. The wiring layer 47, in which multiple wiring lines 38 including a power source line 36 are formed with interlayer insulation films 37 interposed therebetween, is formed above the substrate 20 in an area where the photodiodes PD and the pixel transistors are formed.

In the above-described solid-state imaging device 1, the light L is incident on the front surface of the substrate 20, and is received by the photodiodes PD. Therefore, although not shown in the figures, an on-chip color filter is provided on the wiring layer 47 disposed above the substrate 20, and on-chip lenses are formed on the on-chip color filter at positions corresponding to the pixels 2.

Method for Manufacturing Solid-State Imaging Device

A method for manufacturing the solid-state imaging device 1 will be described with reference to FIGS. 8A to 8D and 9E to 9J. A case in which the pixel size is, for example, 0.9 μm will be described. In particular, manufacturing steps for forming the readout gate electrode 26 will be described in detail. Manufacturing steps other than those for forming the readout gate electrode 26 may be similar to those of a method for manufacturing the solid-state imaging device according to the related art. The manufacturing steps for forming the readout gate electrode 26 are generally performed after the manufacturing step of forming the photodiodes PD. In the present embodiment, the manufacturing steps for forming the readout gate electrode 26 are performed before the step of forming the p+ type semiconductor area 21, which is included in the photodiodes PD, in the surface of the substrate 20. In the manufacturing steps described in the present embodiment, it is assumed that the pn junction j1 of the first photodiode PD1 is formed at a depth of about 0.1 μm from the surface of the substrate 20, and the pn junction j2 of the second photodiode PD2 is formed at a depth of about 0.5 μm from the surface of the substrate 20.

Figure 8A:
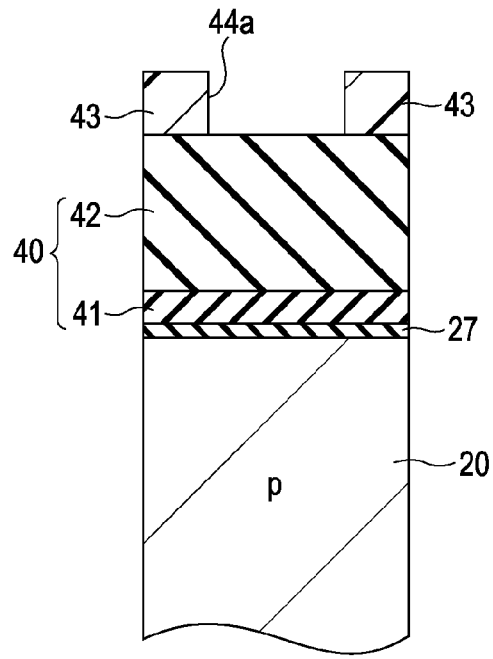
FIGS. 8A to 8D are diagrams illustrating manufacturing steps of the solid-state imaging device according to the first embodiment of the present invention.

First, as shown in FIG. 8A, a silicon oxide film ($SiO_2$) having a thickness of 5 nm which serves as the gate insulating film 27 is formed on the substrate 20.

Then, a silicon nitride film (SiN) 41 having a thickness of 100 nm is formed on the gate insulating film 27, and a silicon oxide film ($SiO_2$) 42 having a thickness of 1 μm is formed on the silicon nitride film 41. The silicon nitride film 41 and the silicon oxide film 42 form a mask layer 40 for when the substrate 20 is subjected to ion implantation.

Then, a photoresist layer 43 having a thickness of 0.6 μm is formed on the silicon oxide film 42. The photoresist layer 43 is subjected to exposure and development by photolithography, so that a pattern is formed in the photoresist layer 43. In the present embodiment, a circular opening 44a having a diameter of 0.3 μm is formed in the photoresist layer 43. The diameter of the opening 44a differs in accordance with the pixel size, and the value mentioned in the present embodiment is merely an example.

Next, the mask layer 40 and the gate insulating film 27 are etched using the photoresist layer 43, in which the opening 44a is formed, as a mask until the surface of the substrate 20 appears. Thus, an opening 44b is obtained.

Figure 8B:
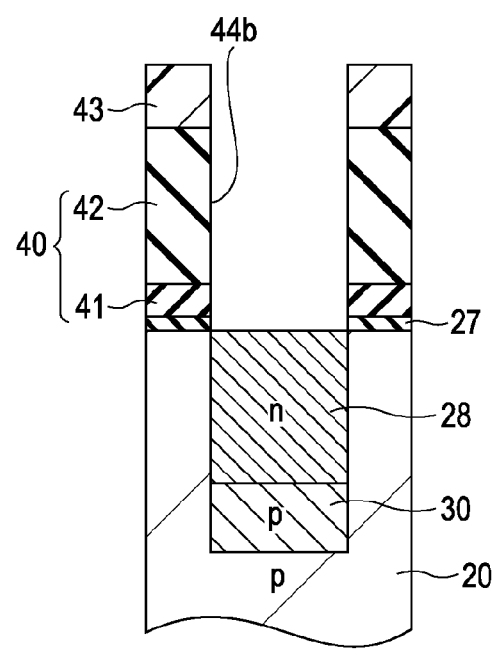

Next, as shown in FIG. 8B, boron, which is an impurity for forming a p-type semiconductor area, is implanted into the substrate 20 by ion implantation through the opening 44b formed in the gate insulating film 27, the mask layer 40, and the photoresist layer 43. The boron-doped area is formed such that the depth thereof from the surface of the substrate 20 is equal to or more than 0.6 to 0.8 μm and equal to or less than 1 to 1.5 μm. Thus, the boron-doped area is formed at a position deeper than the pn junction j2. Thus, the dark-current suppressing area 30 which covers the bottom portion of the readout gate electrode 26 is formed.

Next, phosphorus, which is an impurity for forming an n-type semiconductor area, is implanted into the substrate 20 by ion implantation through the opening 44b such that the depth of the phosphorus-doped area from the surface of the substrate 20 is equal to or less than 0.6 to 0.8 μm. Thus, the phosphorus-doped area is formed so as to extend to a position deeper than the pn junction j2. The thus-formed n-type semiconductor area serves as the reading channel area 28.

The depths of ion implantation of the impurities, which are boron and phosphorus, are set to be sufficiently smaller than the total thickness of the photoresist layer 43 and the mask layer 40 including the silicon oxide film 42 and the silicon nitride film 41. Preferably, the phosphorus-doped area is formed such that the impurity concentration of phosphorus increases as the depth from the surface of the substrate 20 decreases.

Figure 8C:
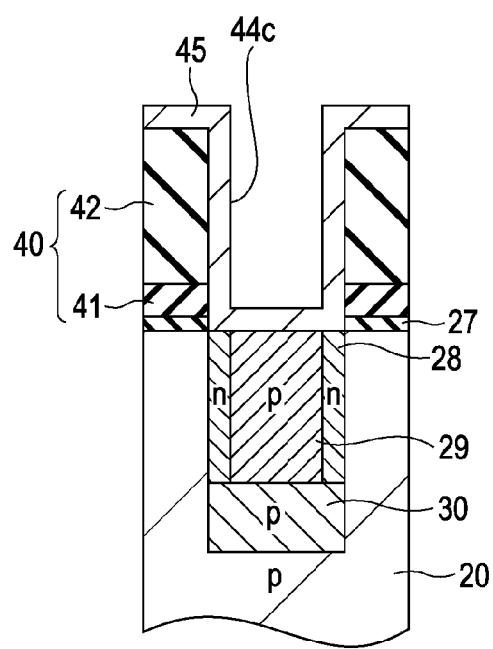

Next, the photoresist layer 43 is removed. Then, as shown in FIG. 8C, a silicon oxide film having a thickness of 50 nm is formed on the surface of the mask layer 40. Thus, a first side-wall spacer 45 is formed. The diameter of the opening 44b formed in the mask layer 40 is reduced by the first side-wall spacer 45. As a result, an opening 44c having a diameter of 0.2 μm is formed.

Next, boron, which is an impurity for forming a p-type semiconductor area, is implanted into the substrate 20 by ion implantation through the opening 44c having a diameter reduced by the first side-wall spacer 45. The boron-doped area is formed such that the depth thereof from the surface of the substrate 20 is equal to or less than 0.8 to 1 μm. At this time, the boron-doped area is formed such that the impurity concentration of boron is as uniform as possible along the depth from the surface of the substrate 20. The thus-formed p-type semiconductor area serves as the dark-current suppressing area 29 on the side surface of the readout gate electrode 26.

Figure 8D:
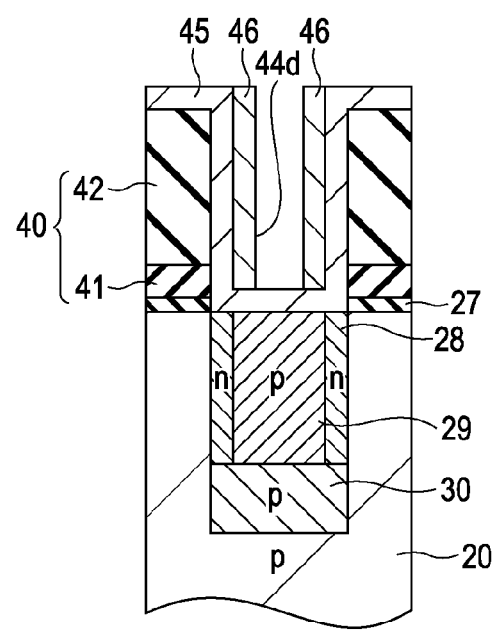

Next, as shown in FIG. 8D, a silicon oxide film having a thickness of 50 nm is formed on the inner wall surface of the opening 44c having a diameter reduced by the first side-wall spacer 45. Thus, a second side-wall spacer 46 is formed. The diameter of the opening 44c, which is reduced by the first side-wall spacer 45, is further reduced by the second side-wall spacer 46. As a result, an opening 44d having a diameter of 0.1 μm is formed.

Figure 9E:
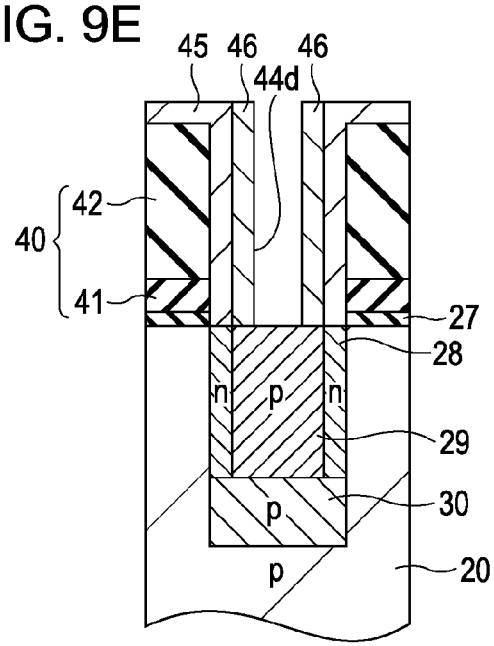
FIGS. 9E to 9J are diagrams illustrating manufacturing steps of the solid-state imaging device according to the first embodiment of the present invention.

Then, as shown in FIG. 9E, the silicon oxide film which forms the first side-wall spacer 45 at the bottom of the opening 44d having a diameter reduced by the second side-wall spacer 46 is removed by dry etching through the opening 44d, so that the surface of the substrate 20 appears.

Figure 9F:
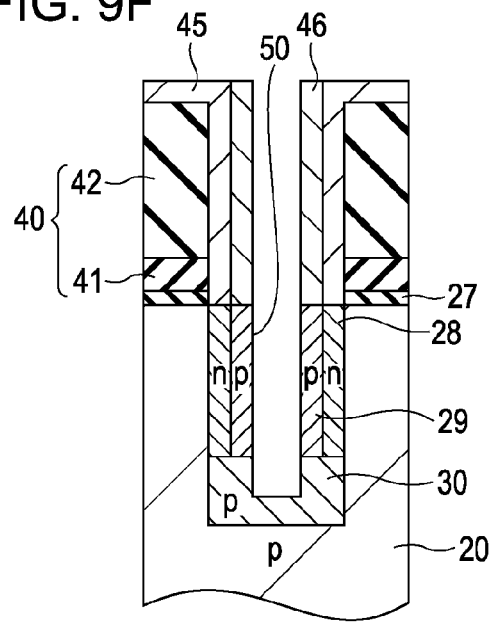

Then, as shown in FIG. 9F, the substrate 20 is etched to a depth of about 1 μm using the mask layer 40, in which the opening 44d having a diameter reduced by the first side-wall spacer 45 and the second side-wall spacer 46 is formed, as a mask. Thus, the trench 50 used for forming the readout gate electrode 26 is obtained.

Figure 9G:
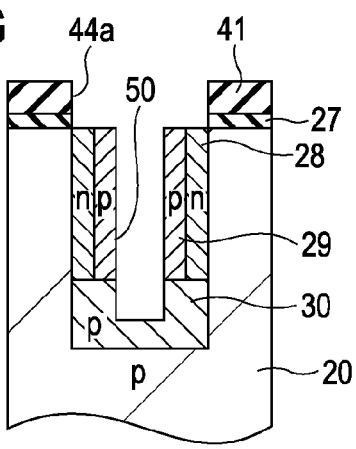

Then, as shown in FIG. 9G, as a pretreatment before thermal oxidation for eliminating the damage, the silicon oxide films forming the mask layer 40, the first side-wall spacer 45, and the second side-wall spacer 46 are removed by fluorinated acid.

Figure 9H:
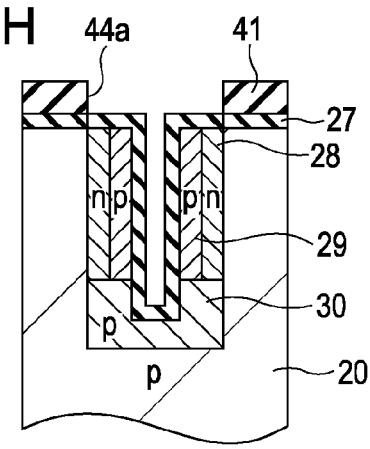

Then, as shown in FIG. 9H, the gate insulating film 27 formed of a silicon oxide film is formed on the surface of the trench 50. The gate insulating film 27 formed in this step corresponds to the readout gate electrode 26.

Figure 9I:
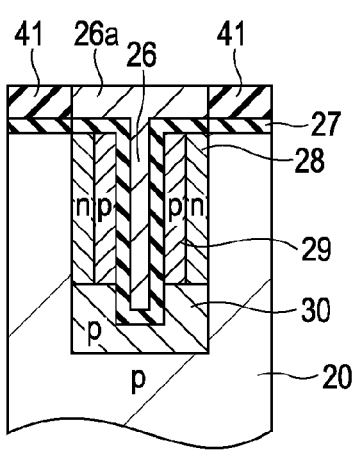

Then, as shown in FIG. 9I, the trench 50 in which the gate insulating film 27 is formed and the opening 44b formed in the silicon nitride film 41 are filled with phosphorus-doped gate electrode material. Then, the gate electrode material on the silicon nitride film 41 is removed by chemical mechanical polishing (CMP).

Figure 9J:
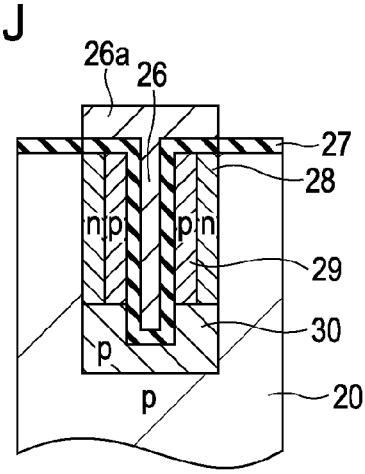

Then, as shown in FIG. 9J, the silicon nitride film 41 is removed by hot phosphoric acid. As a result, the readout gate electrode 26 having a desired shape is obtained. The thus-formed readout gate electrode 26 according to the present embodiment includes a vertical gate electrode formed in the trench 50 and the planar electrode portion 26a formed in the opening 44b in the silicon nitride film 41. The planar electrode portion 26a provides connection to the wiring.

Although not shown in the figures, desired gate electrodes, such as the reset gate electrode 31 and the amplifier gate electrode 33, are also formed when the readout gate electrode 26 is formed.

The readout gate electrode 26 is formed by the above-described steps. Then, the step of, for example, forming the p+ type semiconductor area 21 positioned closest to the surface of the substrate 20 in the photodiodes PD is performed.

According to the method for manufacturing the solid-state imaging device 1 of the present embodiment, in the process of forming the readout gate electrode 26, an exposure mask is used only in the exposure-and-development step for forming a pattern in the photoresist layer 43. Then, the diameter of the opening 44b, which is formed by etching the mask layer 40 using the photoresist layer 43, is reduced by forming the first side-wall spacer 45 and the second side-wall spacer 46. Thus, the openings 44c and 44d having the reduced diameters are formed, and are used to form the dark-current suppressing area 29, the reading channel area 28, and the trench 50. Thus, in the present embodiment, only one exposure mask is used in the process of forming the readout gate electrode 26, and the dark-current suppressing area 29, the reading channel area 28, the trench 50, etc., are self-aligned when they are formed. Therefore, an influence of misalignment of masks can be eliminated.

The dark-current suppressing area 29 serves to prevent unnecessary charges from entering the photodiodes PD and generating dark currents in the process of accumulating charges in the photodiodes PD. Therefore, the dark-current suppressing area 29 on the side surface of the readout gate electrode 26 preferably has a uniform thickness and uniform concentration. If the thickness of the dark-current suppressing area 29 is too large, it is difficult to perform effective gate bias control and so-called incomplete transfer may occur. If the thickness of the dark-current suppressing area 29 is too small, the dark currents may be generated. The thickness of the dark-current suppressing area 29 is preferably controlled at ±20 to ±30 nm. Therefore, in the case where the thickness of the dark-current suppressing area 29 is determined by ion implantation through a thick resist layer, with which it is difficult to achieve high accuracy, as in the related art, there is a possibility that serious problems regarding variations in characteristics will occur. In addition, the thickness of the reading channel area 28 is also desired to be uniform to prevent incomplete transfer of the signal charges.

In the present embodiment, since the dark-current suppressing area 29 is self-aligned, the influence of misalignment of masks can be eliminated and the thickness of the dark-current suppressing area 29 can be made uniform. As a result, the dark currents can be suppressed and incomplete transfer of the signal charges can be prevented.

In addition, in the present embodiment, the reading channel area 28 is also self-aligned, so that the influence of misalignment of masks can be eliminated and the thickness of the reading channel area 28 can be made uniform. As a result, incomplete transfer of the signal charges can be prevented.

In addition, in the present embodiment, the dark-current suppressing area 30 to be disposed at the bottom of the readout gate electrode 26 is formed while the photoresist layer 43 is provided. Therefore, the impurity for forming the dark-current suppressing area 30 can be implanted into the substrate 20 by ion implantation in a deep area which covers the bottom portion of the readout gate electrode 26.

In addition, in the present embodiment, the mask layer 40 has a two-layer structure including the silicon nitride film 41 and the silicon dioxide film 42 which have a selection ratio with respect to fluorinated acid, and only the silicon dioxide film 42 is removed in the step shown in FIG. 9G. Thus, the trench 50 and the opening 44a having a diameter larger than that of the trench 50 are self aligned, and the readout gate electrode 26 is formed by filling the trench 50 and the opening 44a with the electrode material. Therefore, the planar electrode portion 26a which provides connection with the wiring can be formed with high accuracy at the top of the vertical gate electrode formed in a columnar shape.

In the present embodiment, the readout gate electrode 26, the dark-current suppressing area 29, and the reading channel area 28 are self-aligned. Therefore, variations in characteristics caused by misalignment can be prevented and it is not necessary to provide alignment margins. Therefore, even when the pixel size is reduced, the readout gate electrode 26 can be formed with high accuracy.

Method for Driving Solid-State Imaging Device

A method for driving the solid-state imaging device 1 structured as described above will now be explained.

The light L is incident on the front surface of the solid-state imaging device 1 shown in FIG. 6, that is, on the on-chip lenses (not shown). The light L is collected by the on-chip lenses and is incident on the photodiodes PD through the color filter (not shown).

The light incident on the photodiodes PD is subjected to photoelectric conversion by the first photodiode PD1 and the second photodiode PD2 in each pixel 2, and thereby the signal charges are generated. The generated signal charges are accumulated in the potential well formed in the pn junction j1 included in the first photodiode PD1 or the pn junction j2 included in the second photodiode PD2.

In the solid-state imaging device 1 according to the present embodiment, the bottom portion and the side surface of the readout gate electrode 26 are disposed adjacent to the dark-current suppressing areas 29 and 30 with the gate insulating film 27 interposed therebetween. In the process of accumulating the signal charges, a negative voltage is applied to the readout gate electrode 26. Accordingly, trenches are pinned at the bottom portion and the side surface of the readout gate electrode 26 through the gate insulating film 27. Thus, the trench pinning state in which the trenches are pinned is obtained, and the dark current noise which enters the dark-current suppressing areas 29 and 30 from the readout gate electrode 26 can be enclosed in the dark-current suppressing areas 29 and 30 in the process of accumulating the signal charges. Thus, the dark current which reaches the first photodiode PD1 and the second photodiode PD2 can be reduced.

According to the present embodiment, in the process of accumulating the signal charges, if the signal charge accumulated in the first photodiode PD1 exceeds the saturation charge amount (Qs) and overflows, the excess signal charge is transferred to the second photodiode PD2 through the reading channel area. Similarly, if the signal charge accumulated in the second photodiode PD2 overflows, the excess signal charge is transferred to the first photodiode PD1. Thus, in the present embodiment, if the signal charge exceeds the saturation charge amount in one of the photodiodes, the excess signal charge overflows and is transferred to the other photodiode. As a result, the total saturation charge amount (Qs) of the photodiodes PD can be increased.

A positive voltage is applied to the readout gate electrode 26 after the accumulation of the signal charges. Accordingly, the potential of the channel area 28 is lowered. Therefore, the signal charges accumulated in the first photodiode PD1 and the second photodiode PD2 are transferred through the reading channel area 28 and are simultaneously read out to the floating diffusion area FD.

The driving method performed after this process is similar to that of a common solid-state imaging device. More specifically, the signal charges are transferred to the floating diffusion area FD, and a voltage is applied to the amplifier gate electrode 33 in the amplifier transistor Tr3 in accordance with a voltage change caused in the floating diffusion area FD. Thus, signal outputs corresponding to the signal charges are amplified and are output.

Then, when a positive voltage is applied to the reset gate electrode 31, the floating diffusion area FD and the source-drain area 32 are connected to each other. As a result, the floating diffusion area FD is reset to the same voltage as the power source voltage applied to the source-drain area 32.

In the solid-state imaging device 1 according to the present embodiment, the photodiodes PD, which include the first and second photodiodes PD1 and PD2, are arranged in the depth direction of the substrate 20. Therefore, the total saturation charge amount (Qs) of the photodiodes PD is increased. As a result, the sensitivity of the solid-state imaging device can be increased.

In addition, in the solid-state imaging device 1 according to the present embodiment, the charge-readout transistor Tr1 includes the vertical readout gate electrode 26 which extends in the depth direction of the photodiodes PD. Therefore, the signal charges accumulated in the first and second photodiodes PD1 and PD2, which are arranged in the depth direction of the substrate 20, can be completely transferred to the floating diffusion area FD.

In the solid-state imaging device according to the present embodiment, two photodiodes, which are the first photodiode PD1 and the second photodiode PD2, are provided. However, more than two photodiodes may also be arranged in the depth direction. Even if the pixel size is reduced, the saturation charge amount (Qs) can be increased by arranging a plurality of photodiodes in the depth direction. Thus, the pixel size can be reduced while increasing the saturation charge amount and the sensitivity. Therefore, the structure of the present embodiment is effective in reducing the pixel size. In addition, since the saturation charge amount can be increased, the dynamic range can be increased and the contrast can be improved.

In the solid-state imaging device 1 of the present embodiment, the first conductivity type is set to the p-type and the second conductivity type is set to the n-type. However, the first and second conductivity types may also be set to the n-type and the p-type, respectively. In such a case, in the above-described driving method, the sign of the voltage applied to each pixel transistor is reversed from positive to negative and from negative to positive.

In addition, according to the present embodiment, the solid-state imaging device 1 is described as a front-illuminated type solid-state imaging device. However, the solid-state imaging device 1 may also be a back-illuminated type solid-state imaging device. In the case where the solid-state imaging device 1 according to the present embodiment is structured as a back-illuminated type in which light is incident on a back surface of the substrate, multiple wiring layers are provided above the front surface of the semiconductor substrate, on which the image pickup area 3 and the peripheral circuit section are formed, with interlayer insulation films interposed therebetween. The back surface of the semiconductor substrate serves as a light incidence surface (light-receiving surface). An on-chip color filter is formed below the back surfaces of the pixels 2 in the image pickup area 3 with a planarizing layer interposed therebetween, and on-chip microlenses are formed on the on-chip color filter.

In the solid-state imaging device 1 according to the present embodiment, the reading channel area 28 is formed by doping the substrate with an n-type impurity by ion implantation. However, the reading channel area 28 may also be formed of an undoped area if the concentration is lower than that in the dark-current suppressing area 29 by about two digits.

Second Embodiment

Electronic Apparatus

An electronic apparatus including the above-described solid-state imaging device will now be described. In the following description, an example in which the solid-state imaging device 1 according to the first embodiment is used in a camera will be described.

Figure 10:
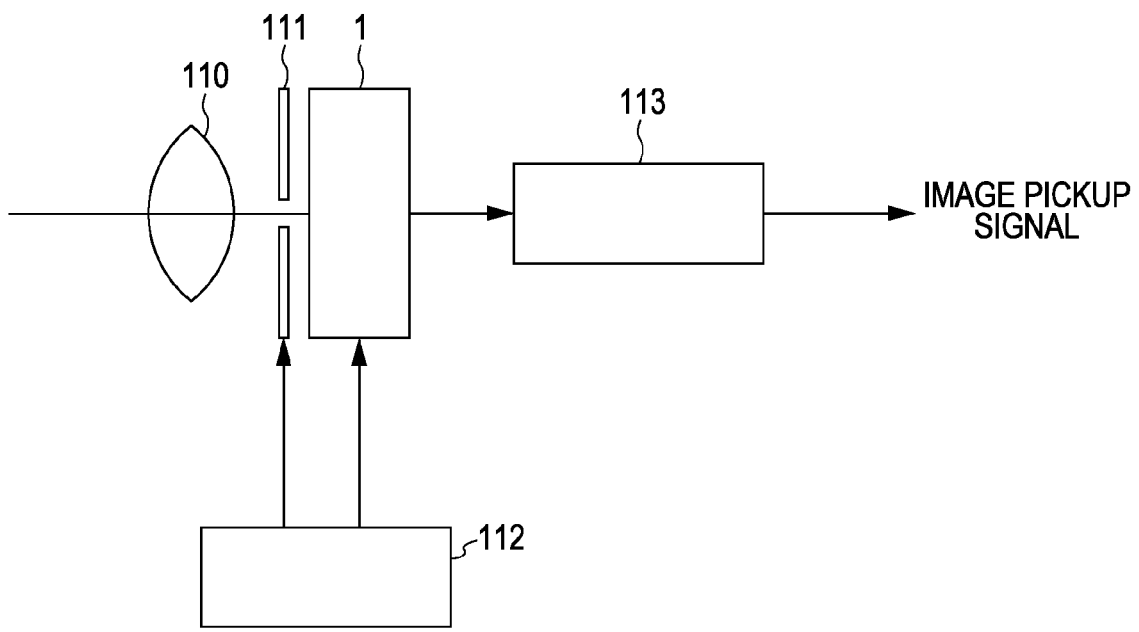
FIG. 10 is a schematic diagram illustrating the structure of an electronic apparatus according to the second embodiment of the present invention.

FIG. 10 is a schematic sectional view of a camera according to a second embodiment of the present invention. The camera according to the present embodiment is an example of a video camera capable of capturing a still image or a moving image.

The camera of the present embodiment includes the solid-state imaging device 1, an optical lens 110, a shutter device 111, a drive circuit 112, and a signal processing circuit 113.

The optical lens 110 focuses image light (incident light) from an object on an image pickup plane in the solid-state imaging device 1. Thus, signal charges are accumulated in the solid-state imaging device 1 for a certain period of time. The optical lens 110 may also be formed as an optical lens system including a plurality of optical lenses.

The shutter device 111 controls the light receiving time and the light blocking time for the solid-state imaging device 1.

The drive circuit 112 supplies drive signals for controlling the transfer operation of the solid-state imaging device 1 and the shutter operation of the shutter device 111. The solid-state imaging device 1 performs the signal transfer operation in response to the drive signal (timing signal) supplied from the drive circuit 112. The signal processing circuit 113 performs various signal processing operations. Image signals are obtained by the signal processing operations, and are either stored in a storage medium, such as a memory, or output to a monitor.

In the solid-state imaging device 1 included in the camera according to the present embodiment, a plurality of color signals can be obtained from a single pixel using the photodiodes arranged in the depth direction in the substrate. Therefore, the effective number of pixels can be increased. In addition, the saturation charge amount (Qs) and the sensitivity can also be increased. Therefore, according to the present embodiment, the size of the camera can be reduced and the image quality can be improved. Thus, the size of the electronic apparatus can be reduced, the resolution thereof can be increased, and the image quality can be improved.

The solid-state imaging devices according to the third to seventh embodiments have the structure of the solid-state imaging device 1 shown in FIG. 5. The sectional structure of the pixels 2 included in the effective image pickup area of the solid-state imaging device 1 will be described.

In the following description, reference numeral 120 denotes light-receiving units, 120a denotes first light-receiving units, 120b denotes second light-receiving units, 121, 121a, 121b, and 121c denote floating diffusion areas, 122 denotes third gate electrodes, 123 denotes second gate electrodes, 124 denotes first gate electrodes, 125 denotes pixel transistor areas, 142 denotes a magenta filter, 143 denotes a blue filter, 144 denotes a yellow filter, 145 denotes a green filter, 146 denotes a red filter, and 147 denotes a cyan filter.

Third Embodiment

Figure 11:
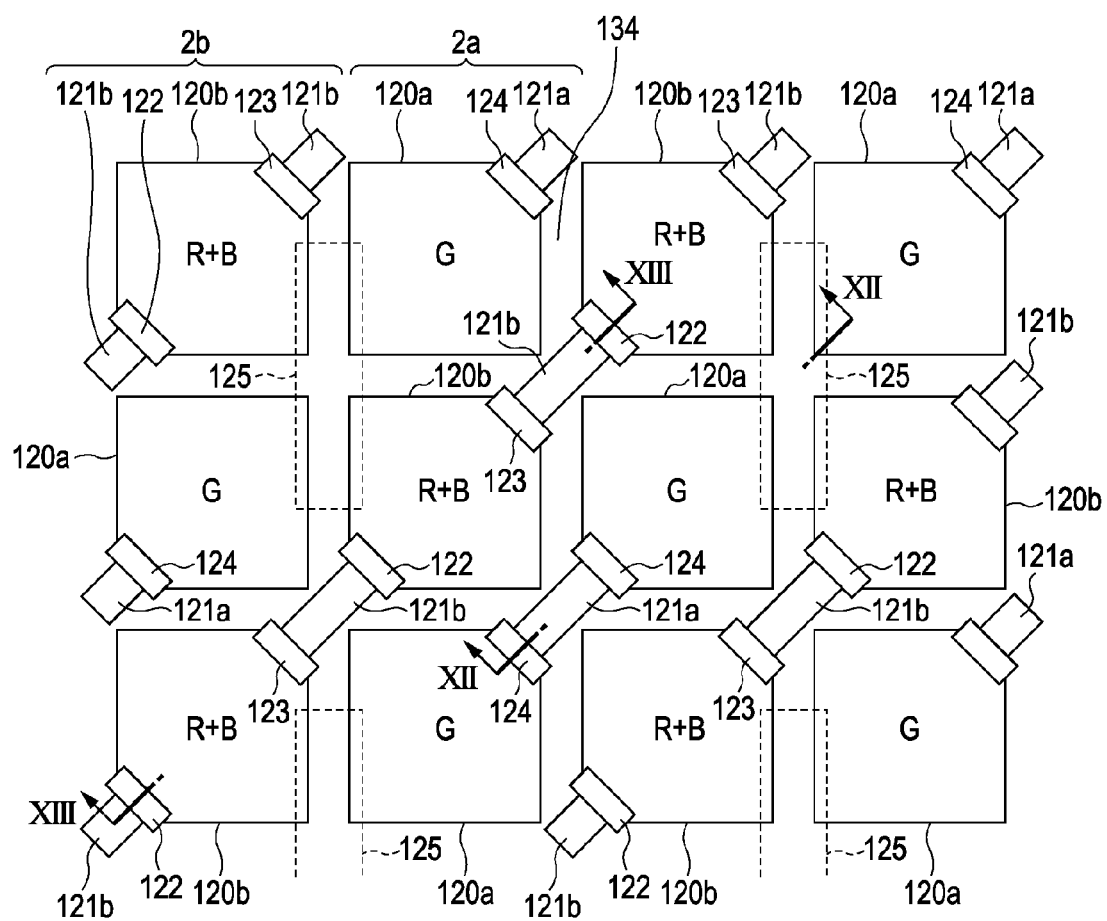
FIG. 11 is a planar layout view of the main part of the solid-state imaging device according to the third embodiment of the present invention.
Figure 12:
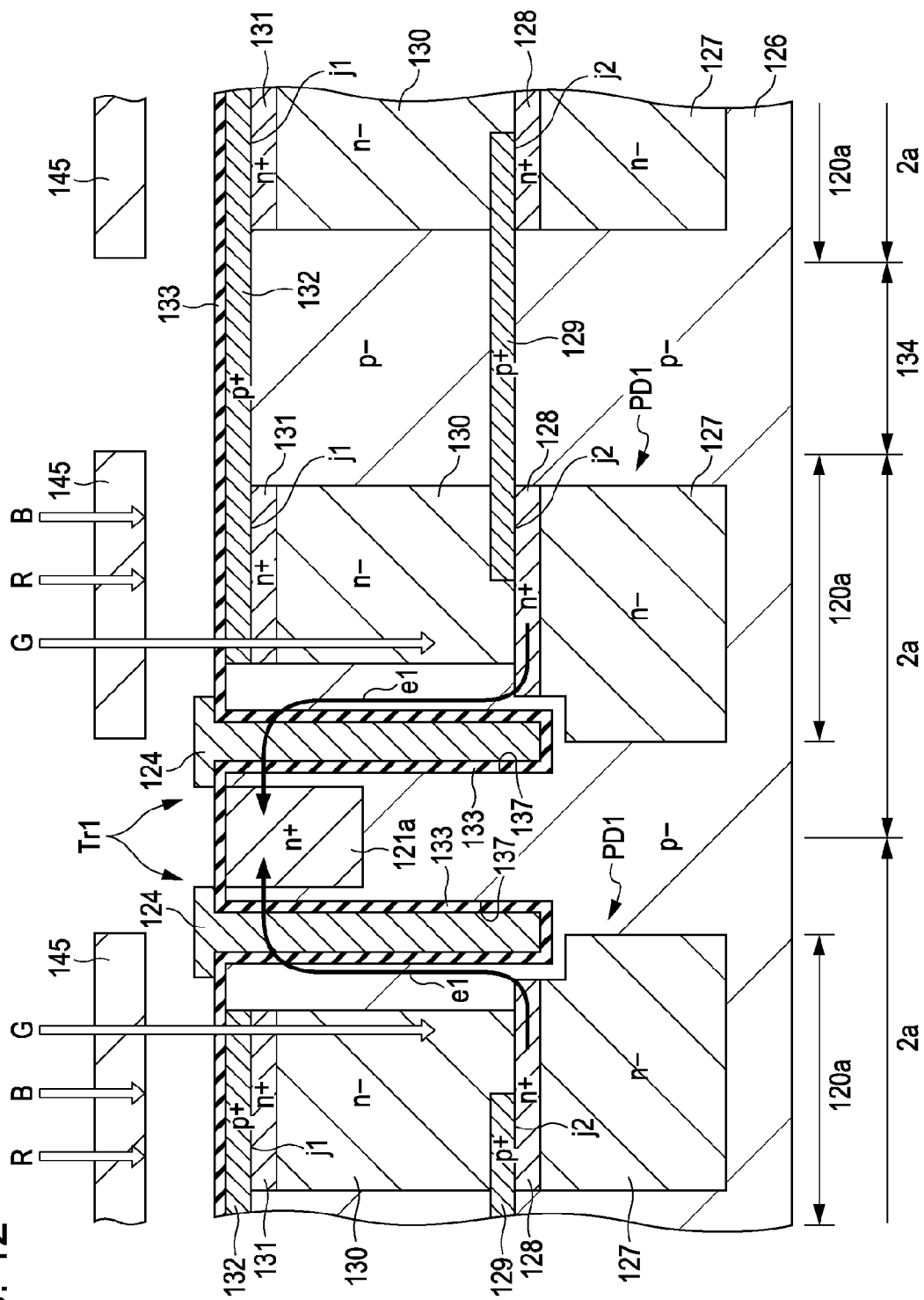
FIG. 12 is a sectional view of FIG. 11 taken along line XII-XII.
Figure 13:
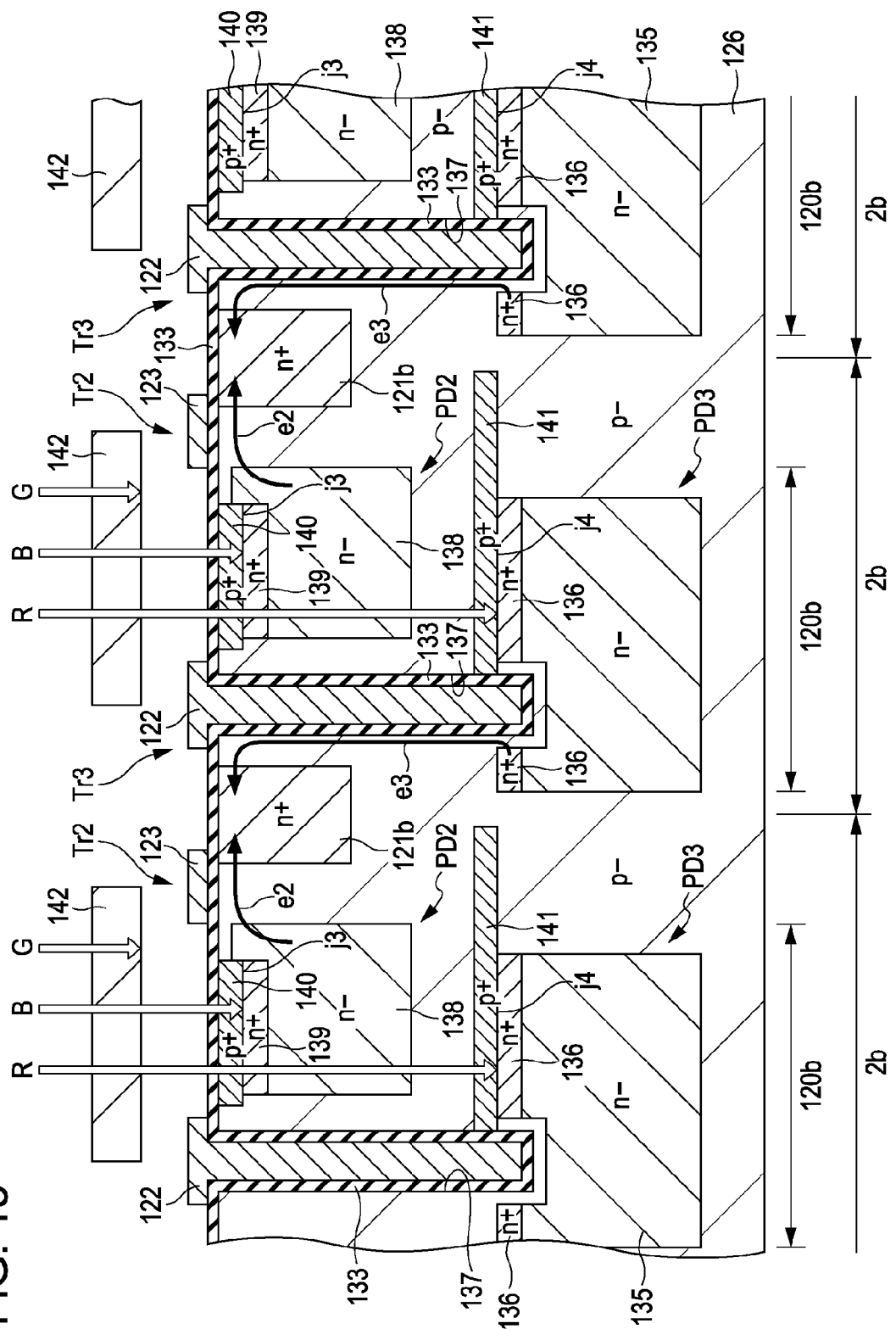
FIG. 13 is a sectional view of FIG. 11 taken along line XIII-XIII.

FIG. 11 is a schematic plan view of the main part of the solid-state imaging device according to the third embodiment of the present invention. FIG. 11 shows a planar layout of a plurality of pixels 2 (first pixels 2a and second pixels 2b in the present embodiment) in an image pickup area of the solid-state imaging device according to the present embodiment. FIG. 12 is a sectional view of FIG. 11 taken along line XII-XII, and FIG. 13 is a sectional view of FIG. 11 taken along line XIII-XIII. The solid-state imaging device according to the present embodiment is a front-illuminated type solid-state imaging device in which light is incident on a front surface of a substrate.

Description of Structure

The solid-state imaging device according to the present embodiment includes the first pixels 2a and the second pixels 2b. Each of the first pixels 2a is provided with a first light-receiving unit 120a, a first gate electrode 124, and a floating diffusion area 121a. Each of the second pixels 2b is provided with a second light-receiving unit 120b, second and third gate electrodes 123 and 122, and a floating diffusion area 121b.

As shown in FIG. 12, each first light-receiving unit 120a includes a first photodiode PD1 formed in a substrate 126. The first photodiode PD1 converts light in a first wavelength range into signal charges by photoelectric conversion.

As shown in FIG. 13, each second light-receiving unit 120b includes a second photodiode PD2 and a third photodiode PD3 arranged in the depth direction of the substrate 126. The second and third photodiodes PD2 and PD3 respectively convert light in a second wavelength range and light in a third wavelength range into signal charges by photoelectric conversion. The second and third wavelength ranges are in a complementary relationship with the first wavelength range.

In the present embodiment, the light in the first wavelength range is green light (G), the light in the second wavelength range is blue light (B), and the light in the third wavelength range is red light (R).

As shown in FIG. 11, the first light-receiving units 120a and the second light-receiving units 120b are arranged in the substrate 126 in a checkerboard pattern. More specifically, each first light-receiving unit 120a has the second light-receiving units 120b disposed adjacent thereto in the vertical and horizontal directions. Similarly, each second light-receiving unit 120b has the first light-receiving units 120a disposed adjacent thereto in the vertical and horizontal directions.

Each of the first to third photodiodes PD1 to PD3 includes a pn junction between a p+ type impurity area and an n+ type impurity area formed in the substrate 126 made of a first-conductivity-type semiconductor, which is a p-type (p− type in this embodiment) semiconductor. The structures of the first to third photodiodes PD1 to PD3 will now be described in detail.

First, the first pixels 2a will be described.

As shown in FIG. 12, the first photodiode PD1 included in each the first light-receiving unit 120a has a two-layer structure including two photodiodes formed of a p+ type impurity area 132, an n+ type impurity area 131, an n− type impurity area 130, a p+ type impurity area 129, an n+ type impurity area 128, and an n− type impurity area 127 in order of depth from the surface of the substrate 126. The photodiode in the upper layer is formed of a pn junction j1 between the p+ type impurity area 132 and the n+ type impurity area 131 at a position near the surface of the substrate 126. The photodiode in the lower layer is formed of a pn junction j2 between the p+ type impurity area 129 and the n+ type impurity area 128 at a position deep from the surface substrate 126. The pn junction j1 which forms the photodiode in the upper layer is disposed at a depth of about 0.1 μm to 0.2 μm from the surface of the substrate 126, and the pn junction j2 which forms the photodiode in the lower layer is disposed at a depth of about 0.5 μm to 0.8 μm from the surface of the substrate 126.

In the first photodiode PD1, the p+ type impurity areas 132 and 129 included in the photodiodes in the upper and lower layers, respectively, extend between two first light-receiving units 120a which are disposed adjacent to each other in an inclined direction. The n+ type impurity area 128 included in the photodiode in the lower layer and the n-type impurity area 130 included in the photodiode in the upper layer are electrically connected to each other at a side where the signal charges are read out, that is, at the side were the first gate electrode 124 is formed.

The first gate electrode 124 is formed in an outer peripheral section of the first light-receiving unit 120a at a side opposite to the side at which the p+ type impurity areas 132 and 129 extend. The first gate electrode 124 is a vertical gate electrode formed by filling a trench 137 which extends in the depth direction from the surface of the substrate 126 with an electrode material such that a gate insulating film 133 is interposed between the first gate electrode 124 and an inner surface of the trench 137. The trench 137 extends to a depth of about 0.7 µm to 1.0 µm from the surface of the substrate 126. A bottom portion of the first gate electrode 124 and a portion of the gate insulating film 133 at the bottom of the first gate electrode 124 are at positions deeper than the pn junction j2 which forms the photodiode in the lower layer of the first photodiode PD1.

The floating diffusion area 121a is formed of n n+ type impurity area in the surface of the substrate 126 at a position adjacent to the first gate electrode 124. The floating diffusion area 121a is used in common by two first pixels 2a which are disposed adjacent to each other at sides opposite to the sides at which the corresponding p+ type impurity areas 132 and 129 extend.

In each first pixel 2a, the first gate electrode 124 and the floating diffusion area 121a form a charge-readout transistor Tr1 for reading a signal charge e1 of the first photodiode PD1.

A green filter 145, which is a single color filter that transmits only the green light G, is arranged above the substrate 126 in an areas where the first light-receiving units 120a are formed. The green filter 145 is disposed above the substrate 126 at the light illumination side with a desired wiring layer (not shown) provided therebetween.

Next, the second pixels 2b will be described.

As shown in FIG. 13, each of the second light-receiving units 120b includes a second photodiode PD2 and a third photodiode PD3 arranged in the depth direction.

The second photodiode PD2 includes a p+ type impurity area 140, an n+ type impurity area 139, and an n– type impurity area 138 in order of depth from the surface of the substrate 126, and is mainly formed of a pn junction j3 between the p+ type impurity area 140 and the n+ type impurity area 139. The n– type impurity area 138 included in the second photodiode PD2 covers the p+ type impurity area 140 to an intermediate position thereof at a side adjacent to the second gate electrode 123.

The third photodiode PD3 includes a p+ type impurity area 141, an n+ type impurity area 136, and an n– type impurity area 135 disposed at positions deeper than the second photodiode PD2 in the substrate 126. The third photodiode PD3 is mainly formed of a pn junction j4 between the p+ type impurity area 141 and the n+ type impurity area 136.

Similar to the pn junction j1 in the first photodiode PD1, the pn junction j3 which forms the second photodiode PD2 is disposed at a depth of about 0.1 µm to 0.2 µm from the surface of the substrate 126. In addition, similar to the pn junction j2 in the first photodiode PD1, the pn junction j4 which forms the third photodiode PD3 is disposed at a depth of about 0.5 µm to 0.8 µm from the surface of the substrate 126.

The second gate electrode 123 is formed above a top surface of the substrate 126 at a position adjacent to the second photodiode PD2 in an outer peripheral section of the second light-receiving unit 120b. The second gate electrode 123 is a planar-type gate electrode formed above the surface of the substrate 126 with the gate insulating film 133 interposed therebetween.

The third gate electrode 122 is formed in an outer peripheral section of the second light-receiving unit 120b at a side opposite to the side at which the second gate electrode 123 is formed, and is disposed adjacent to the third photodiode PD3. The third gate electrode 122 is a vertical gate electrode formed by filling a trench 137 which extends in the depth direction from the surface of the substrate 126 with an electrode material such that the gate insulating film 133 is interposed between the third gate electrode 122 and an inner surface of the trench 137. The trench 137 extends to a depth of about 0.7 µm to 1.0 µm from the surface of the substrate 126. A bottom portion of the third gate electrode 122 and a portion of the gate insulating film 133 at the bottom of the third gate electrode 122 are at positions deeper than the pn junction j4 which forms the third photodiode PD3.

The bottom portion of the third gate electrode 122 and the portion of the gate insulating film 133 at the bottom of the third gate electrode 122 are covered by the n+ type impurity area 136 and the n– type impurity area 135, which form the third photodiode PD3, with a p-type impurity area which forms the substrate 126 interposed therebetween. In addition, the p+ type impurity area 141 included in the third photodiode PD3 is in contact with the third gate electrode 122 at a side of the third gate electrode 122 at which the second light-receiving unit 120b is provided, and no p+ type impurity area is formed at a side opposite to the side at which the second light-receiving unit 120b is provided. The p+ type impurity area 141 included in the third photodiode PD3 extends to a boundary of the second light-receiving unit 120b included in the adjacent second pixel 2b. The p+ type impurity area 141 included in the third photodiode PD3 functions as a photodiode separating area for electrically separating the second photodiode PD2 and the third photodiode PD3 from each other in the second light-receiving unit 120b.

The floating diffusion area 121b is formed of the n+ type impurity area in the surface of the substrate 126 at a position adjacent to the second gate electrode 123 and adjacent to the third gate electrode 122. The floating diffusion area 121b is used in common by all of the second pixels 2b which are arranged adjacent to each other in an inclined direction. In each second pixel 2b, the floating diffusion area 121b disposed adjacent to the second gate electrode 123 is adjacent to the third gate electrode 122 in the adjacent second pixel 2b. Similarly, the floating diffusion area 121b disposed adjacent to the third gate electrode 122 is adjacent to the second gate electrode 123 in the adjacent second pixel 2b.

In each second pixel 2b, the second gate electrode 123 and the floating diffusion area 121b disposed adjacent to the second gate electrode 123 form a charge-readout transistor Tr2 for reading a signal charge e2 of the second photodiode PD2. In addition, the third gate electrode 122 and the floating diffusion area 121b form a charge-readout transistor Tr3 for reading a signal charge e3 of the third photodiode PD3.

A magenta filter 142, which is a complementary color filter that transmits the red light R and the blue light B, is arranged above the substrate 126 in areas where the second light-receiving units 120b are formed. The magenta filter 142 is disposed above the substrate 126 at the light illumination side with a desired wiring layer (not shown) provided therebetween. Red and blue are complementary colors of green.

Desired pixel transistor areas 125 including amplifier transistors, reset transistors, selection transistors, etc., which form the first pixels 2a and the second pixels 2b, are provided at desired positions between the first light-receiving units 120a and the second light-receiving units 120b.

Description of Operation

The operation of the solid-state imaging device having the above-described structure will now be described. In the following description, the operations of a single first pixel 2a and a single second pixel 2b will be explained.

First, light is incident on the first light-receiving unit 120a and the second light-receiving unit 120b at the front side of the substrate 126.

Since the green filter 145 transmits only the green light G, the first light-receiving unit 120a receives the green light G as the light in the first wavelength range. The green light G incident on the first light-receiving unit 120a is converted into a signal charge by photoelectric conversion performed by the first photodiode PD1. The green light G is subjected to the photoelectric conversion by the photodiode in the upper layer and the photodiode in the lower layer. Therefore, the saturation charge amount (Qs) of the first photodiode PD1 can be increased. The signal charge e1 generated by the photoelectric conversion performed by the first photodiode PD1 is accumulated in potential wells formed by the pn junctions j1 and j2.

Since the magenta filter 142 transmits only the blue light and the red light, the second light-receiving unit 120b receives the blue light B and the red light R as the light in the second wavelength range and the light in the third wavelength range, respectively. In the light incident on the second light-receiving unit 120b, the blue light B has a shorter wavelength than that of the red light R. Therefore, almost all of the blue light B is subjected to photoelectric conversion performed by the second photodiode PD2 positioned near the surface of the substrate 126. The signal charge e2 generated by the photoelectric conversion performed by the second photodiode PD2 is accumulated in a potential well formed by the pn junction j3. In the light incident on the second light-receiving unit 120b, the red light R has a longer wavelength than that of the blue light B. Therefore, a part of the red light R which has not been subjected to the photoelectric conversion performed by the second photodiode PD2 reaches the third photodiode PD3 disposed at a position deep from the surface of the substrate 126 and is subjected to photoelectric conversion performed by the third photodiode PD3. The signal charge e3 generated by the photoelectric conversion performed by the third photodiode PD3 is accumulated in a potential well formed by the pn junction j4.

Then, the accumulated signal charges e1 to e3 are read out to the floating diffusion areas 121a and 121b.

First, the first pixel 2a will be described. In the first pixel 2a, when the first gate electrode 124 is turned on, the potential around the vertical first gate electrode 124 changes. Accordingly, the signal charge e1 accumulated in the first photodiode PD1 is read out to the floating diffusion area 121a disposed adjacent to the first gate electrode 124.

When the signal charge e1 is read out to the floating diffusion area 121a, the voltage of the floating diffusion area 121a changes. The change in the voltage is amplified by the amplifier transistor (not shown), and is output as a signal output S1 from the first photodiode PD1. The signal output S1 corresponds to a signal output Gs obtained by the green light G.

Next, the second pixel 2b will be described. In the second pixel 2b, when the second gate electrode 123 is turned on, the potential in the substrate 126 in an area below the planar second gate electrode 123 changes. Accordingly, the signal charge e2 accumulated in the second photodiode PD2 is read out to the floating diffusion area 121b disposed adjacent to the second gate electrode 123. In addition, when the third gate electrode 122 is turned on, the potential around the vertical third gate electrode 122 changes. Accordingly, the signal charge e3 accumulated in the third photodiode PD3 is read out to the floating diffusion area 121b disposed adjacent to the third gate electrode 122.

The bottom portion of the third gate electrode 122 and the portion of the gate insulating film 133 at the bottom of the third gate electrode 122 are covered by the n+ type impurity area 136 and the n− type impurity area 135, which form the third photodiode PD3, with a p-type impurity area which forms the substrate 126 interposed therebetween. In addition, the p+ type impurity area 141 included in the third photodiode PD3 is in contact with the third gate electrode 122 at a side of the third gate electrode 122 at which the second light-receiving unit 120b is provided, and no p+ type impurity area is formed at a side opposite to the side at which the second light-receiving unit 120b is provided. Therefore, when the third gate electrode 122 is turned on, the signal charge e3 accumulated in the third photodiode PD3 is read out to the floating diffusion area 121b along a surface of the third gate electrode 122 at a side opposite to the side at which the p+ type impurity area 141 is formed. Thus, the path along which the signal charge e3 accumulated in the third photodiode PD3 is read out is formed along the surface of the third gate electrode 122 at a side opposite to the side at which the second light-receiving unit 120b is provided.

The p+ type impurity area 141 included in the third photodiode PD3 extends to a boundary of the second light-receiving unit 120b included in the adjacent second pixel 2b. The p+ type impurity area 141 functions as a photodiode separating area for separating the second photodiode PD2 and the third photodiode PD3 from each other. Therefore, the signal charge e3 accumulated in the third photodiode PD3 can be prevented from being read out to the floating diffusion area 121b disposed adjacent to the second gate electrode 123.

The signal charges e2 and e3 are respectively read out to the floating diffusion area 121b adjacent to the second photodiode PD2 and the floating diffusion area 121b adjacent to the third photodiode PD3. Accordingly, the voltage of each of the floating diffusion areas 121b changes. The change in the voltage of the floating diffusion area 121b adjacent to the second photodiode PD2 is amplified by the amplifier transistor (not shown) connected to the floating diffusion area 121b, and is output as a signal output S2. The change in the voltage of the floating diffusion area 121b adjacent to the third photodiode PD3 is amplified by the amplifier transistor (not shown) connected to the floating diffusion area 121b, and is output as a signal output S3.

The blue light B and the red light R are incident on the second light-receiving unit 120b. Therefore, a blue signal output Bs and a red signal output Rs can be determined by calculation based on the signal outputs S2 and S3. In the present embodiment, wavelength ranges of the blue light B and the red light R which are absorbed by the second light-receiving unit 120b do not largely overlap each other. Therefore, there is a large difference in the absorption coefficient in the substrate 126 between the blue light B and the red light R. Therefore, when the depth of the pn junction j4 in the third photodiode PD3 is set such that the blue light B can hardly reach, the signal charge e3 accumulated in the third photodiode PD3 is obtained by the photoelectric conversion of only the red light R. When the depth of the pn junction j4 in the third photodiode PD3 is set to about 0.5 μm to 0.8 μm, the blue light B hardly reaches the third photodiode PD3. Therefore, the relationships between the signal outputs S1 and S2 and the signal outputs Bs and Rs can be obtained as follows:

$S2=Bs+Rs/2$ $S3=2Rs/3$

The signal outputs Bs and Rs can be obtained from the above equations as follows:

$Bs=S2-S3/2$ $Rs=3/2 \times S3$

Thus, in the present embodiment, each second pixel 2b detect the blue light B and the red light R, whose wavelength ranges do not largely overlap each other. Therefore, the third photodiode PD3 performs photoelectric conversion of only the red light R, and the mixture of colors can be effectively prevented.

According to the present embodiment, in the first light-receiving unit 120a included in each first pixel 2a, two photodiodes are arranged in the depth direction of the substrate 126. Therefore, the saturation charge amount (Qs) of the first light-receiving unit 120a can be doubled. Since the saturation charge amount (Qs) can be increased, the sensitivity can also be increased.

In addition, in the second light-receiving unit 120b included in each second pixels 2b, two photodiodes are arranged in the depth direction of the substrate 126 and are separated from each other in the vertical direction. Therefore, the signal charge can be obtained from each of the blue light B and the red light R. As a result, the signal outputs Bs and Rs can be obtained from the blue light B and the red light R, respectively, in a single pixel. Therefore, the number of pixels for blue and red can be doubled and the saturation charge amount (Qs) and the sensitivity can be increased. The signal charge e3 accumulated in the third photodiode PD3, which is disposed at the deepest position, is transferred to the floating diffusion area 121b by the vertical third gate electrode 122. Therefore, sufficient potential change in the depth direction can be obtained in the substrate 126, and the signal charge e3 accumulated in the third photodiode PD3 can be reliably transferred.

In addition, in each second pixel 2b, the signal charge accumulated in the second photodiode PD2 at an upper position is read out by the planar second gate electrode 123, and the signal charge accumulated in the third photodiode PD3 at a lower position is read out by the third gate electrode 122 which extends in the vertical direction. The path along which the signal charge e3 accumulated in the third photodiode PD3 is read out is formed on the third gate electrode 122 at a side opposite to the side at which the second light-receiving unit 120b is provided. In addition, the p+ type impurity area 141, which functions as a photodiode separating area, extends to a position below the floating diffusion area 121b to which the signal charge e2 accumulated in the second photodiode PD2 is read out. Accordingly, the signal charge e2 accumulated in the second photodiode PD2 and the signal charge e3 accumulated in the third photodiode PD3 are red out to the respective floating diffusion areas 121b without being mixed with each other.

In the present embodiment, the floating diffusion areas 121a and 121b are used in common by the pixels which are disposed adjacent to each other. Therefore, the pixel size can be reduced.

In addition, in the solid-state imaging device according to the present embodiment, the photodiodes and gate electrodes included in the first and second pixels 2a and 2b can be formed by common process steps. Therefore, the number of manufacturing steps is not increased.

Fourth Embodiment

Figure 14:
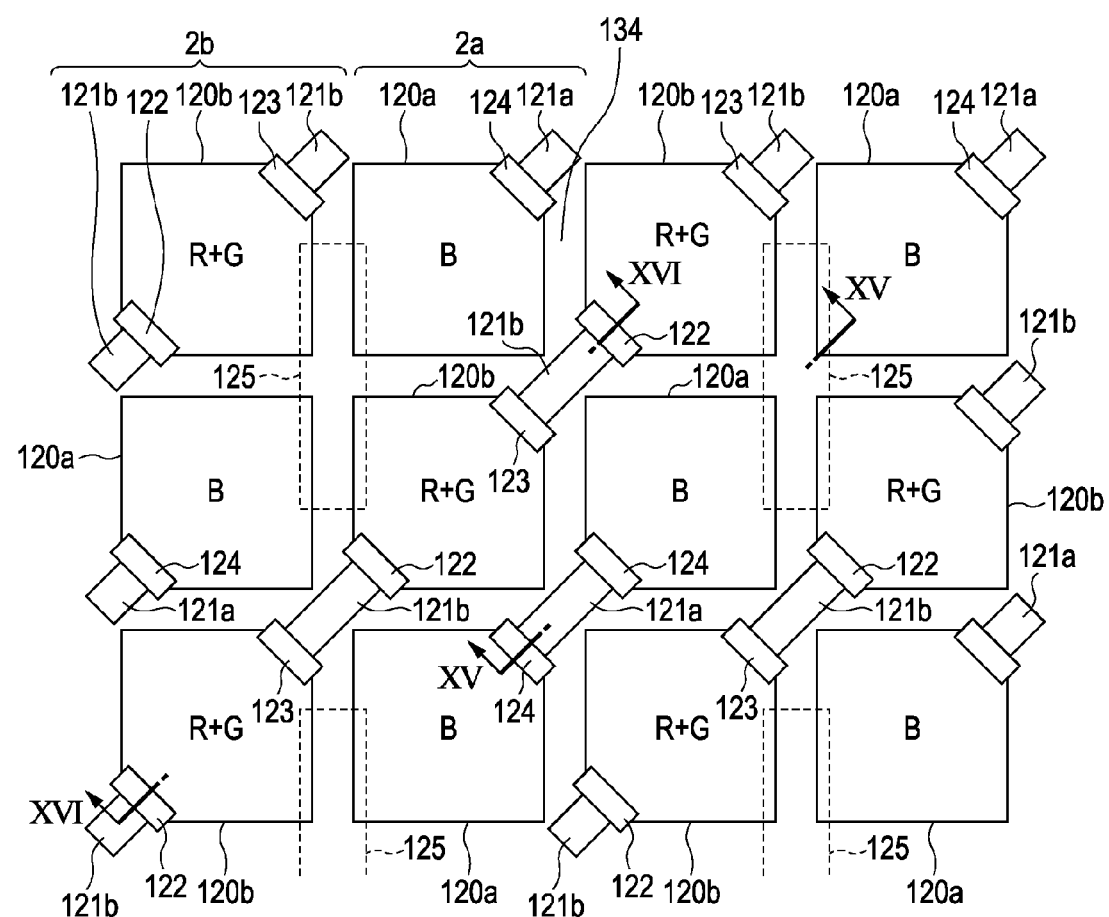
FIG. 14 is a planar layout view of the main part of the solid-state imaging device according to the fourth embodiment of the present invention.
Figure 15:
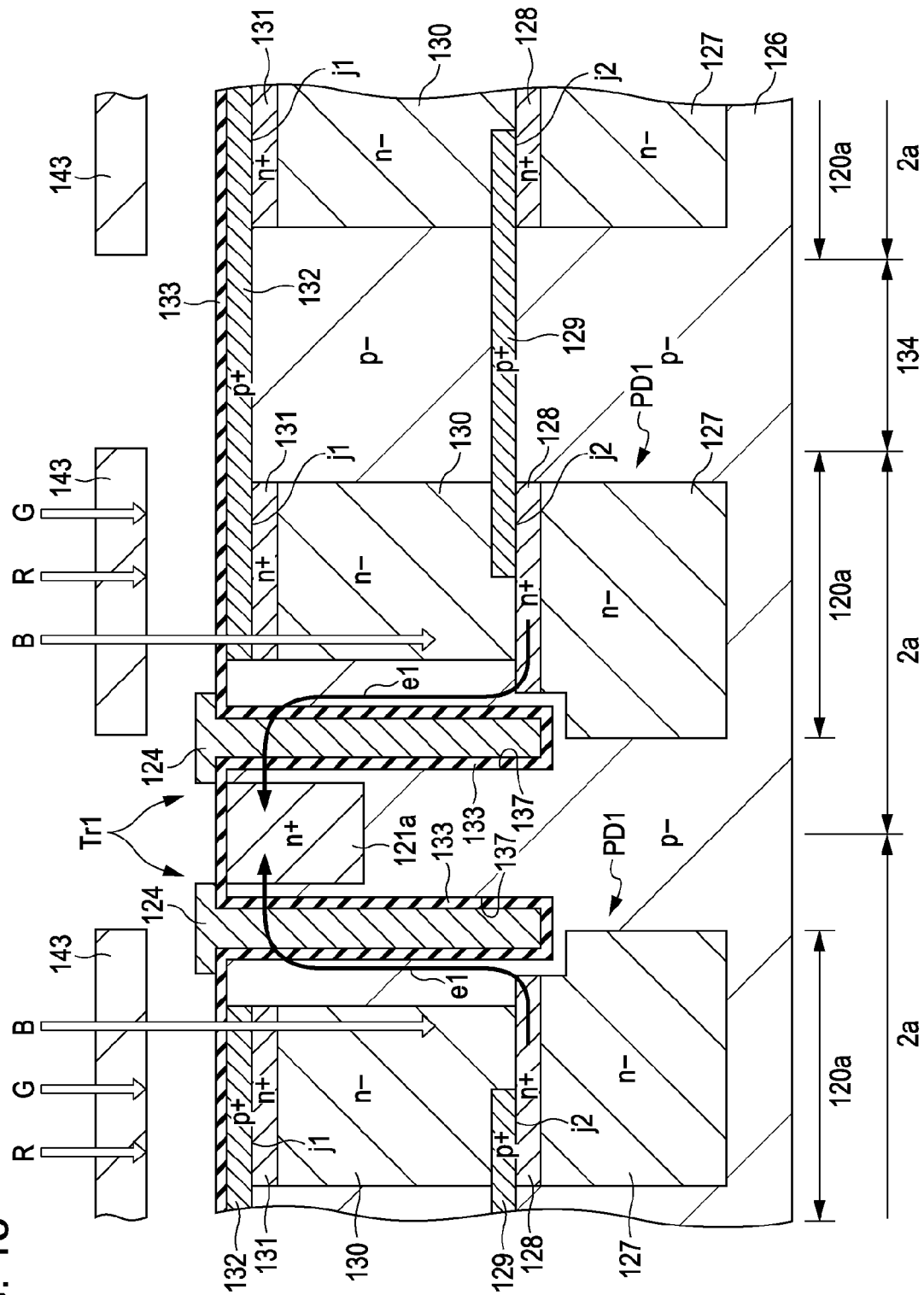
FIG. 15 is a sectional view of FIG. 14 taken along line XV-XV.
Figure 16:
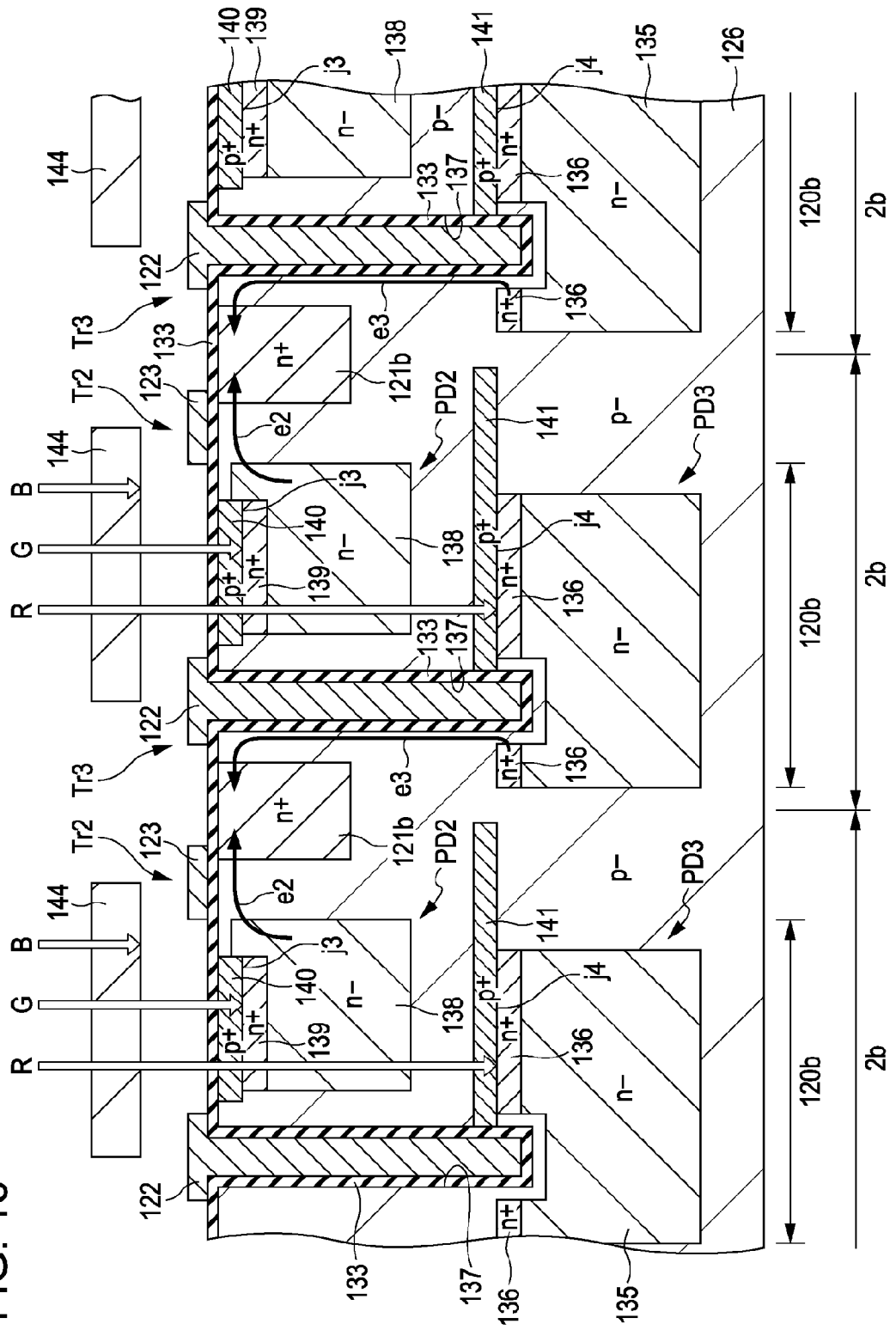
FIG. 16 is a sectional view of FIG. 14 taken along line XVI-XVI.

FIG. 14 is a schematic plan view of the main part of a solid-state imaging device according to a fourth embodiment of the present invention. FIG. 14 shows a planar layout of a plurality of pixels 2 in an image pickup area of the solid-state imaging device according to the present embodiment. FIG. 15 is a sectional view of FIG. 14 taken along line XV-XV, and FIG. 16 is a sectional view of FIG. 14 taken along line XVI-XVI. In FIGS. 14 to 16, components similar to those in FIGS. 11 to 13 are denoted by the same reference numerals, and redundant explanations thereof are thus omitted.

Description of Structure

In the present embodiment, the light in the first wavelength range is blue light (B), the light in the second wavelength range is green light (G), and the light in the third wavelength range is red light (R). As shown in FIG. 14, the first light-receiving units 120a which perform photoelectric conversion of the blue light B and the second light-receiving units 120b which perform photoelectric conversion of the green light G and the red light R are arranged in a checkerboard pattern.

Therefore, in the present embodiment, as shown in FIG. 15, a blue filter 143 is used as a single-color filter disposed above the substrate 126 in areas where the first light-receiving units 120a are formed. In addition, as shown in FIG. 16, a yellow filter 144 is used as a complementary color filter disposed above the substrate 126 in areas where the second light-receiving units 120b are formed. Yellow is the complementary color of blue.

The inner structure of the substrate 126 is similar to that in the third embodiment.

Description of Operation

The operation of the solid-state imaging device having the above-described structure will now be described. In the following description, the operations of a single first pixel 2a and a single second pixel 2b will be explained.

First, light is incident on the first light-receiving unit 120a and the second light-receiving unit 120b at the front side of the substrate 126.

Since the blue filter 143 transmits only the blue light B, the first light-receiving unit 120a receives the blue light B as the light in the first wavelength range. The blue light B incident on the first light-receiving unit 120a is subjected to photoelectric conversion performed by the first photodiode PD1. The blue light B is subjected to the photoelectric conversion by the photodiode in the upper layer and the photodiode in the lower layer. Therefore, the saturation charge amount (Qs) of the first photodiode PD1 can be increased. The signal charge e1 generated by the photoelectric conversion performed by the first photodiode PD1 is accumulated in potential wells formed by the pn junctions j1 and j2.

Since the yellow filter 144 transmits only the green light G and the red light R, the second light-receiving unit 120b receives the green light G and the red light R as the light in the second wavelength range and the light in the third wavelength range, respectively. In the light incident on the second light-receiving unit 120b, the green light G has a shorter wavelength than that of the red light R. Therefore, almost all of the green light G is subjected to photoelectric conversion performed by the second photodiode PD2 positioned near the surface of the substrate 126. The signal charge e2 generated by the photoelectric conversion performed by the second photodiode PD2 is accumulated in a potential well formed by the pn junction j3. In the light incident on the second light-receiving unit 120b, the red light R has a longer wavelength than that of the green light G. Therefore, a part of the red light R which has not been absorbed by the second photodiode PD2 reaches the third photodiode PD3 disposed at a position deep from the surface of the substrate 126 and is subjected to photoelectric conversion performed by the third photodiode PD3. In addition, a part of the green light G which has not been absorbed by the second photodiode PD2 reaches the third photodiode PD3 and is subjected to photoelectric conversion performed by the third photodiode PD3. The signal charge e3 generated by the photoelectric conversion performed by the third photodiode PD3 is accumulated in a potential well formed by the pn junction j4.

Then, the accumulated signal charges e1 to e3 are read out to the floating diffusion areas 121a and 121b.

First, the first pixel 2a will be described. In the first pixel 2a, when the first gate electrode 124 is turned on, the potential around the vertical first gate electrode 124 changes. Accordingly, the signal charge e1 accumulated in the first photodiode PD1 is read out to the floating diffusion area 121a disposed adjacent to the first gate electrode 124.

When the signal charge e1 is read out to the floating diffusion area 121a, the voltage of the floating diffusion area 121a changes. The change in the voltage is amplified by the amplifier transistor (not shown), and is output as a signal output S1 from the first photodiode PD1. The signal output S1 is obtained by the blue light B.

Next, the second pixel 2b will be described. In the second pixel 2b, when the second gate electrode 123 is turned on, the potential in the substrate 126 in an area below the planar second gate electrode 123 changes. Accordingly, the signal charge e2 accumulated in the second photodiode PD2 is read out to the floating diffusion area 121b disposed adjacent to the second gate electrode 123. In addition, when the third gate electrode 122 is turned on, the potential around the vertical third gate electrode 122 changes. Accordingly, the signal charge e3 accumulated in the third photodiode PD3 is read out to the floating diffusion area 121b disposed adjacent to the third gate electrode 122.

The bottom portion of the third gate electrode 122 and the portion of the gate insulating film 133 at the bottom of the third gate electrode 122 are covered by the n+ type impurity area 136 and the n− type impurity area 135, which form the third photodiode PD3, with a p-type impurity area which forms the substrate 126 interposed therebetween. In addition, the p+ type impurity area 141 included in the third photodiode PD3 is in contact with the third gate electrode 122 at a side of the third gate electrode 122 at which the second light-receiving unit 120b is provided, and no p+ type impurity area is formed at a side opposite to the side at which the second light-receiving unit 120b is provided. Therefore, when the third gate electrode 122 is turned on, the signal charge e3 accumulated in the third photodiode PD3 is read out to the floating diffusion areas 121b along a surface of the third gate electrode 122 at a side opposite to the side at which the p+ type impurity area is formed.

The p+ type impurity area 141 included in the third photodiode PD3 extends to a boundary of the second light-receiving unit 120b included in the adjacent second pixel 2b. The p+ type impurity area 141 functions as a photodiode separating area for separating the second photodiode PD2 and the third photodiode PD3 from each other. Therefore, the signal charge e3 accumulated in the third photodiode PD3 can be prevented from being read out to the floating diffusion area 121b disposed adjacent to the second gate electrode 123.

The signal charges e2 and e3 are respectively read out to the floating diffusion area 121b adjacent to the second photodiode PD2 and the floating diffusion area 121b adjacent to the third photodiode PD3. Accordingly, the voltage of each of the floating diffusion areas 121b changes. The change in the voltage of the floating diffusion area 121b adjacent to the second photodiode PD2 is amplified by the amplifier transistor (not shown) connected to the floating diffusion area 121b, and is output as a signal output S2. The change in the voltage of the floating diffusion area 121b adjacent to the third photodiode PD3 is amplified by the amplifier transistor (not shown) connected to the floating diffusion area 121b, and is output as a signal output S3.

The green light G and the red light R are incident on the second light-receiving unit 120b. Therefore, a green signal output Gs and a red signal output Rs can be determined by calculation based on the signal outputs S2 and S3. The relationships between the signal outputs S1 and S2 and the signal outputs Bs and Rs can be obtained as follows:

$$S2 = \alpha \cdot Bs + \beta \cdot Rs$$

$$S3 = \gamma \cdot Bs + \delta \cdot Rs$$

In the above equations, $\alpha$, $\beta$, $\gamma$, and $\delta$ are constants determined from the optical absorption coefficients in accordance with the depth from the surface of the substrate 126 and the characteristics of the yellow filter 144. The signal outputs Bs and Rs can be obtained from the above equations.

Fifth Embodiment

Figure 17:
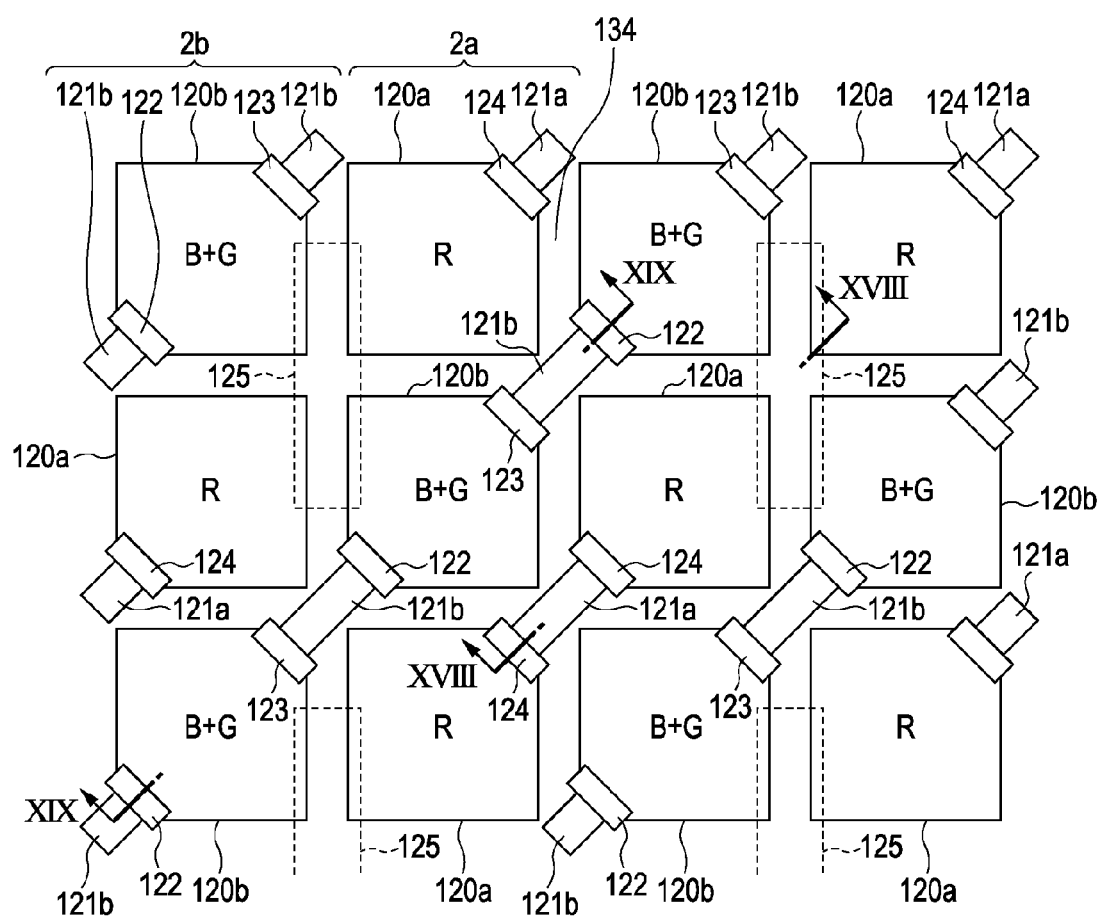
FIG. 17 is a planar layout view of the main part of the solid-state imaging device according to the fifth embodiment of the present invention.
Figure 18:
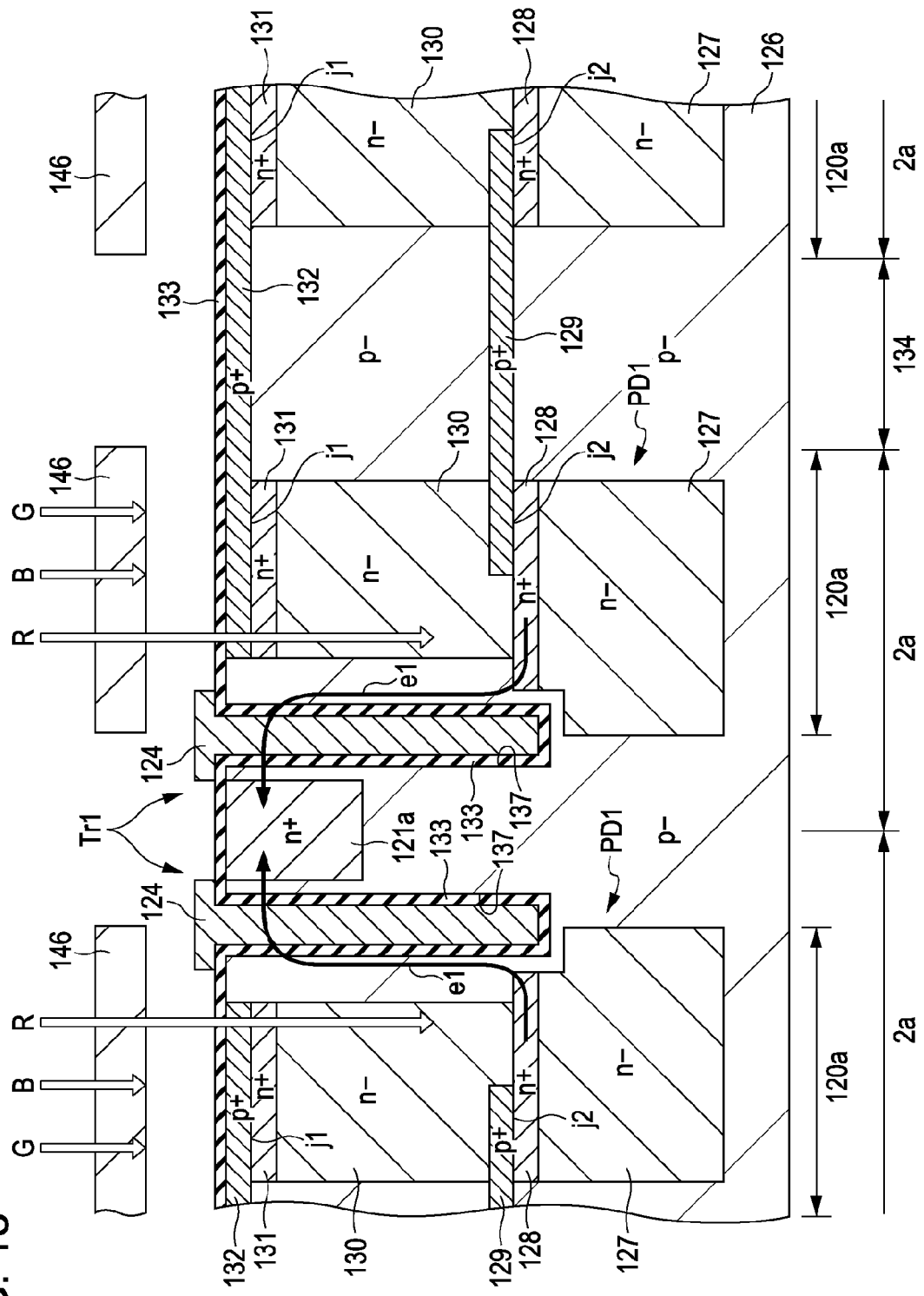
FIG. 18 is a sectional view of FIG. 17 taken along line XVIII-XVIII.
Figure 19:
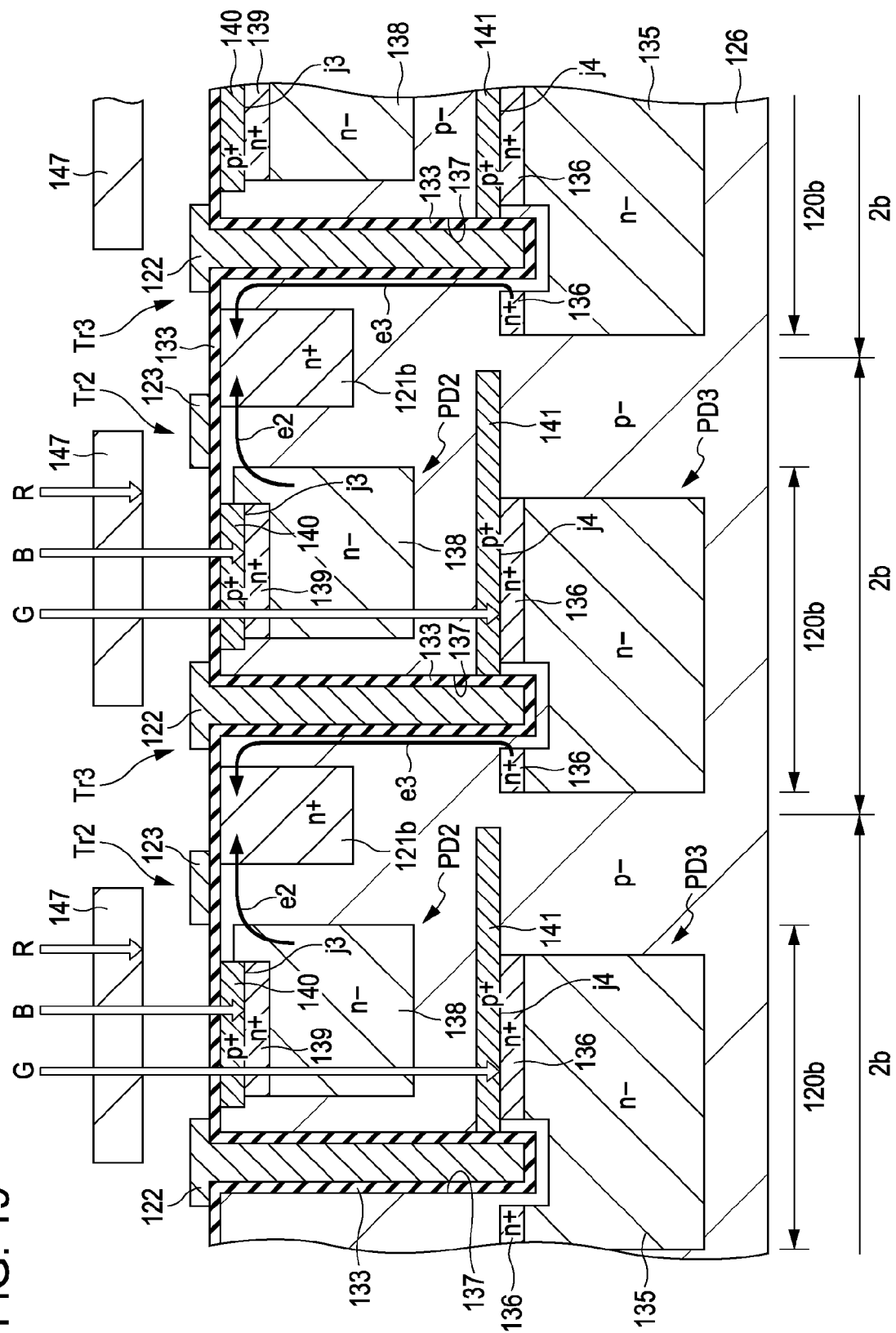
FIG. 19 is a sectional view of FIG. 17 taken along line XIX-XIX.

FIG. 17 is a schematic plan view of the main part of a solid-state imaging device according to a fifth embodiment of the present invention. FIG. 17 shows a planar layout of a plurality of pixels 2 in an image pickup area of the solid-state imaging device according to the present embodiment. FIG. 18 is a sectional view of FIG. 17 taken along line XVIII-XVIII, and FIG. 19 is a sectional view of FIG. 17 taken along line XIX-XIX. In FIGS. 17 to 19, components similar to those in FIGS. 11 to 13 are denoted by the same reference numerals, and redundant explanations thereof are thus omitted.

Description of Structure

In the present embodiment, the light in the first wavelength range is red light (R), the light in the second wavelength range is blue light (B), and the light in the third wavelength range is green light (G). As shown in FIG. 17, the first light-receiving units 120a which perform photoelectric conversion of the red light R and the second light-receiving units 120b which perform photoelectric conversion of the blue light B and the green light G are arranged in a checkerboard pattern.

In the present embodiment, as shown in FIG. 18, a red filter 146 is used as a single-color filter disposed above the substrate 126 in areas where the first light-receiving units 120a are formed. In addition, a cyan filter 147 is used as a complementary color filter disposed above the substrate 126 in areas where the second light-receiving units 120b are formed. Cyan is the complementary color of red.

Description of Operation

The operation of the solid-state imaging device having the above-described structure will now be described. In the following description, the operations of a single first pixel 2a and a single second pixel 2b will be explained.

First, light is incident on the first light-receiving unit 120a and the second light-receiving unit 120b at the front side of the substrate 126.

Since the red filter 146 transmits only the red light R, the first light-receiving unit 120a receives the red light R as the light in the first wavelength range. The red light R incident on the first light-receiving unit 120a is subjected to photoelectric conversion performed by the first photodiode PD1. The red light R is subjected to the photoelectric conversion by the photodiode in the upper layer and the photodiode in the lower layer. Therefore, the saturation charge amount (Qs) of the first photodiode PD1 can be increased. The signal charge e1 generated by the photoelectric conversion performed by the first photodiode PD1 is accumulated in potential wells formed by the pn junctions j1 and j2.

Since the cyan filter 147 transmits only the blue light B and the green light G, the second light-receiving unit 120b receives the blue light B and the green light G as light in the second wavelength range and light in the third wavelength range, respectively. In the light incident on the second light-receiving unit 120b, the blue light B has a shorter wavelength than that of the green light G. Therefore, almost all of the blue light B is subjected to photoelectric conversion performed by the second photodiode PD2 positioned near the surface of the substrate 126. The signal charge e2 generated by the photoelectric conversion performed by the second photodiode PD2 is accumulated in a potential well formed by the pn junction j3. In the light incident on the second light-receiving unit 120b, the green light G has a longer wavelength than that of the blue light B. Therefore, a part of the green light G which has not been absorbed by the second photodiode PD2 reaches the third photodiode PD3 disposed at a position deep from the surface of the substrate 126 and is subjected to photoelectric conversion performed by the third photodiode PD3. The signal charge e3 generated by the photoelectric conversion performed by the third photodiode PD3 is accumulated in a potential well formed by the pn junction j4.

Then, the accumulated signal charges are read out to the floating diffusion areas 121a and 121b.

First, the first pixel 2a will be described. In the first pixel 2a, when the first gate electrode 124 is turned on, the potential around the vertical first gate electrode 124 changes. Accordingly, the signal charge e1 accumulated in the first photodiode PD1 is read out to the floating diffusion area 121a disposed adjacent to the first gate electrode 124.

When the signal charge e1 is read out to the floating diffusion area 121a, the voltage of the floating diffusion area 121a changes. The change in the voltage is amplified by the amplifier transistor (not shown), and is output as a signal output S1 from the first photodiode PD1. The signal output S1 is obtained by the red light R.

Next, the second pixel 2b will be described. In the second pixel 2b, when the second gate electrode 123 is turned on, the potential in the substrate 126 in an area below the planar second gate electrode 123 changes. Accordingly, the signal charge e2 accumulated in the second photodiode PD2 is read out to the floating diffusion area 121b disposed adjacent to the second gate electrode 123. In addition, when the third gate electrode 122 is turned on, the potential around the vertical third gate electrode 122 changes. Accordingly, the signal charge e3 accumulated in the third photodiode PD3 is read out to the floating diffusion area 121b disposed adjacent to the third gate electrode 122.

The bottom portion of the third gate electrode 122 and the portion of the gate insulating film 133 at the bottom of the third gate electrode 122 are covered by the n+ type impurity area 136 and the n− type impurity area 135, which form the third photodiode PD3, with a p-type impurity area which forms the substrate 126 interposed therebetween. In addition, the p+ type impurity area 141 included in the third photodiode PD3 is in contact with the third gate electrode 122 at a side of the third gate electrode 122 at which the second light-receiving unit 120b is provided, and no p+ type impurity area is formed at a side opposite to the side at which the second light-receiving unit 120b is provided. Therefore, when the third gate electrode 122 is turned on, the signal charge e3 accumulated in the third photodiode PD3 is read out to the floating diffusion area 121b along a surface of the third gate electrode 122 at a side opposite to the side at which the p+ type impurity area 141 is formed.

The p+ type impurity area 141 included in the third photodiode PD3 extends to a boundary of the second light-receiving unit 120b included in the adjacent second pixel 2b. The p+ type impurity area 141 functions as a photodiode separating area for separating the second photodiode PD2 and the third photodiode PD3 from each other. Therefore, the signal charge e3 accumulated in the third photodiode PD3 can be prevented from being read out to the floating diffusion area 121b disposed adjacent to the second gate electrode 123.

The signal charges e2 and e3 are respectively read out to the floating diffusion area 121b adjacent to the second photodiode PD2 and the floating diffusion area 121b adjacent to the third photodiode PD3. Accordingly, the voltage of each of the floating diffusion areas 121b changes. The change in the voltage of the floating diffusion area 121b adjacent to the second photodiode PD2 is amplified by the amplifier transistor (not shown) connected to the floating diffusion area 121b, and is output as a signal output S2. The change in the voltage of the floating diffusion area 121b adjacent to the third photodiode PD3 is amplified by the amplifier transistor (not shown) connected to the floating diffusion area 121b, and is output as a signal output S3.

The blue light B and the green light G are incident on the second light-receiving unit 120b. Therefore, a blue signal output Bs and a green signal output Gs can be determined by calculation based on the signal outputs S2 and S3. The relationships between the signal outputs S1 and S2 and the signal outputs Bs and Gs can be obtained as follows:

$$S2 = \alpha \cdot Bs + \beta \cdot Rs$$

$$S3 = \gamma \cdot Bs + \delta \cdot Rs$$

In the above equations, $\alpha$, $\beta$, $\gamma$, and $\delta$ are coefficients determined from the optical absorption coefficients in accordance with the depth from the surface of the substrate 126 and the characteristics of the cyan filter 147. The signal outputs Bs and Gs can be obtained from the above equations.

Sixth Embodiment

Figure 20:
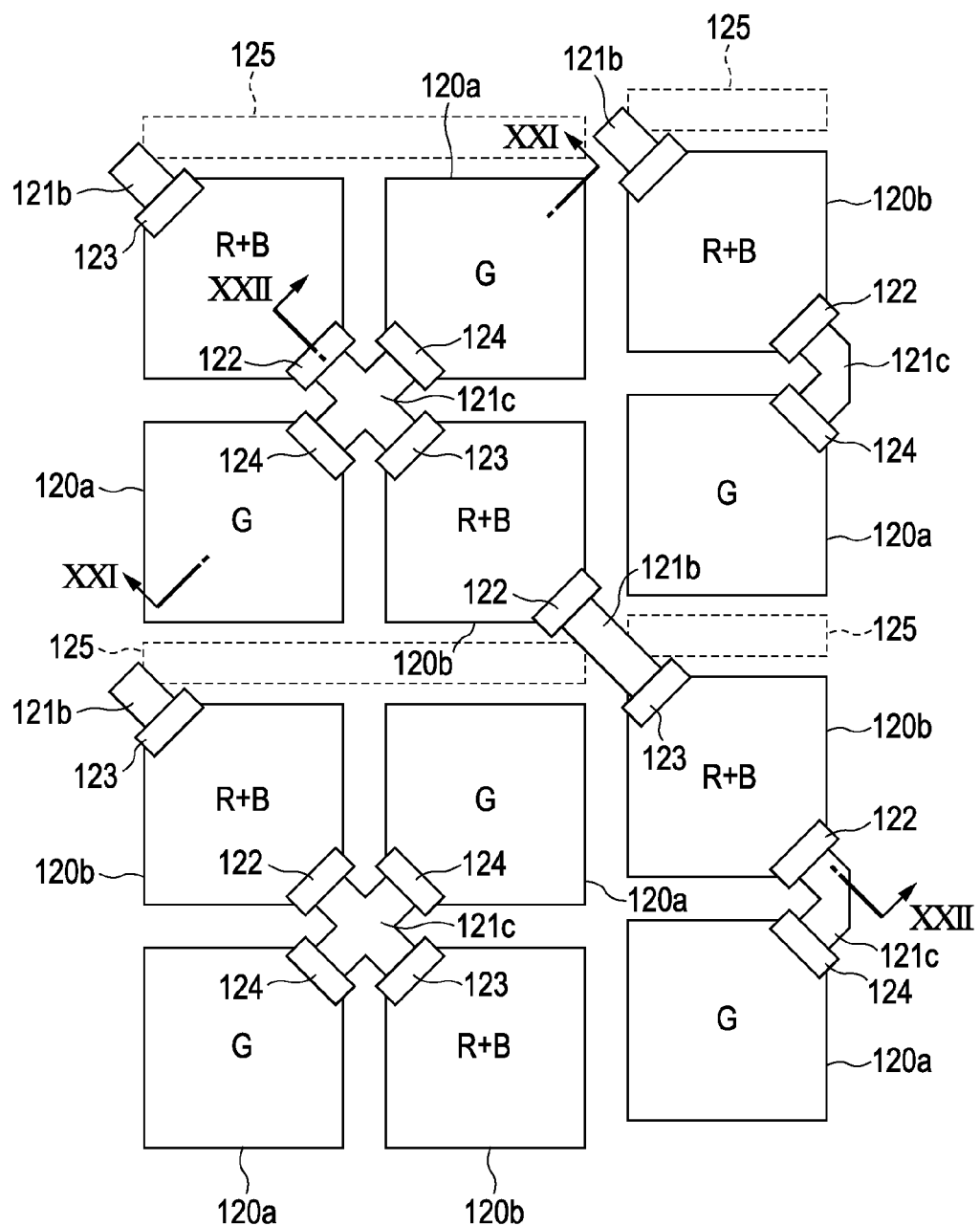
FIG. 20 is a planar layout view of the main part of the solid-state imaging device according to the sixth embodiment of the present invention.
Figure 21:
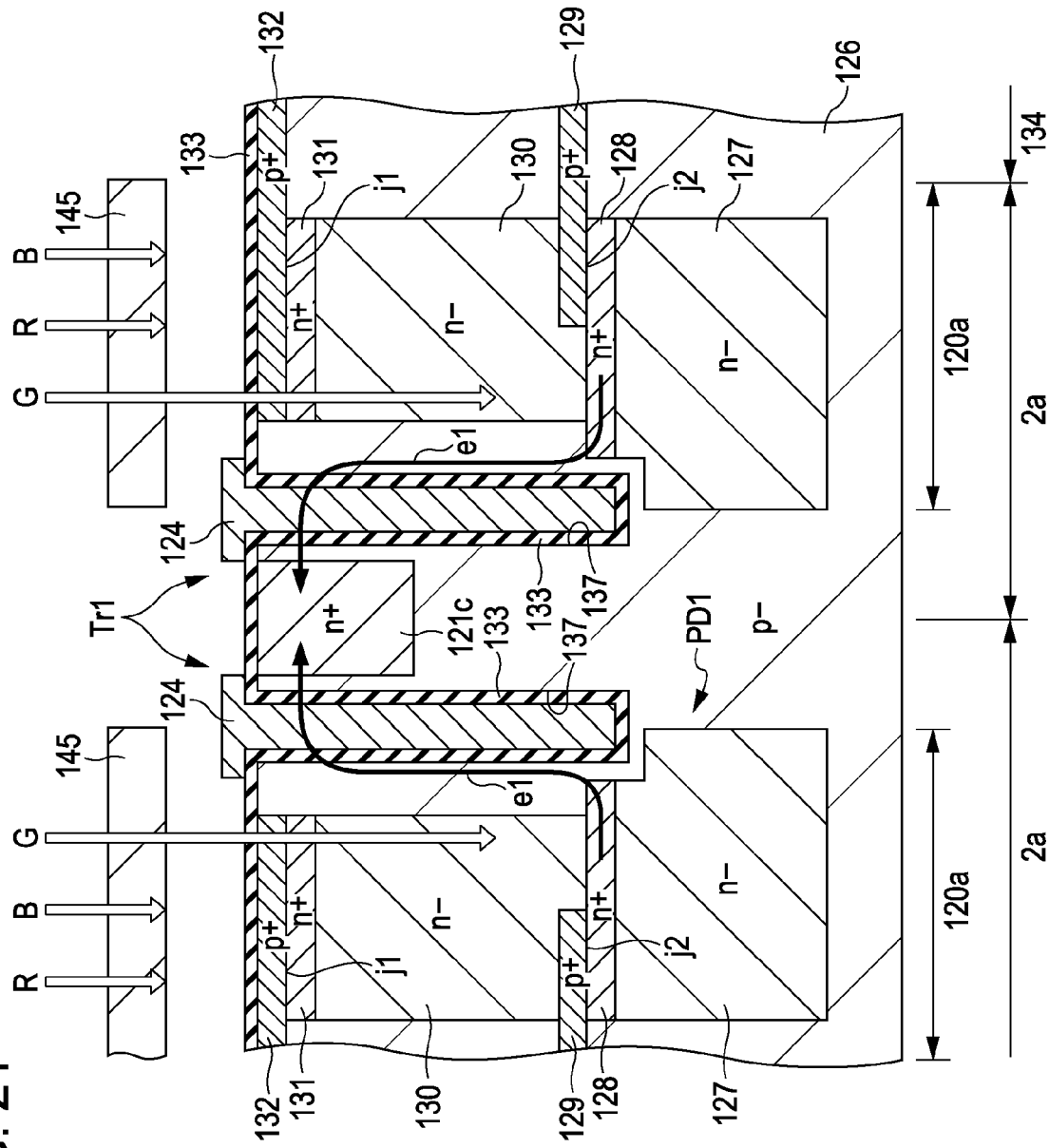
FIG. 21 is a sectional view of FIG. 20 taken along line XXI-XXI.
Figure 22:
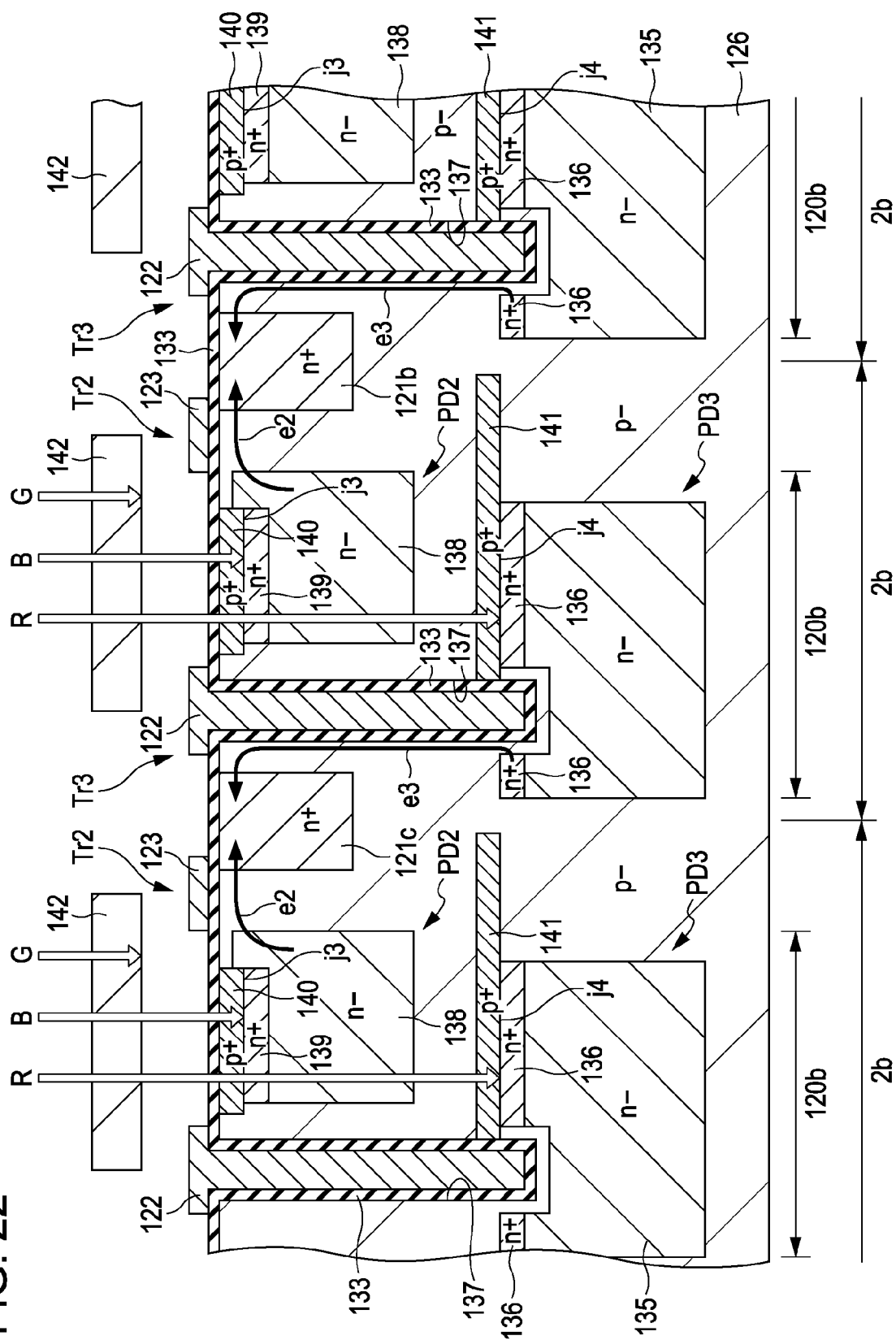
FIG. 22 is a sectional view of FIG. 20 taken along line XXII-XXII.

FIG. 20 is a schematic plan view of the main part of a solid-state imaging device according to a sixth embodiment of the present invention. FIG. 20 shows a planar layout of a plurality of pixels 2 in an image pickup area of the solid-state imaging device according to the present embodiment. FIG. 21 is a sectional view of FIG. 20 taken along line XXI-XXI, and FIG. 22 is a sectional view of FIG. 20 taken along line XXII-XXII. In FIGS. 20 to 22, components similar to those in FIGS. 11 to 13 are denoted by the same reference numerals, and redundant explanations thereof are thus omitted.

Description of Structure

In the solid-state imaging device according to the present embodiment, the method in which the floating diffusion areas are used in common by the pixels and the arrangement of the second and third gate electrodes 123 and 122 differ from those in the solid-state imaging device according to the third embodiment.

As shown in FIG. 20, each floating diffusion area 121c which are used in common by the first pixels 2a disposed adjacent to each other in an inclined direction is also used in common by the second pixels 2b disposed adjacent to each other in an inclined direction. Thus, each floating diffusion area 121c is used in common by four pixels 2 which are adjacent to each other. The four pixels which use a single floating diffusion area 121c in common are referred to as a unit pixel group. In this case, pixel transistor areas 125 including reset transistors, amplifier transistors, selection transistors, etc., are provided between the unit pixel groups disposed adjacent to each other in the vertical direction. In each unit pixel group, each second pixel 2b uses a floating diffusion area 121b in common with a corresponding second pixel 2b included in the adjacent unit pixel group. Therefore, the unit pixel groups disposed adjacent to each other in the horizontal direction are shifted from each other by a distance corresponding to the pixel transistor area 125.

The operation of reading signals from the first light-receiving units 120a and the second light-receiving units 120b in the solid-state imaging device of the present embodiment are similar to those in the first embodiment, and redundant explanations thereof are thus omitted.

According to the present embodiment, a single floating diffusion area 121c is used in common by a unit pixel group including four pixels which are adjacent to each other. Therefore, the ratio of the area occupied by the charge-readout transistors Tr1 to Tr3 in the surface of the substrate 126 can be reduced. As a result, spaces for placing the pixel transistor areas 125 can be ensured.

Seventh Embodiment

Figure 23:
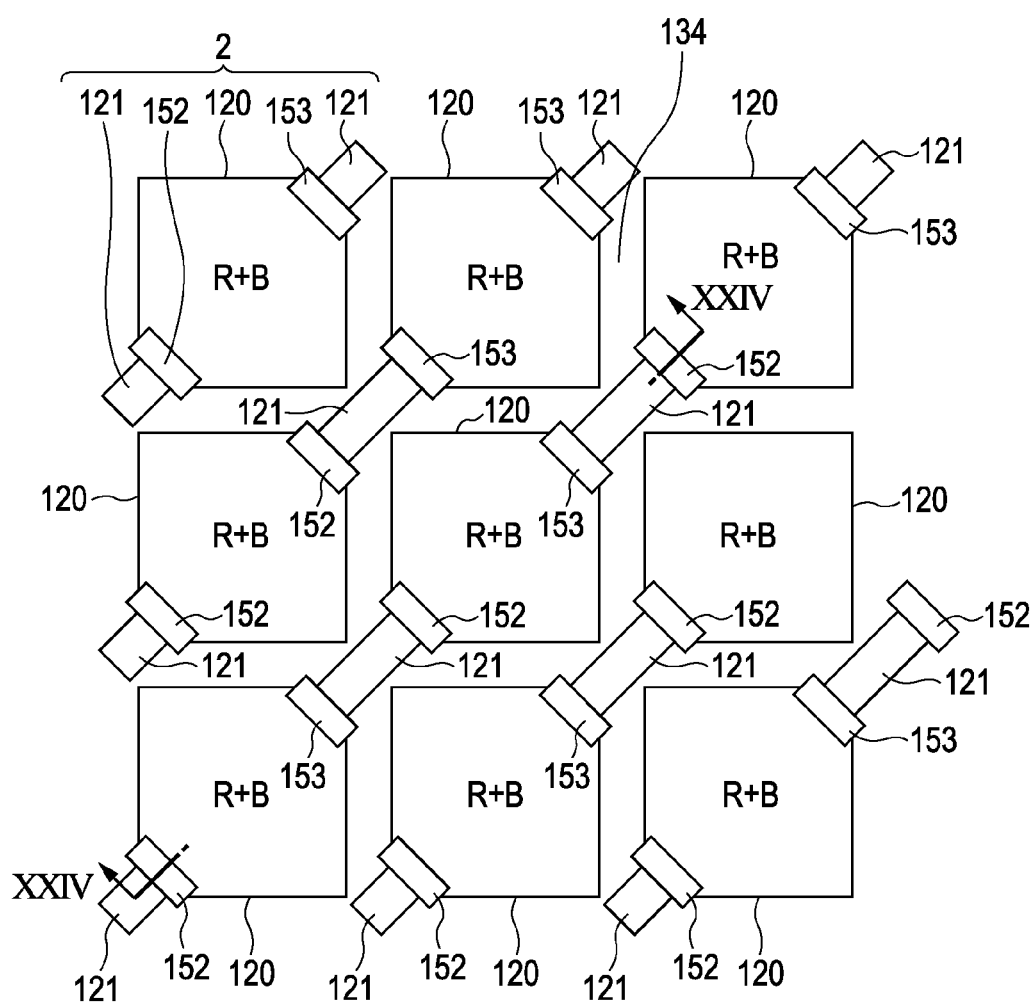
FIG. 23 is a planar layout view of the main part of the solid-state imaging device according to the seventh embodiment of the present invention.
Figure 24:
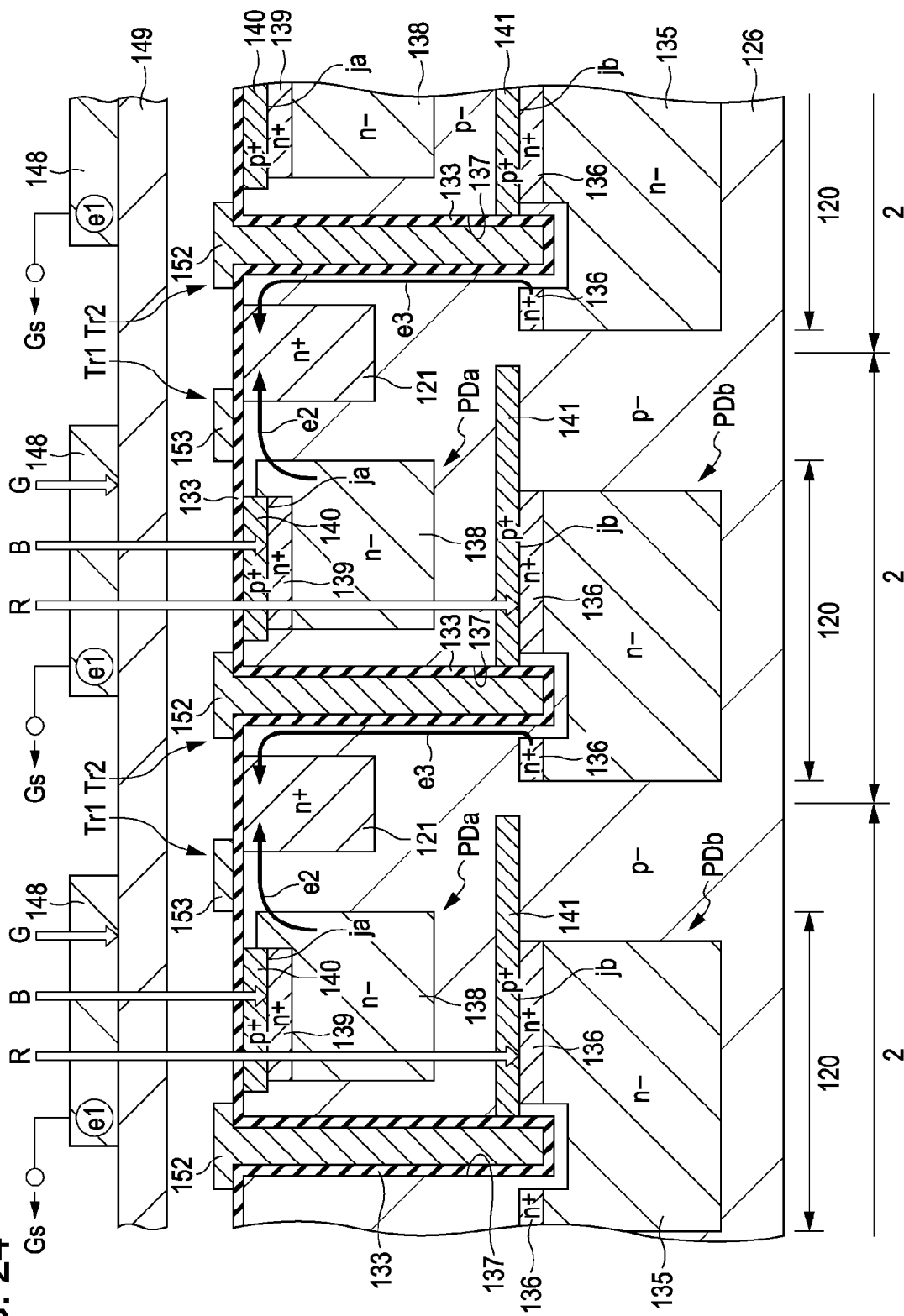
FIG. 24 is a sectional view of FIG. 23 taken along line XXIV-XXIV.

FIG. 23 is a schematic plan view of the main part of a solid-state imaging device according to a seventh embodiment of the present invention. FIG. 23 shows a planar layout structure of a plurality of pixels 2 in an image pickup area of the solid-state imaging device according to the present embodiment. FIG. 24 is a sectional view of FIG. 23 taken along line XXIV-XXIV. In FIGS. 23 and 24, components similar to those in FIGS. 11 to 13 are denoted by the same reference numerals, and redundant explanations thereof are thus omitted.

Description of Structure

In the solid-state imaging device according to the present embodiment, each pixel 2 includes a light-receiving unit 120, a vertical gate electrode 152, a planar-type gate electrode 153, and a floating diffusion area 121. An organic photoelectric conversion film 148 is provided above the pixels 2. In all of the embodiments according to the present invention, instead of placing the organic photoelectric conversion film 148 above the pixels 2, an inorganic photoelectric conversion film, a layered photoelectric conversion film, an Si or Ge film which absorbs infrared rays, or a combination of one or more of these films and the organic photoelectric conversion film may be provided above the pixels 2.

The light-receiving units 120 are arranged on the substrate 126 along the horizontal and vertical directions in a matrix pattern. Each light-receiving unit 120 includes an upper photodiode PDa and a lower photodiode PDb arranged in the depth direction of the substrate 126.

As shown in FIG. 24, the upper photodiode PDa includes a p+ type impurity area, an n+ type impurity area, and an n-type impurity area in order of depth from the surface of the substrate 126, and is mainly formed of a pn junction ja between the p+ type impurity area and the n+ type impurity area.

The lower photodiode PDb includes a p+ type impurity area, an n+ type impurity area, and an n− type impurity area in order of depth from a position deeper than the upper photodiode PDa, and is mainly formed of a pn junction jb between the p+ type impurity area and the n+ type impurity area.

The upper photodiode PDa according to the present embodiment corresponds to the second photodiode PD2 in the third embodiment. The lower photodiode PDb according to the present embodiment corresponds to the third photodiode PD3 in the third embodiment. The planar-type gate electrode 153 corresponds to the second gate electrode 123 in the third embodiment. The vertical gate electrode 152 corresponds to the third gate electrode 122 in the third embodiment. The floating diffusion area 121 corresponds to the floating diffusion area 121b in the third embodiment.

In each pixel 2, the planar-type gate electrode 153 and the floating diffusion area 121 disposed adjacent to the planar-type gate electrode 153 form a charge-readout transistor Tr1 for reading a signal charge e2 of the upper photodiode PDa. In addition, the vertical gate electrode 152 and the floating diffusion area 121 disposed adjacent to the vertical gate electrode 152 form a charge-readout transistor Tr3 for reading a signal charge e3 of the lower photodiode PDb.

A magenta filter 149, which is a complementary color filter that transmits the red light R and the blue light B, is arranged above the entire area of the substrate 126 in which the light-receiving units 120 are formed. The magenta filter 149 is disposed above the substrate 126 at the light illumination side with a desired wiring layer (not shown) provided therebetween. Red and blue are complementary colors of green.

The organic photoelectric conversion film 148, which absorb only the green light G and performs photoelectric conversion thereof, is formed on the magenta filter 149.

The organic photoelectric conversion film 148 is formed above the substrate 126 and is divided into sections corresponding to respective pixels 2 in areas corresponding to the light-receiving units 120.

Description of Operation

The operation of the solid-state imaging device having the above-described structure will now be described.

First, light is incident on the front surface of the substrate 126.

Accordingly, only the green light G is absorbed by the organic photoelectric conversion film 148. The green light G absorbed by the organic photoelectric conversion film 148 is subjected to the photoelectric conversion, so that a signal charge e1 is generated. The signal charge e1 generated by the green light G is output through an output terminal as a green signal output Gs.

A part of the light which has not been absorbed by the organic photoelectric conversion film 148 passes through the magenta filter 149 and is incident on each light-receiving unit 120 in the substrate 126. Since only the blue light B and the red light R pass through the magenta filter 149, the blue light B and the red light R are incident on the light-receiving unit 120. In the light incident on the light-receiving unit 120, the blue light B has a shorter wavelength than that of the red light R. Therefore, almost all of the blue light B is subjected to photoelectric conversion performed by the upper photodiode PDa positioned near the surface of the substrate 126. The signal charge e2 generated by the photoelectric conversion performed by the upper photodiode PDa is accumulated in a potential well formed by the pn junction ja.

In the light incident on the light-receiving unit 120, the red light R has a longer wavelength than that of the blue light B. Therefore, a part of the red light R which has not been subjected to the photoelectric conversion performed by upper photodiode PDa reaches the lower photodiode PDb disposed at a position deep from the surface of the substrate 126 and is subjected to photoelectric conversion performed by the lower photodiode PDb. The signal charge e3 generated by the photoelectric conversion performed by the lower photodiode PDb is accumulated in a potential well formed by the pn junction jb.

Then, the accumulated signal charges e2 and e3 are read out to the floating diffusion area 121.

First, when the planar-type gate electrode 153 is turned on, the potential in the substrate 126 in an area below the planar-type gate electrode 153 changes. Accordingly, the signal charge e2 accumulated in the upper photodiode PDa is read out to the floating diffusion area 121 disposed adjacent to the planar-type gate electrode 153. In addition, when the vertical gate electrode 152 is turned on, the potential around the vertical gate electrode 152 changes. Accordingly, the signal charge e3 accumulated in the lower photodiode PDb is read out to the floating diffusion area 121 disposed adjacent to the vertical gate electrode 152.

The bottom portion of the vertical gate electrode 152 and the portion of the gate insulating film 133 at the bottom of the vertical gate electrode 152 are covered by the n+ type impurity area and the n− type impurity area which form the lower photodiode PDb with a p− type impurity area which forms the substrate interposed therebetween. In addition, the p+ type impurity area included in the lower photodiode PDb is in contact with the vertical gate electrode 152 at a side of the vertical gate electrode 152 at which the light-receiving unit 120 is provided, and no p+ type impurity area is formed at a side opposite to the side at which the light-receiving unit 120 is provided. Therefore, when the vertical gate electrode 152 is turned on, the signal charge e3 accumulated in the lower photodiode PDb is read out to the floating diffusion area 121 along a surface of the vertical gate electrode 152 at a side opposite to the side at which the p+ type impurity area is formed.

The p+ type impurity area included in the lower photodiode PDb extends to a boundary of the adjacent light-receiving unit 120, and functions as a photodiode separating area for separating the upper photodiode PDa and the lower photodiode PDb from each other. Therefore, the signal charge e3 accumulated in the lower photodiode PDb can be prevented from being read out to the floating diffusion area 121 disposed adjacent to the planar-type gate electrode 153.

The signal charges e2 and e3 are respectively read out to the floating diffusion area 121 adjacent to the upper photodiode PDa and the floating diffusion area 121 adjacent to the lower photodiode PDb. Accordingly, the voltage of each of the floating diffusion areas 121 changes. The change in the voltage of the floating diffusion area 121 adjacent to the upper photodiode PDa is amplified by the amplifier transistor (not shown) connected to the floating diffusion area 121, and is output as a signal output S2. The change in the voltage of the floating diffusion area 121 adjacent to the lower photodiode PDb is amplified by the amplifier transistor (not shown) connected to the floating diffusion area 121, and is output as a signal output S3.

The blue light B and the red light R are incident on the light-receiving unit 120. Therefore, a blue signal output Bs and a red signal output Rs can be determined by calculation based on the signal outputs S2 and S3. The calculation method is similar to that in the third embodiment.

Thus, according to the present embodiment, the blue light B, the green light G and the red light R can be simultaneously detected by a single pixel. Therefore, a loss in the amount of incident light can be reduced. In addition, since the blue light B, the green light G and the red light R can be simultaneously detected by a single pixel, the effective number of pixels can be increased.

The green light G is detected by the organic photoelectric conversion film 148, and the blue light B and the red light R, which have optical absorption coefficients that largely differ from each other, are detected by the upper photodiode PDa and the photodiodes PD arranged in the depth direction of the substrate 126. Therefore, only the red light is subjected to the photoelectric conversion performed by the lower photodiode PDb, and the spectral characteristics of the substrate 126 can be improved.

In the present embodiment, the organic photoelectric conversion film 148 is made of a material which absorbs the green light G. However, the organic photoelectric conversion film 148 may also be made of a material which absorbs the blue light B. In such a case, a yellow filter is used in place of the magenta filter 149, and each light-receiving unit 120 in the substrate 126 performs photoelectric conversion of the green light G and the red light R. In addition, the organic photoelectric conversion film 148 may also be made of a material which absorbs the red light R. In such a case, a cyan filter is used in place of the magenta filter 149, and each light-receiving unit 120 in the substrate 126 performs photoelectric conversion of the blue light B and the green light G.

In the third to seventh embodiments, a front-illuminated type solid-state imaging device in which light is incident on a front surface of a substrate is explained as an example. However, the solid-state imaging device may also be of a back-illuminated type in which light is incident on a back surface of a substrate. In such a case, a single-color filter, a complementary color filter, and an organic photoelectric conversion film are provided on the back side of the substrate, and the structure of the photodiodes in the substrate is inverted.

According to the third to seventh embodiments, the solid-state imaging device is applied to an image sensor in which unit pixels are arranged in a matrix pattern and in which the unit pixels detect signal charges corresponding to the amount of visible light as physical quantities. However, the application of the present invention is not limited to the solid-state imaging device for use as an image sensor, and the present invention may be applied to various column-type solid-state imaging devices in which column circuits are provided for respective pixel columns in a pixel array.

In addition, the application of the present invention is not limited to the solid-state imaging device which captures an image corresponding to a distribution of the amount of incident visible light. The present invention may also be applied to solid-state imaging devices which capture images corresponding to distributions of infrared rays, X-rays, or particle rays. In addition, in a broad sense, the present invention may also be applied to solid-state imaging devices (physical-quantity-distribution detection devices), such as a fingerprint detection sensor, which capture images corresponding to distributions of other physical quantities, such as pressure and capacitance.

The present invention is not limited to the solid-state imaging device in which pixel signals are read out from each unit pixel by successively scanning the rows of unit pixels in the pixel array. The present invention can also be applied to, for example, an X-Y address type solid-state imaging device in which each of the pixels can be arbitrarily selected and a signal can be read from the selected pixel.

The solid-state imaging device can either be formed as a single chip, or as a module having an image pickup function in which an image pickup unit and at least one of a signal processing unit and an optical system are assembled in a package.

The application of the present invention is not limited to solid-state imaging devices, and the present invention may also be applied to any type of image pickup devices. Here, the image pickup device means an electronic apparatus, such as a camera system (digital still camera, video camera, etc.), a mobile phone, etc., which has an image pickup function. The image pickup device may also be in the form of a module, such as a camera module, mounted in an electronic apparatus.

Electronic Apparatus

An electronic apparatus including the above-described solid-state imaging device will now be described. In the following description, an example in which the solid-state imaging device 1 according to any one of the third to seventh embodiments is used in a camera will be described.

FIG. 10 is a schematic sectional view of a camera according to an embodiment of the present invention. The camera according to the present embodiment is an example of a video camera capable of capturing a still image or a moving image.

The camera of the present embodiment includes the solid-state imaging device 1, an optical lens 110, a shutter device 111, a drive circuit 112, and a signal processing circuit 113. The solid-state imaging device according to any of the of the third to seventh embodiments may be used as the solid-state imaging device 1.

The optical lens 110 focuses image light (incident light) from an object on an image pickup plane in the solid-state imaging device 1. Thus, signal charges are accumulated in the solid-state imaging device 1 for a certain period of time. The optical lens 110 may also be formed as an optical lens system including a plurality of optical lenses.

The shutter device 111 controls the light receiving time and the light blocking time for the solid-state imaging device 1.

The drive circuit 112 supplies drive signals for controlling the transfer operation of the solid-state imaging device 1 and the shutter operation of the shutter device 111. The solid-state imaging device 1 performs the signal transfer operation in response to the drive signal (timing signal) supplied from the drive circuit 112. The signal processing circuit 113 performs various signal processing operations. Image signals are obtained by the signal processing operations, and are either stored in a storage medium, such as a memory, or output to a monitor.

In the solid-state imaging device 1 included in the camera according to the present embodiment, a plurality of color signals can be obtained from a single pixel using the photodiodes arranged in the depth direction in the substrate. Therefore, the effective number of pixels can be increased. In addition, the saturation charge amount (Qs) and the sensitivity can also be increased. Therefore, according to the present embodiment, the size of the camera can be reduced and the image quality can be improved. Thus, the size of the electronic apparatus can be reduced, the resolution thereof can be increased, and the image quality can be improved.

Eighth Embodiment

Embodiment of Method for Manufacturing Solid-State Imaging Device

A method for manufacturing a solid-state imaging device according to an eighth embodiment of the present invention will be described with reference to FIGS. 25 to 32.

Figure 25:
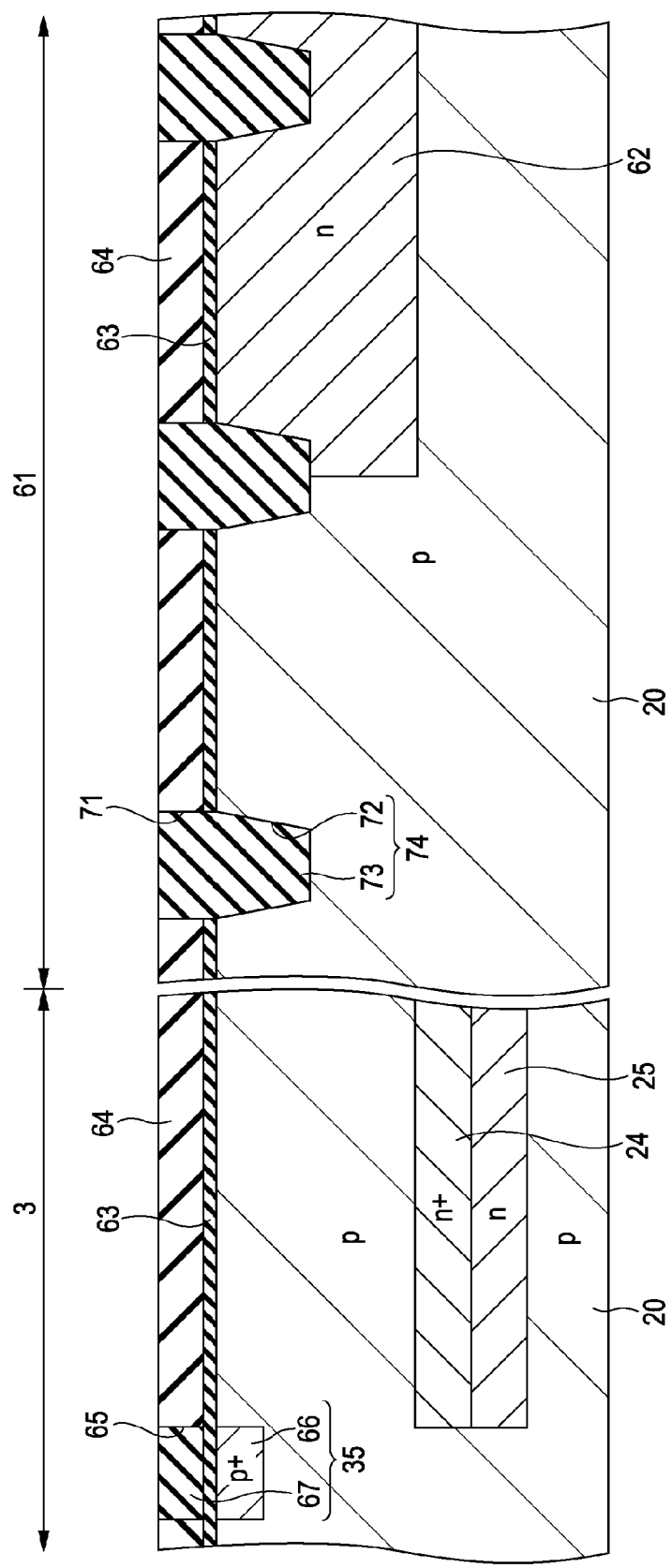
FIG. 25 is a diagram illustrating a manufacturing step of a method for manufacturing the solid-state imaging device according to the eighth embodiment of the present invention.

First, as shown in FIG. 25, in the pixel section 3, the n-type semiconductor area 25 and the n+ type semiconductor area 24, which form a part of the second photodiode PD2, are formed in the semiconductor substrate 20 by ion implantation. The areas 25 and 24 are formed such that the areas 25 and 24 extend below the pixel transistors in each unit pixel. In a peripheral circuit section 61, an n-type transistor well area 62 is formed in an area where a p-channel MOS transistor is to be formed.

Then, for example, a silicon nitride film 64 having a predetermined thickness, which serves as a first polishing stop layer, is formed above the substrate 20 with a silicon oxide film 63 provided therebetween. The silicon nitride film 64 has a thickness of, for example, about 100 nm. In the pixel section 3, an opening 65 is formed in the first silicon nitride film 64 at a position corresponding to each of a pixel separating area and an element separating area in each pixel. Then, a p-type impurity is implanted through the opening 65 by ion implantation, so that a p-type channel stop area 66 is formed.

Then, the opening 65 is filled with a silicon oxide film 67, and the silicon oxide film 67 is planarized. The planarization process is performed by, for example, a chemical mechanical polishing (CMP) method. The silicon oxide film 67 and the p-type channel stop area 66 form the pixel separating area 35 (or the element separating area 35a). Depending on the type of the element to be formed, each of the pixel separating area 35 and the element separating area may also be formed by forming a trench such that the trench extends into the silicon substrate and filling the trench with the silicon oxide film 67.

In the peripheral circuit section 61, an opening 71 is formed in the first silicon nitride film 64 at a position corresponding to an element separating area, and a trench 72 having a predetermined depth is formed in the semiconductor substrate 20 at the bottom of the opening 71. The trench 72 and the opening 71 in the first silicon nitride film 64 are filled with a silicon oxide film 73, so that an element separating area 74 having a shallow trench isolation (STI) structure can be obtained.

Figure 26:
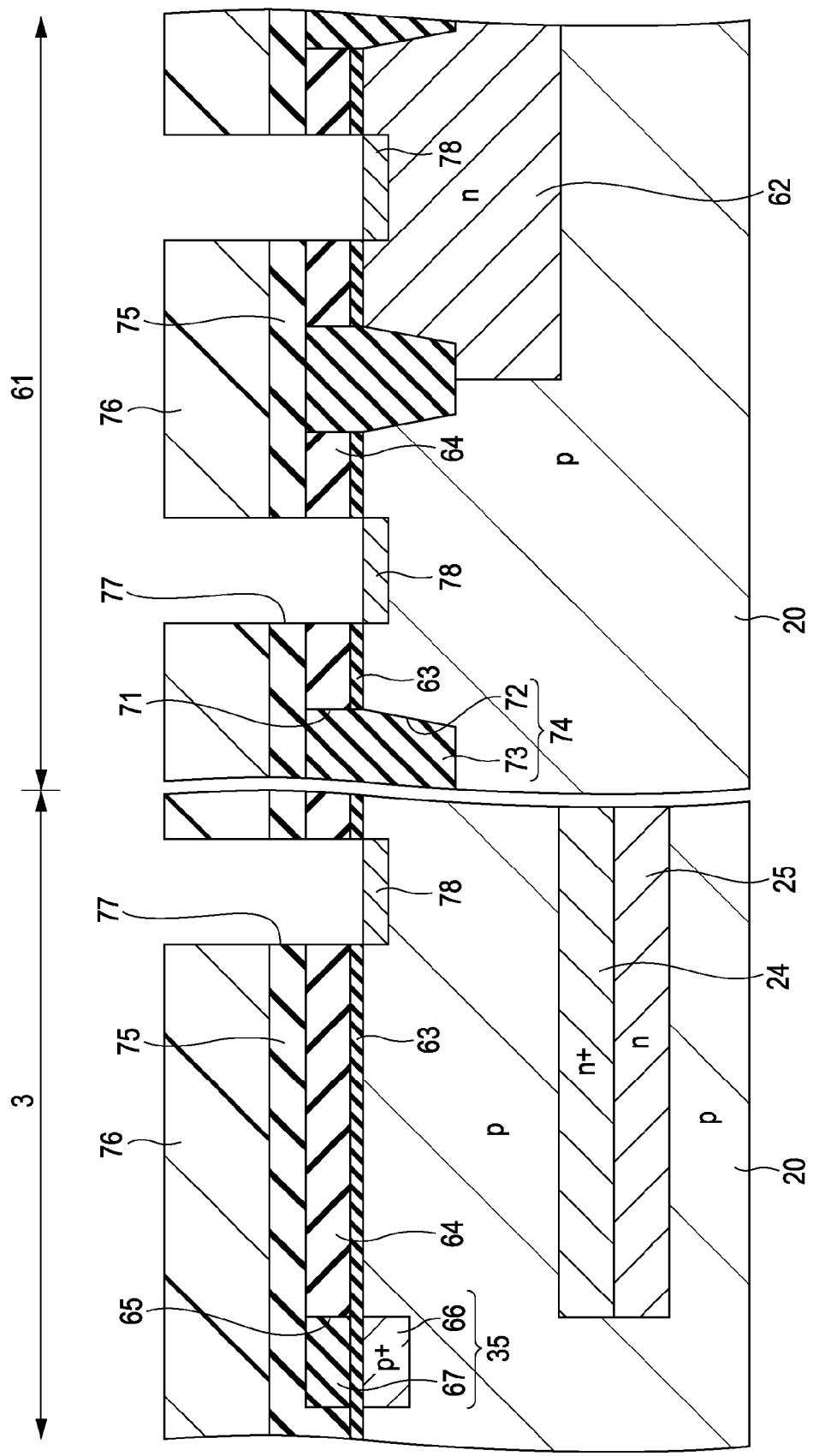
FIG. 26 is a diagram illustrating a manufacturing step of the method for manufacturing the solid-state imaging device according to the eighth embodiment of the present invention.

Next, as shown in FIG. 26, a silicon nitride film 75 having a predetermined thickness, which serves as a second polishing stop layer, is formed on the silicon nitride film 64 which serves as the first polishing stop layer. The thickness of the first silicon nitride film 64 is reduced to, for example, 80 nm in the planarization process, and the thickness of the silicon nitride film 75 is set to 100 nm, so that the total thickness is set to about 180 nm, which corresponds to the thickness of a planar-type gate electrode.

Then, in each of the pixel section 3 and the peripheral circuit section 61, trenches 77 are formed at positions where the planar-type gate electrodes are to be formed. The trenches 77 are formed by selectively etching the first and second silicon nitride films 64 and 75 and the silicon oxide film 63 through a resist mask 76. The trenches 77 are formed such that the width thereof corresponds to the width of the planar-type gate electrodes. Predetermined channel areas for the n-channel and p-channel transistors are formed so that the threshold voltage can be adjusted through the trenches 77. Although not shown in the figures, grooves for forming gate electrode wirings may be formed at the time when the trenches 77 are formed. For example, grooves for forming gate electrode wirings for the planar-type gate electrodes may be formed such that the grooves are connected to the trenches 77. The channel areas are selectively formed in areas corresponding to the planar-type gate electrodes.

Figure 27:
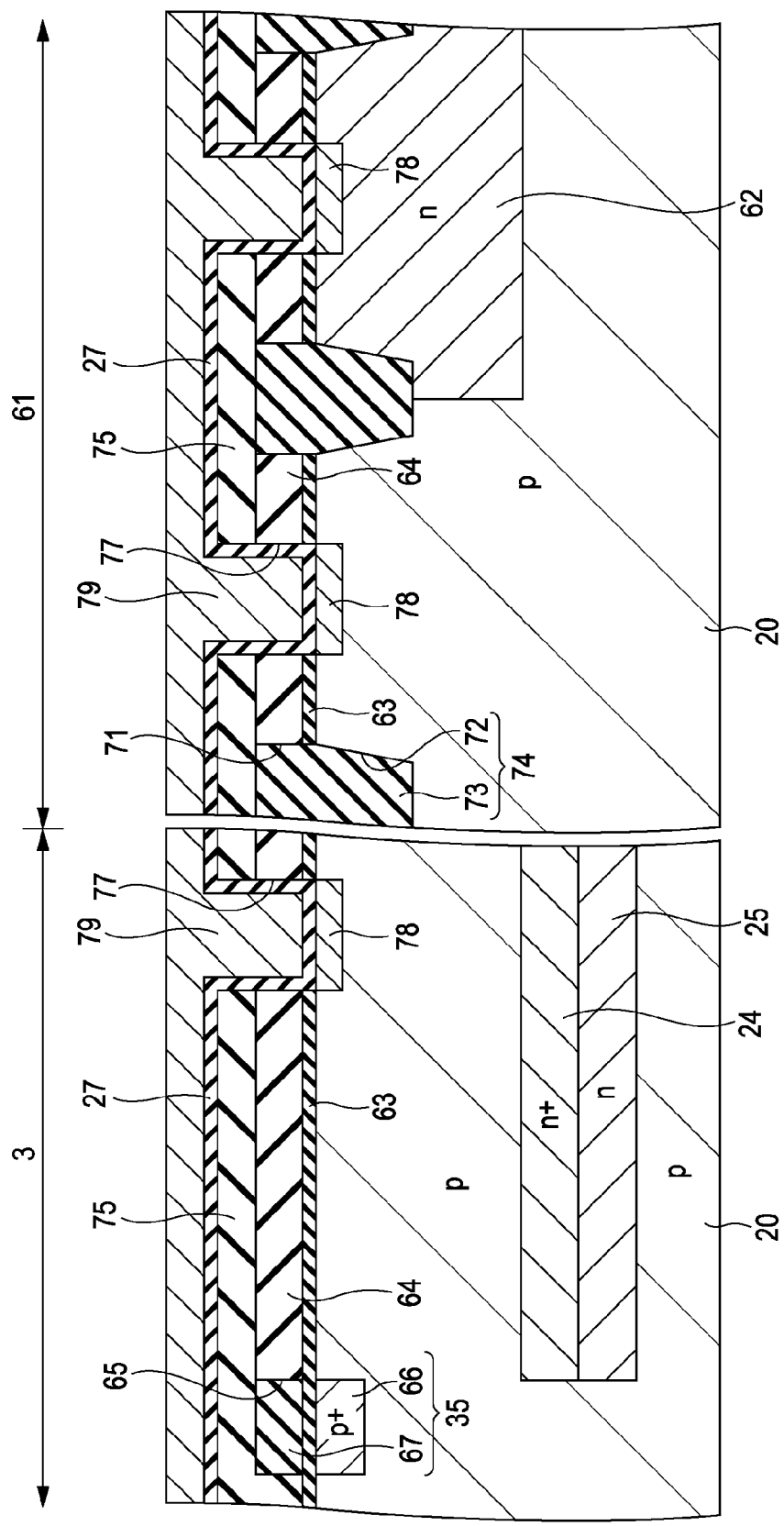
FIG. 27 is a diagram illustrating a manufacturing step of the method for manufacturing the solid-state imaging device according to the eighth embodiment of the present invention.

Next, as shown in FIG. 27, the trenches 77 are filled with a layer of undoped amorphous silicon or polysilicon (undoped polysilicon layer 79 in the present embodiment) with the gate insulating film 27 interposed between the undoped polysilicon layer 79 and the inner surfaces of the trenches 77. In the present embodiment, an undoped polysilicon layer 79 is formed. The undoped polysilicon layer 79 corresponds to the planar-type gate electrodes and the gate electrode wirings. The polysilicon layer 79 is also formed on the silicon nitride film 75.

Figure 28:
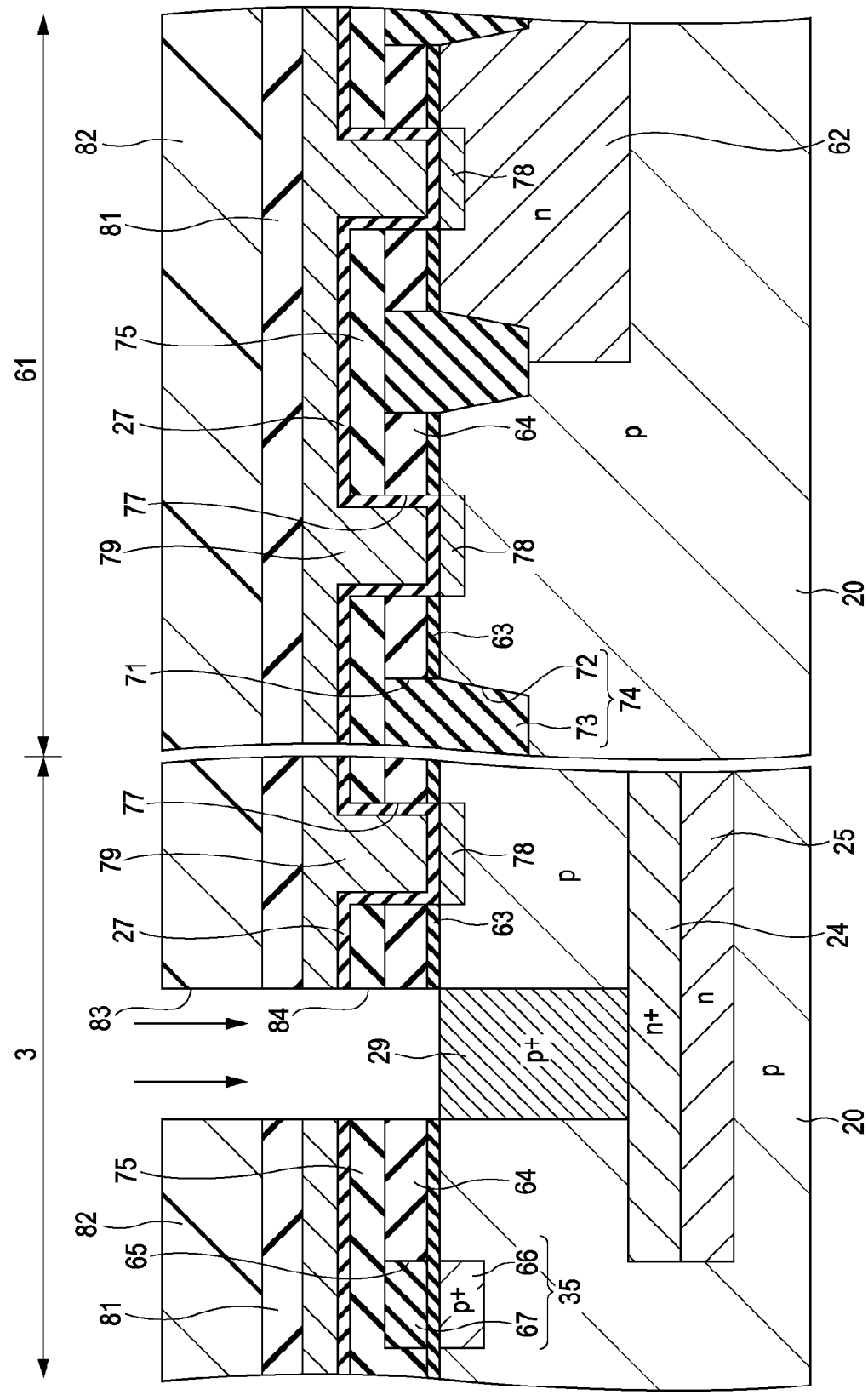
FIG. 28 is a diagram illustrating a manufacturing step of the method for manufacturing the solid-state imaging device according to the eighth embodiment of the present invention.

Next, as shown in FIG. 28, a silicon oxide film 81 is formed on the undoped polysilicon layer 79. Then, a resist mask 82 is formed on the silicon oxide film 81. Then, an opening 84 is formed in an area where a vertical readout gate electrode is to be formed. The opening 84 is formed by selectively etching the silicon oxide film 63, the first and second silicon nitride films 64 and 75, the undoped polysilicon layer 79, and the silicon oxide film 81 through an opening 83 formed in the resist mask 82.

Then, the p-type semiconductor area 29 which extends to the n+ type semiconductor area 24 is formed by doping the substrate with a p-type impurity, such as boron, through the opening 84. The p-type semiconductor area 29 is selectively formed only in an area corresponding to the vertical readout gate electrode. The p-type semiconductor area 29 functions as a dark-current suppressing area.

Figure 29:
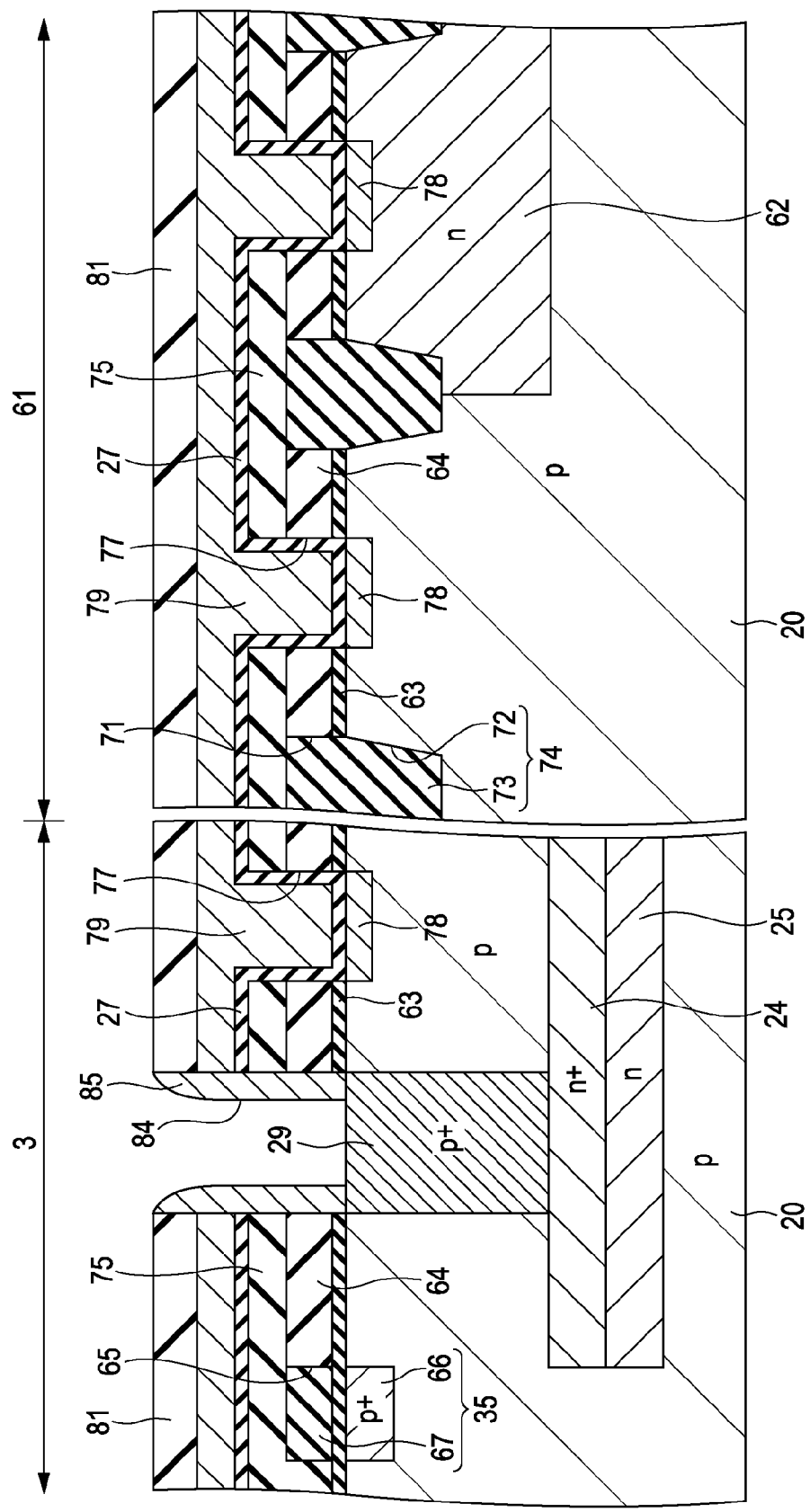
FIG. 29 is a diagram illustrating a manufacturing step of the method for manufacturing the solid-state imaging device according to the eighth embodiment of the present invention.

Next, as shown in FIG. 29, a side wall 85 made of, for example, a silicon oxide film is formed on the inner wall of the opening 84 formed in the multilayer structure including the layers from the silicon oxide film 63 to the silicon oxide film 81. The side wall 85 can be formed by forming a silicon oxide film with a thickness of about 50 nm on the entire inner surface of the opening 84 including the inner wall surface, and then dry etching (etching back) the silicon oxide film to the silicon surface.

Figure 30:
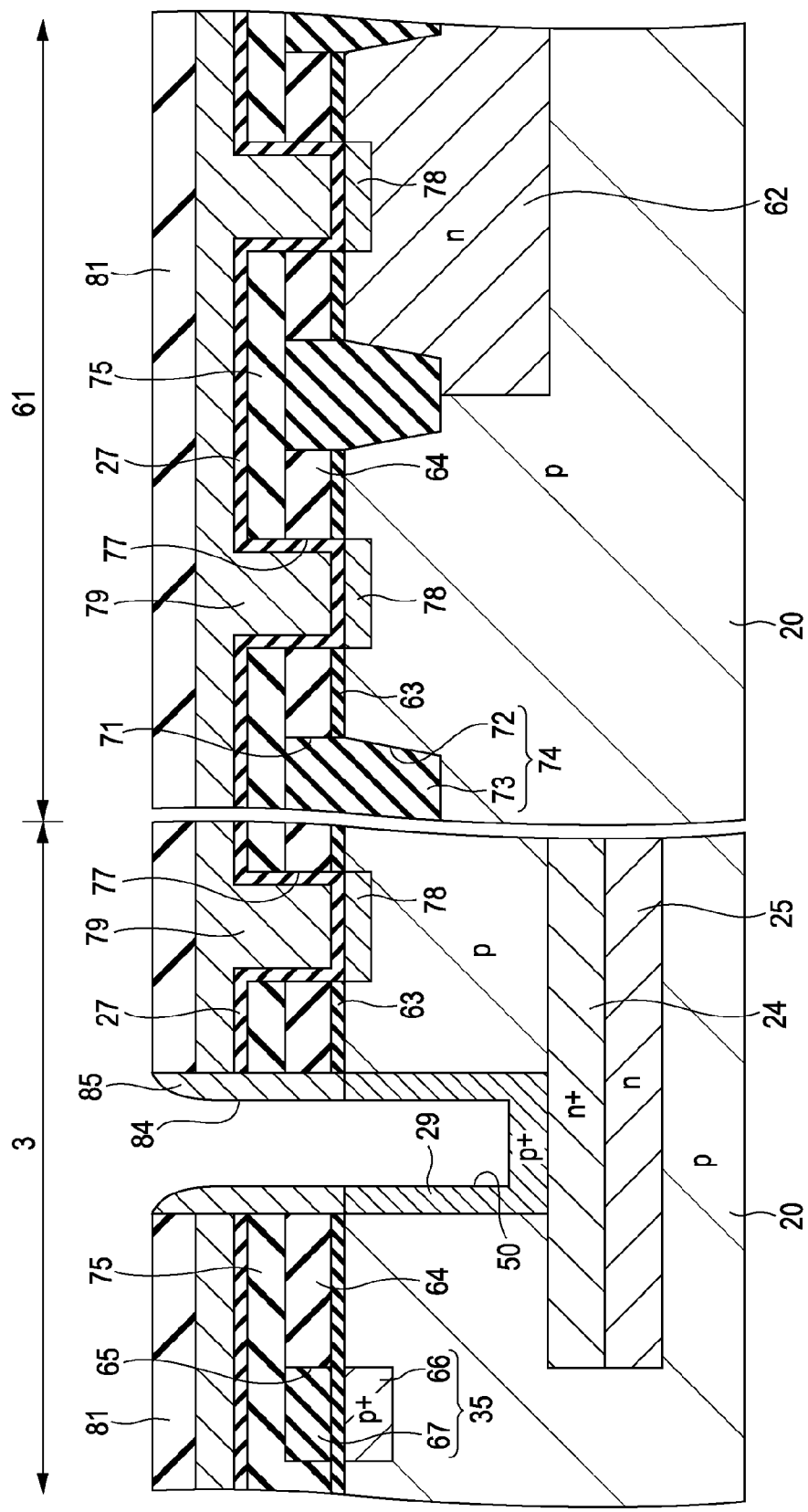
FIG. 30 is a diagram illustrating a manufacturing step of the method for manufacturing the solid-state imaging device according to the eighth embodiment of the present invention.

Next, as shown in FIG. 30, a vertical trench 50 is formed by selectively etching the p-type semiconductor area 29 using the side wall as a mask such that bottom and peripheral portions of the p-type semiconductor area 29 remain unetched. The depth of the vertical trench 50 is set to, for example, about 1 μm. Then, a thermal oxidation process is performed to eliminate the etching damage, and a thermal oxide film formed by the thermal oxidation process, the side wall oxide film 85, and the silicon oxide film 81 are removed by fluorinated acid. The opening 84 having a large width appears at the top of the vertical trench 50 after the removal process using the fluorinated acid. This opening 84 serves as an opening in which the extraction electrode portion of the readout gate electrode is formed.

Figure 31:
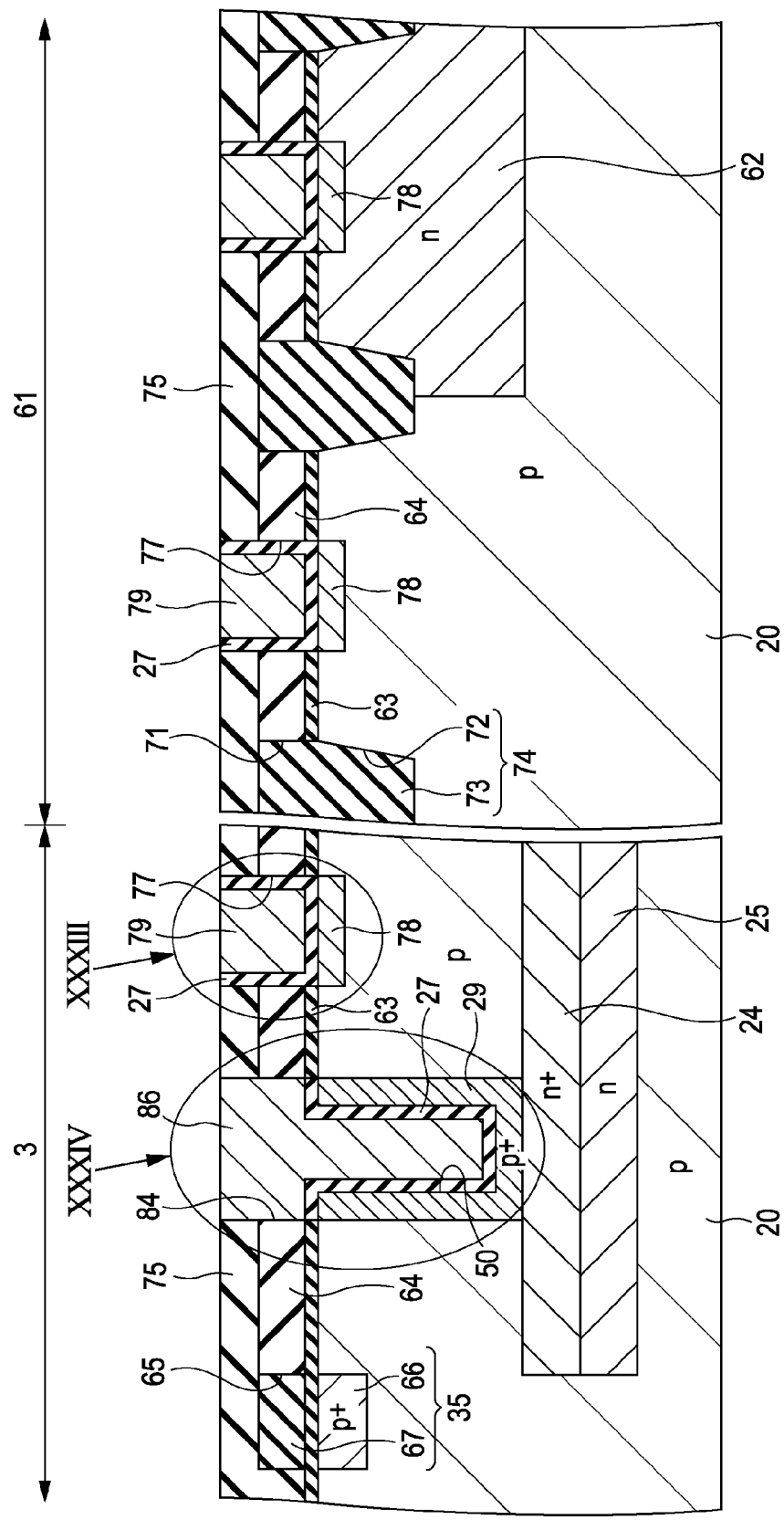
FIG. 31 is a diagram illustrating a manufacturing step of the method for manufacturing the solid-state imaging device according to the eighth embodiment of the present invention.

Then, as shown in FIG. 31, the opening 84 and the vertical trench 50 are filled with a gate electrode material 86, such as phosphorus-doped amorphous silicon or polysilicon, with the gate insulating film 27 made of, for example, a silicon oxide film interposed between the gate electrode material 86 and the inner surfaces of the opening 84 and the vertical trench 50. The gate electrode material 86 is formed by a CVD method using mixed gas obtained by mixing dopant gas containing phosphorus (P) and silane source gas.

Then, a planarization process using the silicon nitride film 75 is performed by the CMP method. More specifically, the undoped polysilicon layer 79 and the gate electrode material 86 made of phosphorus-doped silicon are subjected to the planarization process together. Thus, the vertical readout gate electrode 26 and the extraction electrode portion 26a provided at the top of the readout gate electrode 26 are formed by filling the vertical trench and the opening with phosphorus-doped silicon. In addition, the undoped polysilicon layer 79 which forms the planar-type gate electrodes embedded in the trenches 77 and the gate electrode wirings is obtained.

Figure 33:
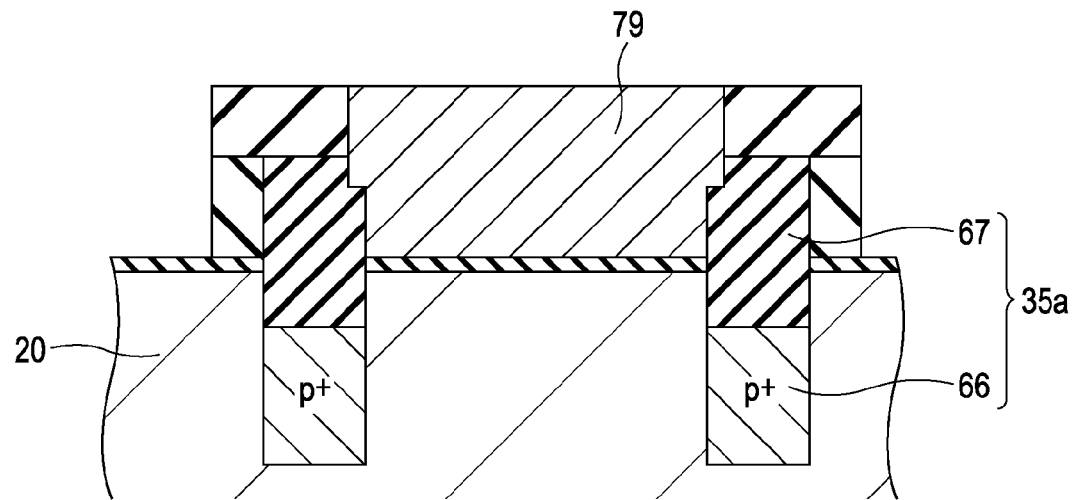
FIG. 33 is an enlarged sectional view of an area XXXIII shown in FIG. 31.

FIG. 33 is a cross sectional view of an area XXXIII including the undoped polysilicon layer 79 shown in FIG. 31 taken along a line perpendicular to FIG. 31. In the step shown in FIG. 26, an opening is formed in the resist mask 76 such that the opening extends between element separating areas 35a, and the silicon nitride films 75 and 64 are etched using the resist mask 76. In the etching step, portions of the silicon oxide film 67 included in the element separating areas 35a are also partially removed. Therefore, the undoped polysilicon layer 79 is formed such that steps formed in the portions of the silicon oxide film 67 included in the element separating areas 35a are filled with the undoped polysilicon layer 79, and the overall body of the polysilicon layer 79 is formed in a T shape. As a result, the overall body of the planar-type gate electrode is formed in a T shape such that the steps in the portions of the silicon oxide film 67 are filled with the planar-type gate electrode.

Figure 34:
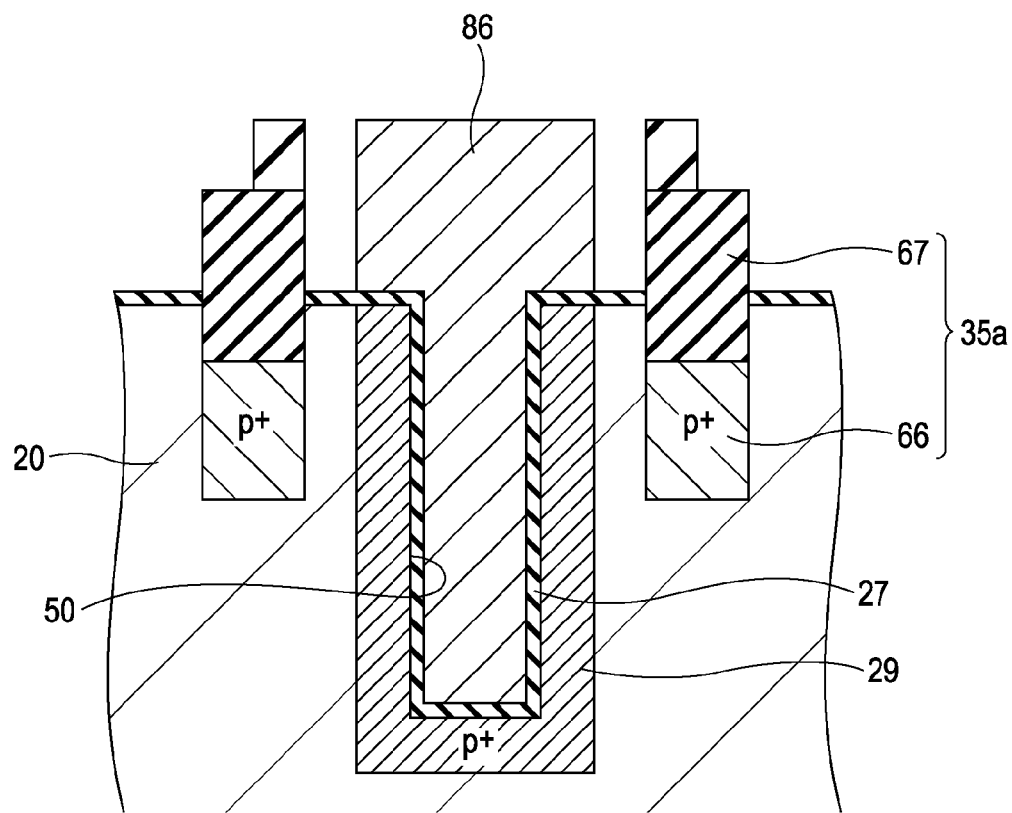
FIG. 34 is an enlarged sectional view of an area XXXIV shown in FIG. 31.

FIG. 34 is a cross sectional view of an area XXXIV including the vertical readout gate electrode 26 shown in FIG. 31 taken along a line perpendicular to FIG. 31.

Figure 32:
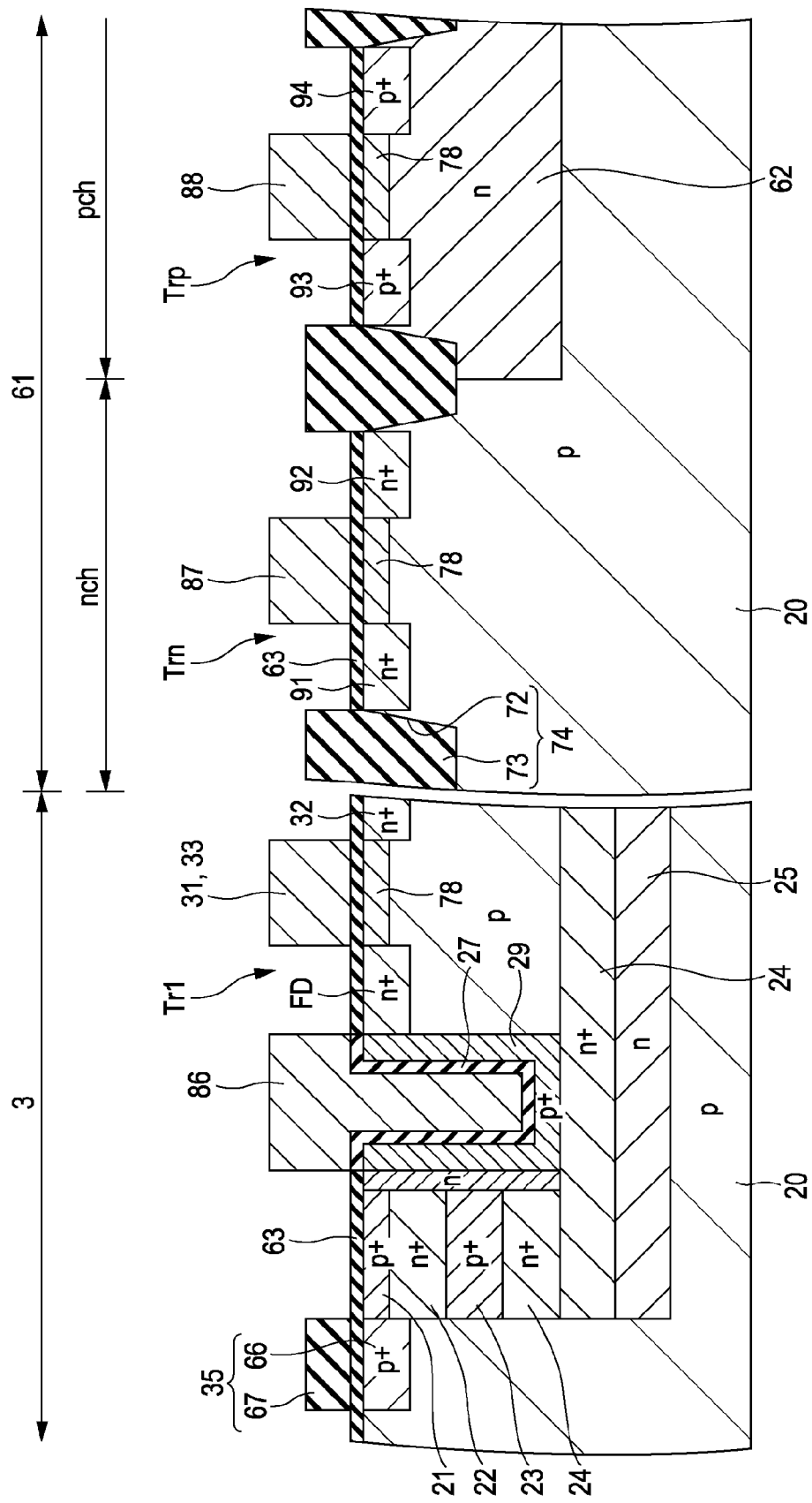
FIG. 32 is a diagram illustrating a manufacturing step of the method for manufacturing the solid-state imaging device according to the eighth embodiment of the present invention.

Next, as shown in FIG. 32, the first and second silicon nitride films 64 and 75 are removed by hot phosphoric acid. Then, an n-type impurity, such as phosphorus (P), is implanted into the undoped polysilicon layer 79 in areas corresponding to gate electrodes of other pixel transistors, that is, the reset gate electrode, the amplifier gate electrode, and the gate electrode for the n-channel MOS transistor in the peripheral circuit section 61 in the present embodiment. In addition, a p-type impurity, such as boron (B), is implanted into the undoped polysilicon layer 79 in areas corresponding to the gate electrode for the p-channel MOS transistor in the peripheral circuit section 61. Thus, the planar-type gate electrodes 31 and 33 and the gate electrode wirings of the pixel transistors and planar-type gate electrodes 87 and 88 and the gate electrode wirings of the CMOS transistors are formed.

The ion implantation for doping the undoped polysilicon layer 79 with the impurities may also be performed after the step shown in FIG. 31 by selectively doping the undoped polysilicon layer 79 with the n-type and p-type impurities.

Next, the n+ type semiconductor area 24, the p+ type semiconductor area 23, the n+ type semiconductor area 22, and the p+ type semiconductor area 21 which form the first and second photodiodes PD1 and PD2 are formed by ion implantation. In addition, the floating diffusion area FD and the source-drain areas 32 and 34 made of the n-type semiconductor areas in the pixel transistors are formed, and source-drain areas 91 and 92 made of the n-type semiconductor areas in the n-channel MOS transistor in the peripheral circuit section 61 are also formed. In addition, source-drain areas 93 and 94 made of the p-type semiconductor areas in the p-channel MOS transistor in the peripheral circuit section 61 are formed.

Thus, the planar-type gate electrodes 31, 33, 87, and 88 and the vertical readout gate electrode 26 having the extraction electrode portion 26a at the top are formed. In addition, the gate electrode wirings are formed at the same time. Thus, the pixel transistors and the n-channel and p-channel MOS transistors Trn and Trp in the CMOS transistor are also formed.

The planar-type gate electrodes and the source-drain areas may be formed simultaneously by doping the substrate with impurities having the same conductivity type by ion implantation.

Although the following steps are not illustrated, a desired solid-state imaging device can be obtained by forming multiple wiring layers, a color filter, and on-chip microlenses.

Although not illustrated, the vertical readout gate electrode 26 may be formed using boron-doped amorphous silicon or polysilicon, and the planar-type gate electrodes may be formed by forming a layer of undoped amorphous silicon or polysilicon and doping the layer with an impurity by ion implantation. In addition, in the process of forming the transistors having the planar-type gate electrodes, the gate insulating film may be formed of the above-described high-dielectric-constant gate insulating film, and the planar-type gate electrodes may be formed on the gate insulating film using an electrode material, such as metal, which has a work function that can cancel the difference in work function between the gate electrodes and the high-dielectric-constant gate insulating film.

In the above-described example, trenches for forming the elements other than the vertical readout gate electrode 26 are filled together with the undoped polysilicon layer. However, metal electrodes or a boron-doped polysilicon layer may also be formed depending on the use. In addition, the order in which the process of forming the vertical readout gate electrode and the process of forming the planar-type gate electrodes are formed may also be reversed. In other words, the step of forming the undoped polysilicon layer 79 (FIGS. 26 and 27) may also be performed after the step of forming the vertical readout gate electrode 26 (FIGS. 28 and 29).

In the solid-state imaging device 101 according to the eighth embodiment, the first and second photodiodes PD1 and PD2 are arranged in the depth direction of the substrate 20. If one of the photodiodes saturates in the process of accumulating the signal charge, the excess signal charge overflows and is accumulated in the other photodiode. Therefore, even when the pixel size is reduced, the total saturation charge amount (Qs) of the photodiodes PD can be increased and the sensitivity of the solid-state imaging device can be improved. In addition, since the vertical readout gate electrode 26 is disposed at an end of the photodiodes PD (PD1 and PD2), the area of the photodiodes PD can be increased even when the pixel size is reduced. Therefore, the saturation charge amount (Qs) of the photodiodes PD can be increased and the sensitivity of the solid-state imaging device can be improved.

In addition, in the solid-state imaging device 101, the charge-readout transistor Tr1 is formed as a vertical transistor including the vertical readout gate electrode 26 which extends in the depth direction of the photodiodes PD. Therefore, the signal charges accumulated in the first and second photodiodes PD1 and PD2, which are arranged in the depth direction of the substrate 20, can be completely transferred to the floating diffusion area FD.

In addition, in the solid-state imaging device 101 according to the present embodiment, the vertical readout gate electrode 26 and the planar-type gate electrodes 31, 33, 87, and 88 are formed of electrode materials having different characteristics. Therefore, the potential control of the channel area under each gate electrode can be facilitated. For example, the vertical readout gate electrode 26 is formed of a non-single-crystal silicon layer doped in situ with phosphorus. Therefore, the impurity concentration is uniform in the depth direction. As a result, depletion does not occur in a deep area of the readout gate electrode 26 and the potential of the channel area 28 can be adjusted to a desired potential. The planar-type gate electrodes 31, 33, 87, and 88 are formed by forming a layer of undoped non-single-crystal silicon and then doping the layer with desired conductive impurity by ion implantation. Therefore, in the n-channel and p-channel MOS transistors, the potentials of the channel areas can be adjusted to desired potentials and the n-channel and p-channel MOS transistors can be operated at optimum threshold voltages.

In the MOS transistors having the planar-type gate electrodes, the gate insulating film may be formed of a high-dielectric-constant gate insulating film, and the planar-type gate electrodes may be formed on the gate insulating film using an electrode material, such as a metal material, which has a work function that can cancel the difference in work function between the gate electrodes and the high-dielectric-constant gate insulating film. Thus, the threshold voltages of the channel areas can be adjusted to desired values and high-speed operation can be performed.

In the case where the vertical readout gate electrode 26 is formed of a p-type material, such as a boron-doped material, the material functions as an acceptor and is negatively charged. Therefore, trenches can be induced at the boundary of the channel area 28 and the trench pinning state can be obtained. In such a case, the dark-current suppressing areas 29 and 30 can be omitted.

In the present embodiment, the vertical readout gate electrode 26 and the planar-type gate electrodes 31, 33, 87, and 88 are formed of electrode materials having different work functions. Therefore, optimum threshold control can be performed for each of the gate electrodes. The channel area at the gate of the charge-readout transistor Tr1 for transmitting charges in each pixel and the channel area at the gate of each CMOS transistor included in a logic circuit, in which high-speed operation is preferably performed, are preferably subjected to individual threshold control. However, when the readout gate has a vertical structure, it is difficult to perform uniform potential control in the depth direction. Therefore, a suitable electrode material is used so that uniform potential control can be performed in the depth direction of the vertical readout gate electrode. Thus, optimum threshold control can be performed.

In addition, the extraction electrode portion at the top of the vertical readout gate electrode 26, the other planar-type gate electrodes 31, 33, 87, and 88, and the gate electrode wirings are formed such that the top surfaces thereof are on the same plane. Therefore, a fine pattern can be easily formed. More specifically, in the process of forming the vertical readout gate electrode 26 and the planar-type gate electrodes 31, 33, 87, and 88, trenches are filled with the respective materials and the planarization process is performed each time the trenches are filled so that the top surfaces thereof are on the same plane. Therefore, a fine pattern can be easily formed without affecting the process of forming by the gate electrodes (the gate electrode 26 and the gate electrodes 31, 33, 87, and 88) made of different gate electrode materials.

In addition, in the present embodiment, the planar-type gate electrodes are formed such that the step portions of the insulating film included in the element separating areas are filled with portions of the planar-type gate electrodes. The planarization process may be performed as a part of the element separation process. In such a case, the process can be simplified and the influence of the step portions in the element separating areas on the process of forming the gate electrodes can be suppressed. In addition, a finer structure can be obtained.

In the solid-state imaging device 101 according to the eighth embodiment, depletion does not occur at a deep position in the vertical readout gate electrode included in the charge-readout transistor Tr1. In addition, in the MOS transistors including the planar-type gate electrodes, optimum threshold control can be performed.

In the method for manufacturing the solid-state imaging device according to the present embodiment, the vertical readout gate electrode 26 and the planar-type gate electrodes 31, 33, 87, and 88 are disposed in the trenches formed in the first and second silicon nitride films 64 and 75 until the first and second silicon nitride films 64 and 75 are removed. Therefore, the vertical readout gate electrode 26 and the planar-type gate electrodes 31, 33, 87, and 88 can be reliably formed without influencing each other.

Figure 35:
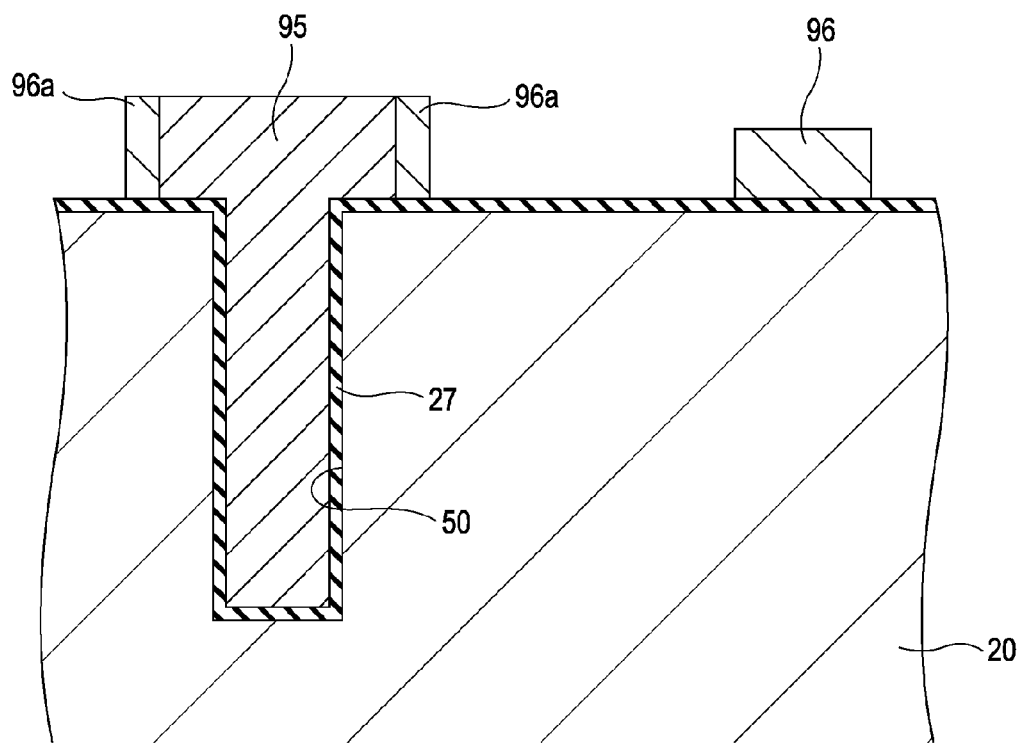
FIG. 35 is a sectional view for illustrating an embodiment of the present invention.

Referring to FIG. 35, in a manufacturing method according to a related art, first, a vertical first gate electrode 95 is formed. Then, a planar second gate electrode 96 is formed by applying a material of the second gate electrode over the entire area and patterning the material. In this process, portions 96a made of the material of the second gate electrode remain at the sides of the first gate electrode 95. However, such a problem does not occur in the manufacturing method according to the present embodiment.

In the solid-state imaging device according to the present embodiment, two photodiodes, which are the first photodiode PD1 and the second photodiode PD2, are provided. However, more than two photodiodes may also be arranged in the depth direction. Even if the pixel size is reduced, the saturation charge amount (Qs) can be increased by arranging a plurality of photodiodes in the depth direction. Thus, the pixel size can be reduced while increasing the saturation charge amount and the sensitivity. Therefore, the structure of the present embodiment is effective in reducing the pixel size. In addition, since the saturation charge amount can be increased, the dynamic range can be increased and the contrast can be improved.

In the solid-state imaging device 101 of the present embodiment, the first conductivity type is set to the p-type and the second conductivity type is set to the n-type. However, the first and second conductivity types may also be set to the n-type and the p-type, respectively. In such a case, in the above-described operation, the sign of the voltage applied to each pixel transistor is reversed from positive to negative and from negative to positive.

In addition, according to the present embodiment, the solid-state imaging device 101 is described as a front-illuminated type solid-state imaging device. However, the solid-state imaging device 101 may also be a back-illuminated type solid-state imaging device. In the case where the solid-state imaging device 101 according to the present embodiment is structured as a back-illuminated type in which light is incident on a back surface of the substrate, multiple wiring layers are provided above the front surface of the semiconductor substrate, on which the pixel section 3 and the peripheral circuit section are formed, with interlayer insulation films interposed therebetween. The back surface of the semiconductor substrate serves as a light incidence surface (light-receiving surface). An on-chip color filter is formed below the back surfaces of the pixels 2 in the pixel section 3 with a planarizing layer interposed therebetween, and on-chip microlenses are formed on the on-chip color filter.

Electronic Apparatus

An electronic apparatus including the above-described solid-state imaging device will now be described. In the following description, an example in which the solid-state imaging device according to the above-described embodiment is used in a camera will be described.

FIG. 10 is a schematic sectional view of a camera according to an embodiment of the present invention. The camera according to the present embodiment is an example of a video camera capable of capturing a still image or a moving image. The camera of the present embodiment includes the solid-state imaging device 101, an optical system 110, a shutter device 111, a drive circuit 112, and a signal processing circuit 113.

The optical lens 110 focuses image light (incident light) from an object on an image pickup plane in the solid-state imaging device 101. Thus, signal charges are accumulated in the solid-state imaging device 101 for a certain period of time. The optical lens 110 may also be formed as an optical lens system including a plurality of optical lenses.

The shutter device 111 controls the light receiving time and the light blocking time for the solid-state imaging device 101.

The drive circuit 112 supplies drive signals for controlling the transfer operation of the solid-state imaging device 101 and the shutter operation of the shutter device 111. The solid-state imaging device 101 performs the signal transfer operation in response to the drive signal (timing signal) supplied from the drive circuit 112. The signal processing circuit 113 performs various signal processing operations. Image signals are obtained by the signal processing operations, and are either stored in a storage medium, such as a memory, or output to a monitor.

In the solid-state imaging device 101 used in the camera according to the present embodiment, the gate electrodes of the charge-readout transistors have vertical structures so that the pixel size can be reduced, and the potential of the channel area can be reliably controlled in each transistor. Therefore, the saturation charge amount (Qs) and the sensitivity can be increased. In addition, the operation of the vertical charge-readout transistors can be improved and the threshold voltage of the MOS transistors including the planar-type gate electrodes can be reliably controlled. In addition, the size of the electronic apparatus can be reduced and image quality can be improved.

The present application contains subject matter related to that disclosed in Japanese Priority Patent Application JP 2008-287010 filed in the Japan Patent Office on Nov. 7, 2008, Japanese Priority Patent Application JP 2008-287011 filed in the Japan Patent Office on Nov. 7, 2008, and Japanese Priority Patent Application JP 2008-287012 filed in the Japan Patent Office on Nov. 7, 2008, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a substrate;
a pixel; and
a pixel-separating area which separates a plurality of pixels from each other,
wherein the pixel includes a plurality of photodiodes in the substrate, the plurality of photodiodes vertically disposed with respect to each other in a depth direction of the substrate, a planar-type gate electrode for reading a signal charge in a first one of the plurality of photodiodes that is disposed near a surface of the substrate, the planar-type gate electrode being provided on the surface of the substrate, and a vertical gate electrode for reading a signal charge in a second one of the plurality of photodiodes that is disposed at a position below the first one of the plurality of photodiodes, the vertical gate electrode being embedded in the substrate such that the vertical gate electrode extends in the depth direction of the substrate.

2. The solid-state imaging device according to claim 1, further comprising:
a floating diffusion area disposed adjacent to the planar-type gate electrode to accumulate the signal charge read by the planar-type gate electrode; and
a floating diffusion area disposed adjacent to the vertical gate electrode to accumulate the signal charge read by the vertical gate electrode, wherein a plurality of pixels are provided, the pixels disposed adjacent to each other using the floating diffusion areas in common.

3. An electronic apparatus comprising:
an optical lens;
a solid-state imaging device; and
a signal processing circuit which processes an output signal obtained by the solid-state imaging device,
wherein
the solid-state imaging device includes a substrate, a pixel, and a pixel-separating area which separates a plurality of pixels from each other, wherein the pixel includes a plurality of photodiodes in the substrate, the plurality of photodiodes vertically disposed with respect to each other in a depth direction of the substrate, a planar-type gate electrode for reading a signal charge in a first one of the plurality of photodiodes that is disposed near a surface of the substrate, the planar-type gate electrode being provided on the surface of the substrate, and a vertical gate electrode for reading a signal charge in a second one of the plurality of photodiodes that is disposed at a position below the first one of the plurality of photodiodes, the vertical gate electrode being embedded in the substrate such that the vertical gate electrode extends in the depth direction of the substrate.

4. A solid-state imaging device comprising:
a substrate;
a photodiode embedded in the substrate; and
a vertical gate electrode of a charge-readout transistor for reading a signal charge in the photodiode, the vertical gate electrode being embedded in the substrate such that the vertical gate electrode extends in a depth direction of the substrate along the entire length of the photodiode; and
a planar-type gate electrode of another transistor, the planar-type gate electrode being made of an electrode material different from an electrode material of the vertical gate electrode.

5. The solid-state imaging device according to claim 4, wherein the vertical gate electrode is made of an impurity-doped silicon formed using impurity-mixed gas, and wherein the planar-type gate electrode is made of an impurity-doped silicon formed by doping undoped silicon with an impurity by ion implantation.

6. The solid-state imaging device according to claim 5, wherein the vertical gate electrode is made of the impurity-doped silicon which is doped with one of a first-conductivity-type impurity and a second-conductivity-type impurity.

7. The solid-state imaging device according to claim 4, wherein the vertical gate electrode is made of an impurity-doped silicon which is doped with one of a first-conductivity-type impurity and a second-conductivity-type impurity using impurity-mixed gas, and wherein the planar-type gate electrode is made of a metal material having an underlayer composed of a high-dielectric-constant gate insulating film.

8. An electronic apparatus comprising:
an optical lens;
a solid-state imaging device; and
a signal processing circuit which processes an output signal obtained by the solid-state imaging device,
wherein
the solid-state imaging device includes a substrate, a photodiode embedded in the substrate, a vertical gate electrode of a charge-readout transistor for reading a signal charge in the photodiode, the vertical gate electrode being embedded in the substrate such that the vertical gate electrode extends in a depth direction of the substrate along the entire length of the photodiode, and a planar-type gate electrode of another transistor, the planar-type gate electrode being made of an electrode material different from an electrode material of the vertical gate electrode.

* * * * *